US012772638B2

(12) United States Patent
Akimoto

(10) Patent No.: US 12,772,638 B2
(45) Date of Patent: Oct. 20, 2026

(54) METHOD FOR MANUFACTURING IMAGE DISPLAY DEVICE INCLUDING FORMING CONDUCTIVE LAYER HAVING SINGLE-CRYSTAL METAL PART

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 495 days.

(21) Appl. No.: 18/473,038

(22) Filed: Sep. 22, 2023

(65) Prior Publication Data

US 2024/0030399 A1 Jan. 25, 2024

Related U.S. Application Data

(63) Continuation of application No. PCT/JP2022/011367, filed on Mar. 14, 2022.

(30) Foreign Application Priority Data

Mar. 30, 2021 (JP) ................................ 2021-057933

(51) Int. Cl.
*H10H 20/857* (2025.01)
*G09F 9/33* (2006.01)
(Continued)

(52) U.S. Cl.
CPC ............. *H10H 20/857* (2025.01); *G09F 9/33* (2013.01); *H10D 86/441* (2025.01);
(Continued)

(58) Field of Classification Search
CPC ........ H10D 86/60; H10D 86/441; G09F 9/33; H10W 90/00; H10W 20/01; H10H 20/857;
(Continued)

(56) References Cited

U.S. PATENT DOCUMENTS

| | | | |
|---|---|---|---|
| 5,838,707 | A | 11/1998 | Ramdani et al. |
| 2003/0039866 | A1 | 2/2003 | Mitamura |

(Continued)

FOREIGN PATENT DOCUMENTS

| | | | |
|---|---|---|---|
| JP | H10-215026 | A | 8/1998 |
| JP | 2001-035805 | A | 2/2001 |

(Continued)

OTHER PUBLICATIONS

Hyeryun Kim et al., "Fabrication of full-color GaN-based light-emitting diodes on nearly lattice-matched flexible metal foils", Scientific Reports, 7:2112, May 18, 2017.

(Continued)

*Primary Examiner* — Davienne N Monbleau
*Assistant Examiner* — Heim Kirin Grewal
(74) *Attorney, Agent, or Firm* — Foley & Lardner LLP

(57) ABSTRACT

A method for manufacturing an image display device according to an embodiment includes: preparing a first substrate, the first substrate including a circuit element, a first wiring layer connected to the circuit element, and a first insulating film covering the circuit element and the first wiring layer; forming a conductive layer including a single-crystal metal on the first insulating film; forming a semiconductor layer including a light-emitting layer on the single-crystal metal; forming a light-emitting element including a light-emitting surface by patterning the semiconductor layer; forming a second insulating film covering the first insulating film, the conductive layer, and the light-emitting element; forming a first via extending through the first and second insulating films; forming a second wiring layer on the second insulating film; and removing at least a portion of the conductive layer on the light-emitting surface.

11 Claims, 36 Drawing Sheets

(51) Int. Cl.

| | |
|---|---|
| ***H10D 86/40*** | (2025.01) |
| ***H10D 86/60*** | (2025.01) |
| ***H10H 20/01*** | (2025.01) |
| ***H10H 20/82*** | (2025.01) |
| ***H10H 20/825*** | (2025.01) |
| ***H10H 20/85*** | (2025.01) |
| ***H10H 20/851*** | (2025.01) |
| ***H10W 20/00*** | (2026.01) |
| ***H10W 90/00*** | (2026.01) |

(52) U.S. Cl.
CPC ........ *H10D 86/60* (2025.01); *H10H 20/0137* (2025.01); *H10H 20/82* (2025.01); *H10H 20/825* (2025.01); *H10H 20/85* (2025.01); *H10H 20/8514* (2025.01); *H10W 90/00* (2026.01); *H10H 20/032* (2025.01); *H10H 20/0361* (2025.01); *H10H 20/0364* (2025.01); *H10W 20/01* (2026.01)

(58) Field of Classification Search
CPC .. H10H 20/0137; H10H 20/82; H10H 20/825; H10H 20/85; H10H 20/8514; H10H 20/032; H10H 20/0361; H10H 20/0364; H10H 29/10–14; H10H 29/30–962; G09G 2300/0421–0426
See application file for complete search history.

(56) References Cited

U.S. PATENT DOCUMENTS

| | | | | |
|---|---|---|---|---|
| 2011/0290378 | A1 | 12/2011 | Okayama et al. | |
| 2012/0222732 | A1 | 9/2012 | Choi | |
| 2018/0175268 | A1 | 6/2018 | Moon et al. | |
| 2018/0294311 | A1 | 10/2018 | Hsiang et al. | |
| 2018/0351035 | A1 | 12/2018 | Chung et al. | |
| 2019/0066592 | A1 | 2/2019 | Kim | |
| 2019/0131343 | A1 | 5/2019 | Templier et al. | |
| 2019/0267357 | A1 | 8/2019 | Iguchi et al. | |
| 2019/0273179 | A1 | 9/2019 | Iguchi et al. | |
| 2019/0355766 | A1 | 11/2019 | Zhang et al. | |
| 2020/0303471 | A1 | 9/2020 | Akimoto | |
| 2020/0328079 | A1 | 10/2020 | Zhao et al. | |
| 2021/0217805 | A1 | 7/2021 | Kusunoki et al. | |
| 2022/0052034 | A1* | 2/2022 | Chi | H10W 90/00 |
| 2022/0059518 | A1 | 2/2022 | Akimoto | |
| 2022/0069187 | A1 | 3/2022 | Akimoto | |
| 2022/0069188 | A1 | 3/2022 | Akimoto | |
| 2022/0149113 | A1 | 5/2022 | Akimoto | |
| 2022/0149228 | A1 | 5/2022 | Akimoto | |
| 2024/0258325 | A1* | 8/2024 | Liu | H10D 86/60 |
| 2024/0304774 | A1* | 9/2024 | Song | H10D 86/00 |

FOREIGN PATENT DOCUMENTS

| | | | |
|---|---|---|---|
| JP | 2002-141492 | A | 5/2002 |
| JP | 2008-021745 | A | 1/2008 |
| JP | 2008-078274 | A | 4/2008 |
| JP | 2014-135433 | A | 7/2014 |
| JP | 2018-101785 | A | 6/2018 |
| JP | 2018-205741 | A | 12/2018 |
| JP | 2019-522894 | A | 8/2019 |
| JP | 2019-152851 | A | 9/2019 |
| JP | 2019-153783 | A | 9/2019 |
| JP | 2020-507107 | A | 3/2020 |
| WO | WO-2006/111804 | A1 | 10/2006 |
| WO | WO-2010/055613 | A1 | 5/2010 |
| WO | WO-2019/168187 | A1 | 9/2019 |
| WO | WO-2019/220246 | A1 | 11/2019 |
| WO | WO-2020/196271 | A1 | 10/2020 |
| WO | WO-2020/226044 | A1 | 11/2020 |
| WO | WO-2020/230667 | A1 | 11/2020 |
| WO | WO-2020/230668 | A1 | 11/2020 |
| WO | WO-2021/014972 | A1 | 1/2021 |
| WO | WO-2021/020393 | A1 | 2/2021 |

OTHER PUBLICATIONS

Jeong Woo Shon et al., "Fabrication of full-color InGaN-based light-emitting diodes on amorphous substrates by pulsed sputtering", Scientific Reports, 4:5325, Jun. 23, 2014.

International Search Report with English language translation and Written Opinion of the International Searching Authority issued in the corresponding International Patent Application No. PCT/JP2022/011367, dated May 17, 2022.

* cited by examiner

METHOD FOR MANUFACTURING IMAGE DISPLAY DEVICE INCLUDING FORMING CONDUCTIVE LAYER HAVING SINGLE-CRYSTAL METAL PART

CROSS-REFERENCE TO RELATED APPLICATIONS

The present application is a bypass continuation of PCT Application No. PCT/JP2022/011367, filed Mar. 14, 2022, which claims priority to Japanese Application No. 2021-057933, filed Mar. 30, 2021. The contents of these applications are hereby incorporated by reference in their entireties.

BACKGROUND

Embodiments of the invention relate to a method for manufacturing an image display device and an image display device.

It is desirable to realize an image display device that is thin and has high luminance, a wide viewing angle, high contrast, and low power consumption. To satisfy such market needs, a display device that utilizes a self-luminous element is being developed.

There are expectations for the advent of a display device that uses a micro LED that is a fine light-emitting element as a self-luminous element. A method has been introduced as a method for manufacturing a display device that uses a micro LED in which individually-formed micro LEDs are sequentially transferred to a drive circuit. However, as the number of elements of micro LEDs increases with higher image quality such as full high definition, 4K, 8K, etc., if many micro LEDs are individually formed and sequentially transferred to a substrate in which a drive circuit and the like are formed, an enormous amount of time is necessary for the transfer process. Also, there is a risk that connection defects between the micro LEDs, the drive circuits, etc., may occur, and a reduction of the yield may occur.

In known technology, a semiconductor layer that includes a light-emitting layer is grown on a Si substrate; an electrode is formed at the semiconductor layer; subsequently, bonding is performed to a circuit board in which a drive circuit is formed (e.g., see Japanese Patent Publication No. 2002-141492).

SUMMARY

An embodiment of the invention provides a method for manufacturing an image display device and an image display device in which a transfer process of a light-emitting element is shortened, and the yield is increased.

A method for manufacturing an image display device according to an embodiment of the invention includes a process of preparing a first substrate that includes a circuit element formed on a substrate, a first wiring layer connected to the circuit element, and a first insulating film covering the circuit element and the first wiring layer, a process of forming a conductive layer including a first part made of a single-crystal metal on the first insulating film, a process of forming a semiconductor layer including a light-emitting layer on the first part, a process of forming a light-emitting element that includes a light-emitting surface on the first part and a top surface at a side opposite to the light-emitting surface by patterning the semiconductor layer, a process of forming a second insulating film covering the first insulating film, the conductive layer, and the light-emitting element, a process of forming a first via extending through the first and second insulating films, a process of forming a second wiring layer on the second insulating film, and a process of removing at least a portion of the first part on the light-emitting surface. The first via is located between the first wiring layer and the second wiring layer and electrically connects the first wiring layer and the second wiring layer.

An image display device according to an embodiment of the invention includes a circuit element, a first wiring layer electrically connected to the circuit element, a first insulating film covering the circuit element and the first wiring layer, a light-emitting element that includes a light-emitting surface exposed from the first insulating film by an opening extending through the first insulating film and includes a top surface at a side opposite to the light-emitting surface, a second insulating film covering the first insulating film and the light-emitting element, a first via extending through the first and second insulating films, and a second wiring layer located on the second insulating film. The first via is located between the first wiring layer and the second wiring layer and electrically connects the first wiring layer and the second wiring layer.

An image display device according to an embodiment of the invention includes multiple transistors, a first wiring layer electrically connected to the multiple transistors, a first insulating film covering the multiple transistors and the first wiring layer, a first semiconductor layer including a light-emitting surface on the first insulating film in which multiple light-emitting regions are formable, multiple light-emitting layers located on the first semiconductor layer, multiple second semiconductor layers that are located respectively on the multiple light-emitting layers and are of a different conductivity type from the first semiconductor layer, a second insulating film covering the first insulating film, the first semiconductor layer, the multiple light-emitting layers, and the multiple second semiconductor layers, multiple first vias extending through the first and second insulating films, and a second wiring layer located on the second insulating film. The multiple light-emitting regions are exposed from the first insulating film respectively by multiple openings extending through the first insulating film. The multiple second semiconductor layers are separated by the second insulating film. The multiple light-emitting layers are separated by the second insulating film. The multiple first vias are located between the first wiring layer and the second wiring layer and electrically connect the first wiring layer and the second wiring layer.

An image display device according to an embodiment of the invention includes a circuit element, a first wiring layer electrically connected to the circuit element, a first insulating film covering the circuit element and the first wiring layer, multiple light-emitting elements that each include a light-emitting surface exposed from the first insulating film by an opening extending through the first insulating film and include a top surface at a side opposite to the light-emitting surface, a second insulating film covering the first insulating film and the multiple light-emitting elements, a first via extending through the first and second insulating films, and a second wiring layer located on the second insulating film. The first via is located between the first wiring layer and the second wiring layer and electrically connects the first wiring layer and the second wiring layer.

According to an embodiment of the invention, a method for manufacturing an image display device is realized in which a transfer process of a light-emitting element is shortened, and the yield is increased.

According to an embodiment of the invention, an image display device is realized in which reducing the size of the light-emitting element is easier and higher definition is possible.

DETAILED DESCRIPTION

Figure 1:
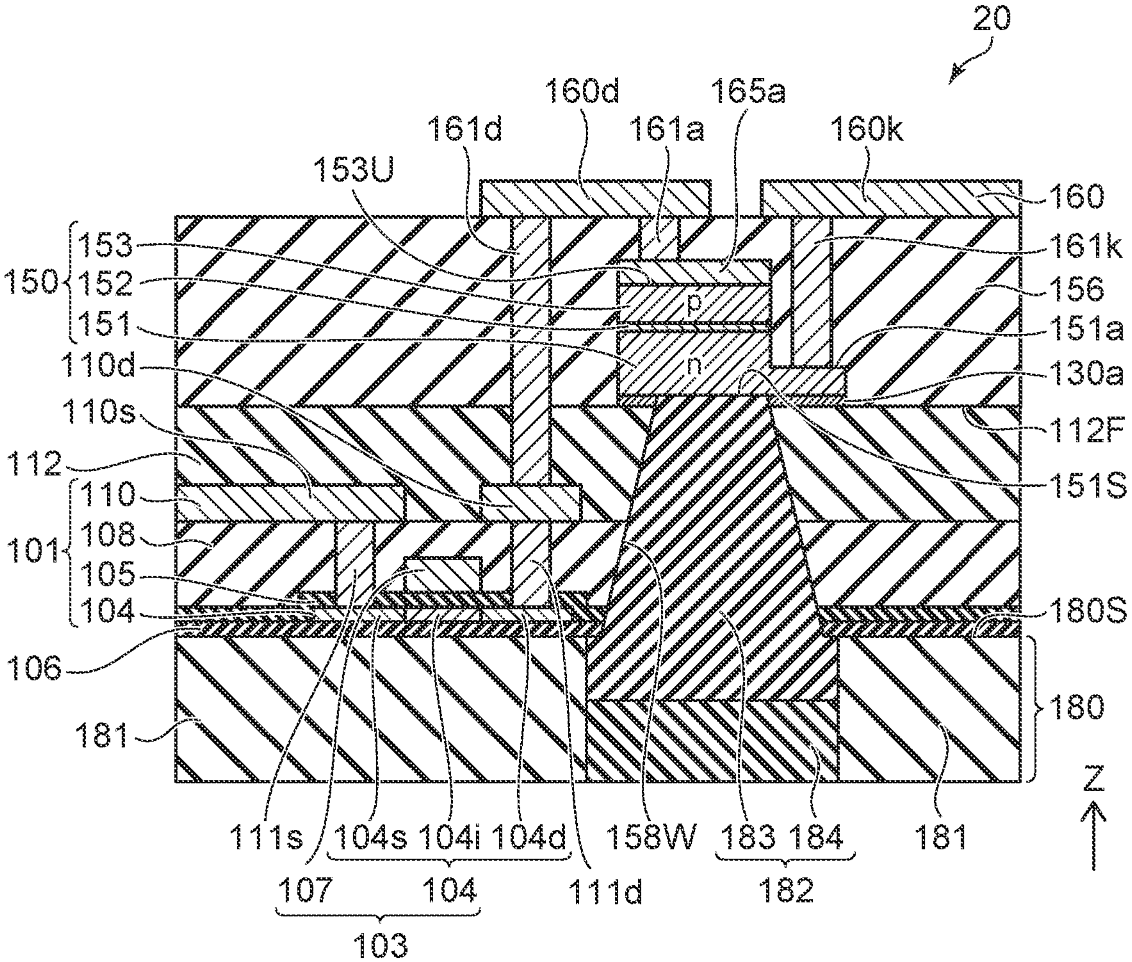
FIG. 1 is a schematic cross-sectional view illustrating a portion of an image display device according to a first embodiment.

Embodiments of the invention will now be described with reference to the drawings.

The drawings are schematic or conceptual, and the relationships between the thickness and width of portions, the proportions of sizes among portions, etc., are not necessarily the same as the actual values. Also, the dimensions and proportions may be illustrated differently among drawings, even when the same portion is illustrated.

In the specification and drawings, components similar to those described previously or illustrated in an antecedent drawing are marked with the same reference numerals, and a detailed description is omitted as appropriate.

First Embodiment

FIG. 1 is a schematic cross-sectional view illustrating a portion of an image display device according to the embodiment.

FIG. 1 schematically shows the configuration of a subpixel 20 of the image display device of the embodiment.

Figure 16:
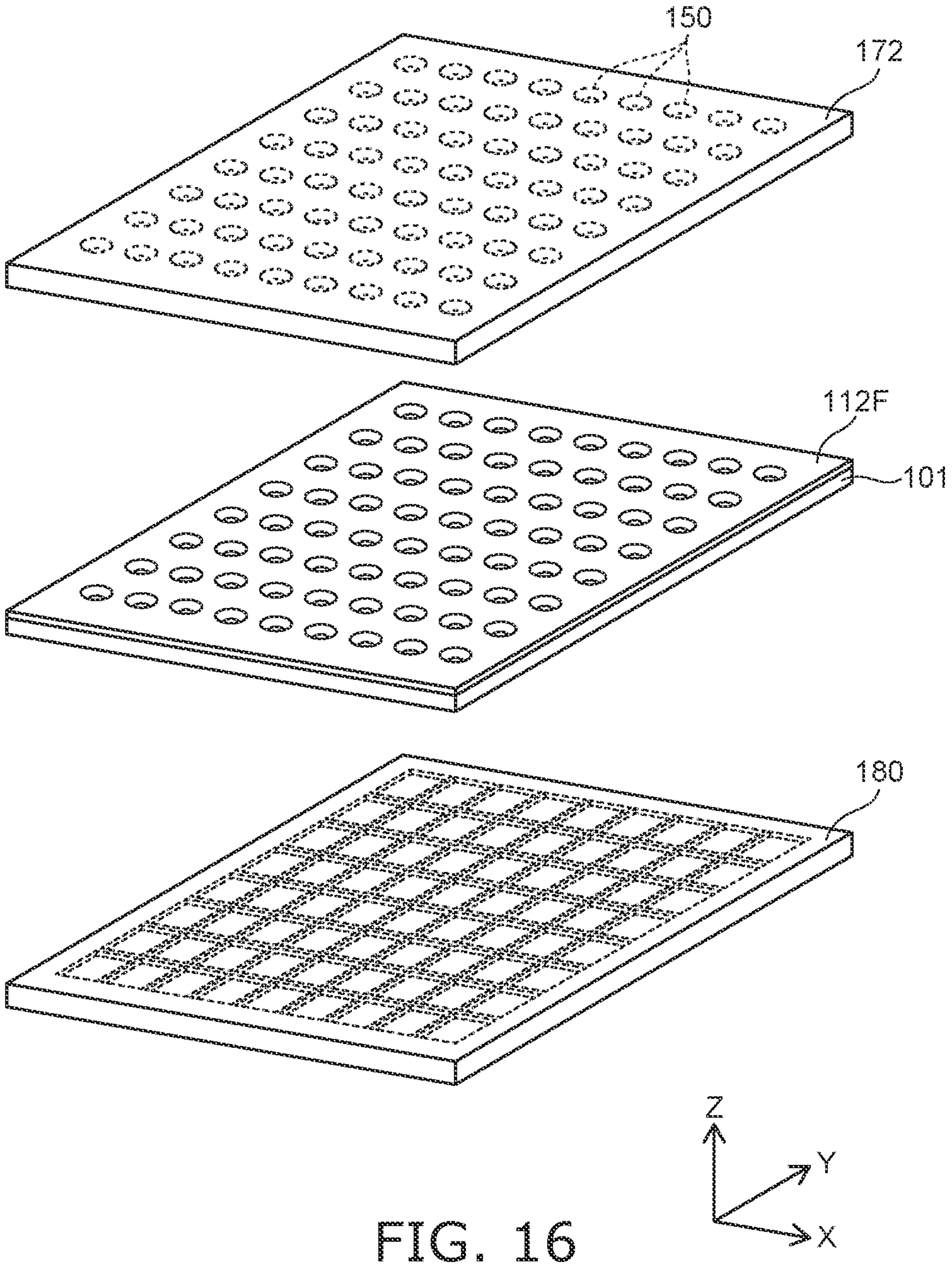
FIG. 16 is a schematic perspective view illustrating the image display device of the first embodiment.
Figure 17:
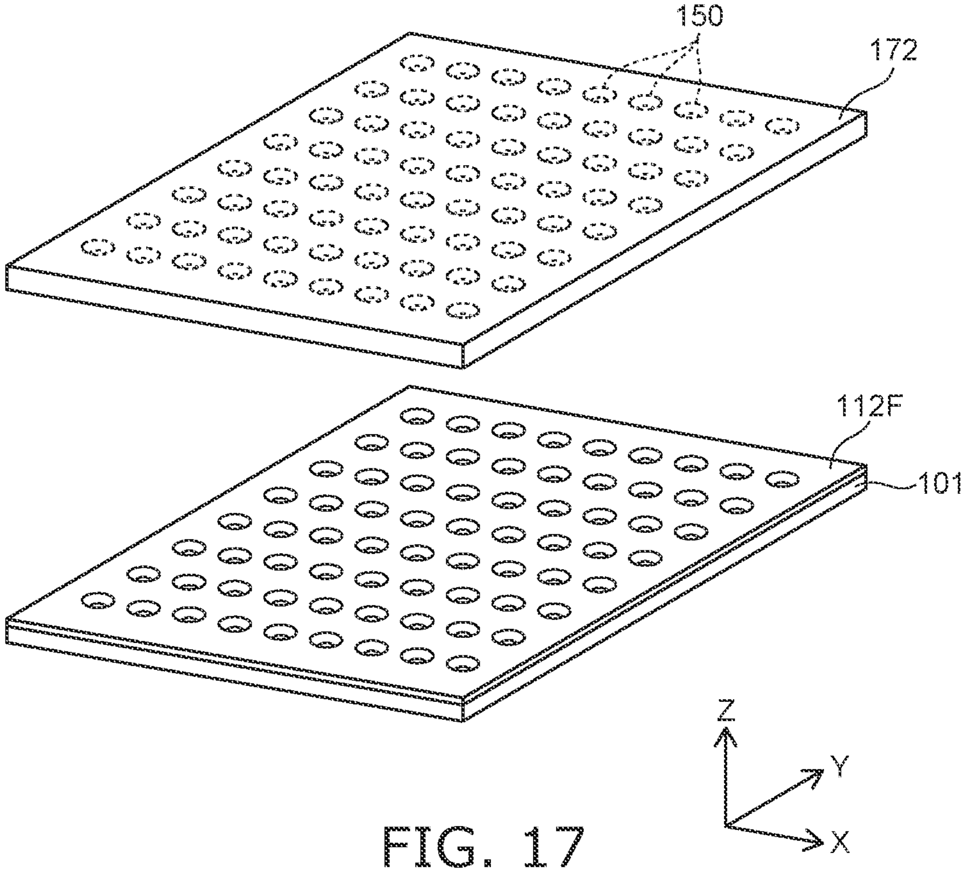
FIG. 17 is a schematic perspective view illustrating an image display device of a modification of the first embodiment.

An XYZ three-dimensional coordinate system may be used in the following description. Light-emitting elements 150 are arranged in a two-dimensional planar configuration as shown in FIGS. 16 and 17 below. The light-emitting element 150 is provided for each subpixel 20. The two-dimensional plane in which the subpixels 20 are arranged is taken as an XY plane. The subpixels 20 are arranged along the X-axis direction and the Y-axis direction. FIG. 1 is an auxiliary cross section along line AA' of FIG. 6 below, and is a cross-sectional view in which cross sections of multiple planes perpendicular to the XY plane are joined in one plane. In FIG. 1, and in other drawings as well, in a cross-sectional view of multiple planes perpendicular to the XY plane, the X-axis and the Y-axis are not illustrated, and the Z-axis perpendicular to the XY plane is shown. That is, in these drawings, the plane perpendicular to the Z-axis is the XY plane.

Although the positive direction of the Z-axis is called "up" or "above" and the negative direction of the Z-axis is called "down" or "below" hereinbelow, the directions along the Z-axis are not always limited to directions in which gravity acts. A length in a direction along the Z-axis may be called a height.

The subpixel 20 includes a light-emitting surface 151S that is substantially parallel to the XY plane. The light-emitting surface 151S is a surface that radiates light mainly in the negative direction of the Z-axis orthogonal to the XY plane. According to the embodiment, its modifications, and all of the embodiments and their modifications described below, the light-emitting surface radiates light mainly in the negative direction of the Z-axis.

As shown in FIG. 1, the subpixel 20 of the image display device includes a transistor (a circuit element) 103, a first wiring layer 110, a first inter-layer insulating film (a first insulating film) 112, the light-emitting element 150, a second inter-layer insulating film (a second insulating film) 156, a via (a first via) 161*d*, and a second wiring layer 160. The subpixel 20 further includes a color filter (a wavelength conversion member) 180. The subpixel 20 further includes a light-reflective electrode 165*a*.

According to the embodiment, the transistor 103 is located on the color filter 180. In the example, the transistor 103 is located on a light-shielding part 181 included in the color filter 180. Although described below in more detail, the transistor 103 is formed on the TFT underlying film 106 located on the color filter 180. The transistor 103 is covered with an insulating film 108, and the insulating film 108 is covered with the first inter-layer insulating film 112 together with the first wiring layer 110 located on the insulating film 108.

A color conversion part 182 of the color filter 180 extends through a seed plate 130*a*, the first inter-layer insulating film 112, the insulating film 108, an insulating layer 105, and the TFT underlying film 106. The light-emitting surface 151S of the light-emitting element 150 is provided over the seed plate 130*a* and a color conversion layer 183. The light that is radiated from the light-emitting surface 151S is radiate externally via the color conversion layer 183 and a filter layer 184.

The transistor 103 drives the light-emitting element 150 located on the first inter-layer insulating film 112. The transistor 103 is, for example, a thin film transistor (TFT).

The configuration of the subpixel 20 will now be described in detail.

The color filter 180 includes the light-shielding part 181 and the color conversion part 182. The color conversion part 182 is provided to correspond to the shape of the light-emitting surface 151S directly under the light-emitting surface 151S of the light-emitting element 150. The shape of the color conversion part 182 when projected onto the XY plane is, for example, circular, elliptical, etc. The shape of the color conversion part 182 when projected onto the XY plane matches the shape of the light-emitting surface 151S at the portion that contacts the light-emitting surface 151S. That is, the outer perimeter of the contact surface between the color conversion part 182 and the light-emitting surface 151S matches the outer perimeter of the light-emitting surface 151S. The color conversion part 182 has a truncated circular conic shape of which the area of the shape when projected onto the XY plane gradually increases in the negative direction of the Z-axis. The shape of the color conversion part 182 when projected onto the XY plane is not limited to circular or elliptic and may be polygonal such as triangular, quadrilateral, etc.

The part of the color filter 180 other than the color conversion part 182 is used as the light-shielding part 181. The light-shielding part 181 is a so-called black matrix that reduces blur due to color mixing of the light emitted from the adjacent color conversion part 182, etc., and makes it possible to display a sharper image.

The color conversion part 182 has one, two, or more layers. FIG. 1 shows a case where the color conversion part 182 has two layers. Whether the color conversion part 182 has one layer or two layers is determined by the color, i.e., the wavelength, of the light emitted by the subpixel 20. When the light emission color of the subpixel 20 is red, it is favorable for the color conversion part 182 to have the two layers of the color conversion layer 183 and the filter layer 184 that transmits red light. When the light emission color of the subpixel 20 is green, it is favorable for the color conversion part 182 to have the two layers of the color conversion layer 183 and the filter layer 184 that transmits green light. When the light emission color of the subpixel 20 is blue, it is favorable to use one layer.

When the color conversion part 182 has two layers, one layer is the color conversion layer 183, and the other layer is the filter layer 184. The color conversion layer 183 is provided by filling an opening extending through the seed plate 130*a*, the first inter-layer insulating film 112, the insulating film 108, the insulating layer 105, and the TFT underlying film 106. FIG. 1 shows a wall surface 158W of the opening. The color conversion layer 183 covers the light-emitting surface 151S and the wall surface 158W. The color conversion layer 183 also is located between the light-shielding part 181. The filter layer 184 contacts the color conversion layer 183 and is located between the light-shielding part 181.

When the color conversion part 182 is one layer, for example, the opening is filled with the filter layer 184. In such a case, the filter layer 184 covers the light-emitting surface 151S and the wall surface 158W. The filter layer 184 also is located between the light-shielding part 181.

The color conversion layer 183 converts the wavelength of the light emitted by the light-emitting element 150 into the desired wavelength. When the subpixel 20 emits red, for example, the light of the wavelength of the light-emitting element 150, i.e., 467 nm±30 nm, is converted into light of a wavelength of about 630 nm±20 nm. When the subpixel 20 emits green, for example, the light of the wavelength of the light-emitting element 150, i.e., 467 nm±30 nm, is converted into light of a wavelength of about 532 nm±20 nm.

The filter layer 184 shields the wavelength component of the blue light emission that remains without undergoing color conversion by the color conversion layer 183.

When the color of the light emitted by the subpixel 20 is blue, the light may be output via the color conversion layer 183 or may be output as-is without passing through the color conversion layer 183. When the wavelength of the light emitted by the light-emitting element 150 is about 467 nm±30 nm, the light may be output without passing through the color conversion layer 183. When the wavelength of the light emitted by the light-emitting element 150 is 410 nm±30 nm, it is favorable to provide the color conversion layer 183 to convert the wavelength of the output light into about 467 nm±30 nm.

It is favorable for the subpixel 20 to include the filter layer 184 even when the subpixel 20 is blue. By providing the filter layer 184 through which blue light passes in the blue subpixel 20, the occurrence of a micro external light reflection other than blue light at the surface of the light-emitting element 150 is suppressed.

The color filter 180 includes a connection surface 180S. The connection surface 180S is provided mainly by the light-shielding part 181. The TFT underlying film 106 is located on the connection surface 180S. The circuit elements that include the transistor 103 are located on the connection surface 180S with the TFT underlying film 106 interposed.

The transistor 103 is formed on the TFT underlying film 106. The TFT underlying film 106 is provided to ensure the flatness when forming the transistor 103 and to protect the TFT channel of the transistor 103 from contamination, etc., in the heat processing. The TFT underlying film 106 is an insulating film of $SiO_2$, etc., and is light-transmissive.

In addition to the transistor 103, other circuit elements such as transistors, capacitors, etc., are formed on the TFT underlying film 106, and a circuit 101 is configured by wiring parts, etc. For example, the transistor 103 in FIG. 5 below corresponds to a drive transistor 26. Also, a select transistor 24, a capacitor 28, etc., are circuit elements in FIG. 5. The circuit 101 includes the TFT channel 104, the insulating layer 105, the insulating film 108, vias 111*s* and 111*d*, and the first wiring layer 110. The circuit 101 is located at the connection surface 180S.

In the example, the transistor 103 is a p-channel TFT. The transistor 103 includes the TFT channel 104 and a gate 107. It is favorable to form the TFT channel 104 by a low-temperature polysilicon (LTPS) process. In a LTPS process, the TFT channel 104 is formed by polycrystallizing and activating an amorphous Si region formed on the TFT underlying film 106. For example, laser annealing by a laser is used to polycrystallize and activate the amorphous Si region. The TFT that is formed by the LTPS process has sufficiently high mobility.

The TFT channel 104 includes regions 104*s*, 104*i*, and 104*d*. The regions 104*s*, 104*i*, and 104*d* each are located on the TFT underlying film 106. The region 104*i* is located between the region 104*s* and the region 104*d*. The regions 104*s* and 104*d* include an impurity such as boron (B), boron fluoride (BF), or the like and form p-type semiconductor regions. The region 104*s* has an ohmic connection with the via 111*s*, and the region 104*d* has an ohmic connection with the via 111*d*.

The insulating layer 105 is located on the TFT underlying film 106 and the TFT channel 104. The insulating layer 105 is, for example, $SiO_2$. The insulating layer 105 may be a multilevel insulating layer that includes $SiO_2$, $Si_3N_4$, etc.

The gate 107 is located on the TFT channel 104 with the insulating layer 105 interposed. The insulating layer 105 is provided to insulate the TFT channel 104 and the gate 107 and insulate from other adjacent circuit elements. The current that flows between the regions 104*s* and 104*d* can be controlled by forming a channel in the region 104*i* when a lower potential than that of the region 104*s* is applied to the gate 107.

For example, the gate 107 may be formed of polycrystalline Si or may be formed of a refractory metal such as W, Mo, etc. For example, the gate 107 is formed by CVD, etc., when the gate 107 is formed of a polycrystalline Si film.

The insulating film 108 is located on the insulating layer 105 and the gate 107. The insulating film 108 is, for example, an inorganic film of $SiO_2$, $Si_3N_4$, etc. The insulating film 108 is favorably a stacked film of $SiO_2$, $Si_3N_4$, etc. The insulating film 108 is provided to separate adjacent circuit elements such as the transistors 103, etc., from each other. The insulating film 108 provides a surface that is flat enough not to hinder the formation of the first wiring layer 110.

The first wiring layer 110 is located on the insulating film 108. The first wiring layer 110 can include multiple wiring parts that can have different potentials. The first wiring layer 110 includes wiring parts 110*s* and 110*d*. The wiring parts 110*s* and 110*d* are formed to be separated from each other and can be connected to different potentials.

In FIG. 1 and subsequent cross-sectional views, unless otherwise noted, the reference numeral of a wiring layer is displayed beside a wiring part included in the wiring layer. For example, in FIG. 1, the reference numeral of the first wiring layer 110 is displayed beside the wiring part 110*s*.

The wiring part 110*s* is located above the region 104*s*. For example, the wiring part 110*s* is connected to a power supply line 3 shown in FIG. 5 below. The wiring part 110*d* is located above the region 104*d*. One end of the via 161*d* is connected to the wiring part 110*d*. The other end of the via 161*d* is connected to the second wiring layer 160.

The vias 111*s* and 111*d* extend through the insulating film 108 and the insulating layer 105. The via 111*s* is located between the wiring part 110*s* and the region 104*s* and electrically connects the wiring part 110*s* and the region 104*s*. The via 111*d* is located between the wiring part 110*d* and the region 104*d* and electrically connects the wiring part 110*d* and the region 104*d*.

The wiring part 110*s* is connected to the region 104*s* by the via 111*s*. The region 104*s* is a source region of the transistor 103. Accordingly, for example, the source region of the transistor 103 is electrically connected to the power supply line 3 of the circuit of FIG. 5 by the via 111*s* and the wiring part 110*s*.

The wiring part 110*d* is connected to the region 104*d* by the via 111*d*. The region 104*d* is a drain region of the transistor 103. Accordingly, the drain region of the transistor 103 is electrically connected to the second wiring layer 160 by the via 111*d*, the wiring part 110*d*, and the via 161*d*.

The first inter-layer insulating film 112 is provided to cover the insulating film 108 and the first wiring layer 110. As described in the manufacturing method described below, the first inter-layer insulating film 112 provides a planarized surface 112F for forming a metal seed layer and for performing crystal growth of a semiconductor layer on the metal seed layer.

The insulating film 108 and the first inter-layer insulating film 112 are formed of light-reflective materials. For example, the insulating film 108 and the first inter-layer insulating film 112 are formed of white resins. By using white resins as the insulating film 108 and the first inter-layer insulating film 112, scattered light and the like from the color conversion layer 183 toward the insulating film 108 and the first inter-layer insulating film 112 can be reflected. Therefore, the luminous efficiency of the light-emitting element 150 can be substantially improved. Because the light that leaks from the color conversion layer 183 is reflected by the insulating film 108 and the first inter-layer insulating film 112, the light that reaches the transistor 103 can be suppressed, and malfunction of the transistor 103 can be prevented.

The white resin is formed by dispersing fine scattering particles having a Mie scattering effect in a silicon resin such as SOG (Spin On Glass) or the like, a transparent resin such as a novolak phenolic resin, etc. The fine scattering particles are colorless or white and have a diameter of about 1/10 to about several times the wavelength of the light emitted by the light-emitting element 150. The fine scattering particles that are favorably used have a diameter of about ½ of the light wavelength. For example, $TiO_2$, $Al_2O_3$, ZnO, etc., are examples of such a fine scattering particle.

The white resin also can be formed by utilizing many fine voids or the like dispersed in a transparent resin. When whitening the insulating film 108 and the first inter-layer insulating film 112, for example, a $SiO_2$ film or the like formed by ALD (Atomic-Layer-Deposition) or CVD may be used by overlaying with SOG, etc.

The light-emitting element 150 is located on the color conversion layer 183 of the color filter 180. More specifically, the light-emitting surface 151S of the light-emitting element 150 contacts the seed plate 130*a* and the color conversion layer 183 and is provided over the seed plate 130*a* and the color conversion layer 183. The color conversion layer 183 extends through the seed plate 130*a*, the first inter-layer insulating film 112, the insulating film 108, the insulating layer 105, and the TFT underlying film 106.

As described below with reference to FIG. 8B and subsequent drawings, the seed plate 130*a* is formed by etching a metal seed layer 1130*a*. The metal seed layer 1130*a* is used as a seed for forming the light-emitting element 150.

The light-emitting element 150 includes a top surface 153U located at the side opposite to the light-emitting surface 151S. In the example, the outer perimeter shapes of the light-emitting surface 151S and the top surface 153U when projected onto the XY plane are quadrangular or rectangular, and the light-emitting element 150 is a prismatic element that includes a light-emitting surface 151S on the seed plate 130*a* and the color conversion layer 183. The cross section of the prism may be a polygon having five or more sides. The light-emitting element 150 is not limited to a prismatic element and may be a cylindrical element.

The light-emitting element 150 includes an n-type semiconductor layer 151, a light-emitting layer 152, and a p-type semiconductor layer 153. The n-type semiconductor layer 151, the light-emitting layer 152, and the p-type semiconductor layer 153 are stacked in this order from the light-emitting surface 151S toward the top surface 153U. The light-emitting surface 151S that is the n-type semiconductor layer 151 is located in contact with the seed plate 130*a* and the color conversion layer 183. The light-emitting element 150 radiates light in the negative direction of the Z-axis via the color conversion layer 183 and the filter layer 184.

The n-type semiconductor layer 151 includes a connection part 151*a*. Together with the seed plate 130*a*, the connection part 151*a* is provided to protrude in one direction from the n-type semiconductor layer 151 over the planarized surface 112F. The height of the connection part 151*a* from the light-emitting surface 151S is the same as the height of the n-type semiconductor layer 151 from the light-emitting surface 151S or less than the height of the n-type semiconductor layer 151 from the light-emitting surface 151S. The connection part 151*a* is a portion of the n-type semiconductor layer 151. The connection part 151*a* is connected to one end of a via 161*k*, and the n-type semiconductor layer 151 is electrically connected to the via 161*k* by the connection part 151*a*.

When the light-emitting element 150 is prismatic, the shape of the light-emitting element 150 when projected onto the XY plane is, for example, substantially square or rectangular. When the shape of the light-emitting element 150 when projected onto the XY plane is polygonal including quadrangular, the corner portions of the light-emitting element 150 may be rounded. When the shape of the light-emitting element 150 when projected onto the XY plane is cylindrical, the shape of the light-emitting element 150 when projected onto the XY plane is not limited to circular and may be, for example, elliptical. The degree of freedom of the wiring layout and the like is increased by appropriately selecting the shape, arrangement, etc., of the light-emitting element in a plan view.

For example, the light-emitting element 150 favorably includes a gallium nitride compound semiconductor including a light-emitting layer of $In_XAl_YGa_{1-X-Y}N$ ($0\leq X$, $0\leq Y$, and $X+Y<1$), etc. Hereinbelow, the gallium nitride compound semiconductor described above may be called simply gallium nitride (GaN). According to an embodiment of the invention, the light-emitting element 150 is a so-called light-emitting diode. It is sufficient for the wavelength of the light emitted by the light-emitting element 150 to be in the range from the near-ultraviolet region to the visible region, e.g., about 467 nm±30 nm. The wavelength of the light emitted by the light-emitting element 150 may be a bluish-violet light emission of about 410 nm±30 nm. The wavelength of the light emitted by the light-emitting element 150 is not limited to these values and can be set as appropriate.

The electrode 165*a* is provided over the top surface 153U. The electrode 165*a* is located between the top surface 153U and a connection member 161*a*. The electrode 165*a* is formed of a light-reflective conductive material. The electrode 165*a* realizes an ohmic connection with the p-type semiconductor layer 153. Because the electrode 165*a* is light-reflective, the upward radiated light and/or scattered light of the light-emitting element 150 is reflected toward the light-emitting surface 151S side. The substantial luminous efficiency of the light-emitting element 150 is increased thereby.

The second inter-layer insulating film 156 covers the planarized surface 112F, the seed plate 130*a*, the light-emitting element 150, and the electrode 165*a*. The second inter-layer insulating film 156 separates from other adjacent light-emitting elements 150. The second inter-layer insulating film 156 also separates from the electrodes 165*a* located at other adjacent light-emitting elements 150. The second inter-layer insulating film 156 protects the light-emitting element 150 from the surrounding environment by covering the light-emitting element 150. It is sufficient for the surface of the second inter-layer insulating film 156 to be flat enough that the second wiring layer 160 can be formed on the second inter-layer insulating film 156.

The second inter-layer insulating film 156 is formed of an organic insulating material. It is favorable for the organic insulating material included in the second inter-layer insulating film 156 to be a white resin similar to the insulating film 108 and the first inter-layer insulating film 112. By using a white resin as the second inter-layer insulating film 156, the light emitted by the light-emitting element 150 in the lateral direction can be reflected, and the luminous efficiency of the light-emitting element 150 can be substantially improved.

The second inter-layer insulating film 156 may be a black resin. By using a black resin as the second inter-layer insulating film 156, the scattering of the light inside the subpixel 20 is suppressed, and stray light is more effectively suppressed. An image display device in which stray light is suppressed can display a sharper image. One or both of the insulating film 108 and the first inter-layer insulating film 112 may be a black resin.

The second wiring layer 160 is located on the second inter-layer insulating film 156. The second wiring layer 160 can include multiple wiring parts that can have different potentials. The second wiring layer 160 includes wiring parts 160*d* and 160*k*. The wiring parts 160*d* and 160*k* are formed to be separated and can be connected to different potentials.

The connection member 161*a* is located between the top surface 153U and a portion of the wiring part 160*d* located above the top surface 153U, and the top surface 153U is connected to the wiring part 160*d* by the connection member 161*a*. Another portion of the wiring part 160*d* is located above the wiring part 110*d*. A portion of the wiring part 160*k* is located above the connection part 151*a*. For example, another portion of the wiring part 160*k* is connected to a ground line 4 of the circuit of FIG. 5.

The via 161*d* extends through the second and first inter-layer insulating films 156 and 112 and reach the wiring part 110*d*. The via 161*d* is located between the wiring part (the first wiring part) 160*d* and the wiring part 110*d* and electrically connects the wiring part 160*d* and the wiring part 110*d*. Accordingly, the p-type semiconductor layer 153 is electrically connected to the drain region of the transistor 103 via the electrode 165*a*, the connection member 161*a*, the wiring part 160*d*, the via 161*d*, the wiring part 110*d*, and the via 111*d*.

The via (the second via) 161*k* extends through the second inter-layer insulating film 156 and reach the connection part (the first connection part) 151*a*. The via 161*k* is located between the wiring part (the second wiring part) 160*k* and the connection part 151*a* and connects the wiring part 160*k* and the connection part 151*a*. Accordingly, for example, the n-type semiconductor layer 151 is electrically connected to the ground line 4 of the circuit of FIG. 5 via the connection part 151*a*, the via 161*k*, and the wiring part 160*k*.

For example, the first wiring layer 110, the connection member 161*a*, and the vias 111*s*, 111*d*, 161*d*, and 161*k* are formed of Al, an alloy of Al, a stacked film of Al, Ti, and the like, etc. For example, in a stacked film of Al and Ti, Al is stacked on a thin film of Ti, and then Ti is stacked on the Al.

A protective layer also may be provided over the second inter-layer insulating film 156 and the second wiring layer 160 to protect from the external environment.

The embodiment and the other embodiments described below each include the following three modifications based on different formation processes of the color filter and the existence or absence of the color filter. These modifications are not limited to the embodiment and are applicable to the other embodiments as well.

Modification 1

Figure 2:
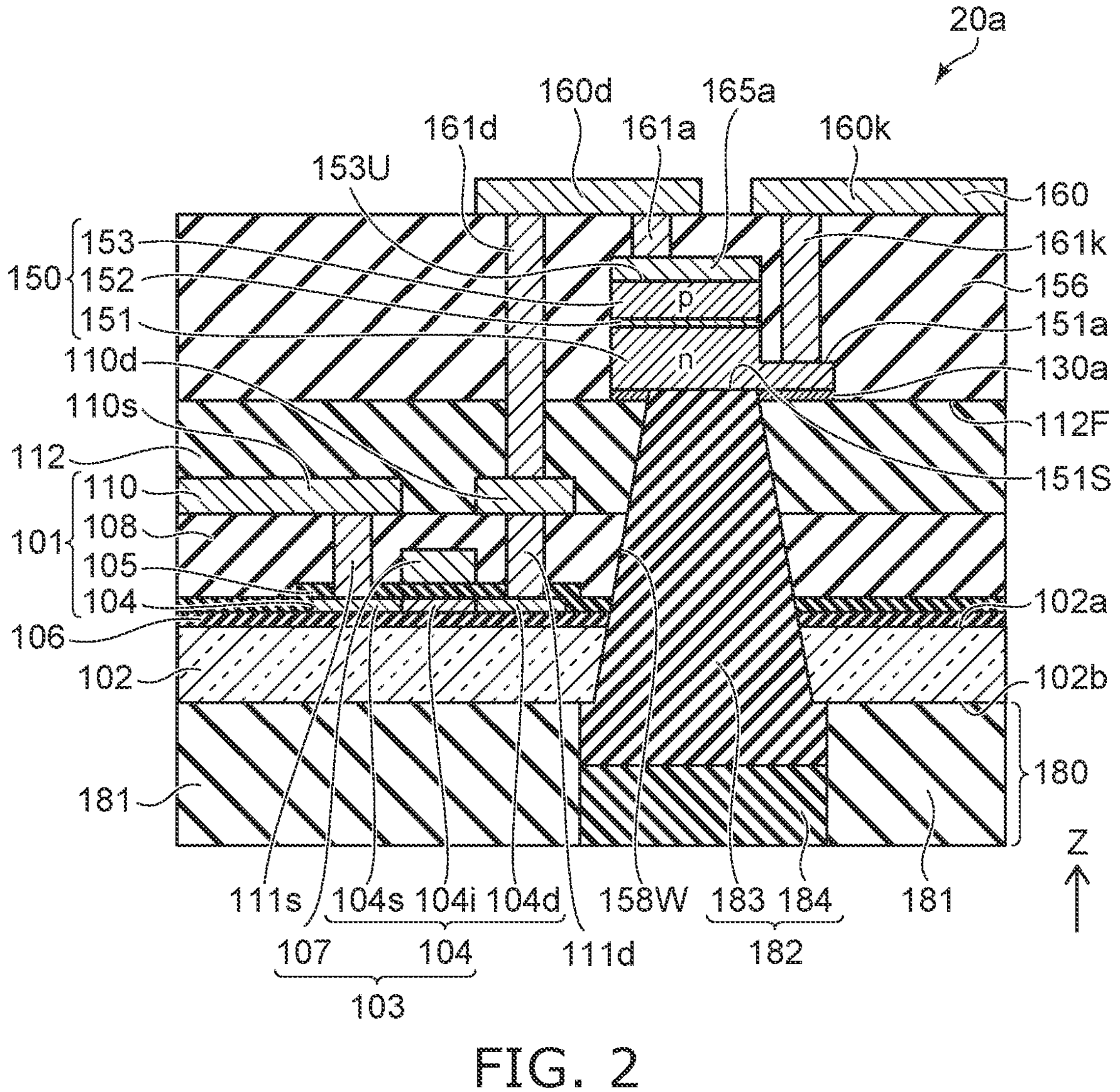
FIG. 2 is a schematic cross-sectional view illustrating a portion of an image display device according to a modification of the first embodiment.

FIG. 2 is a schematic cross-sectional view illustrating a portion of an image display device according to a modification of the embodiment.

As shown in FIG. 2, the configuration of a subpixel 20*a* of the image display device of the modification differs from the configuration of the subpixel 20 in that a substrate 102 is included in addition to the configuration of the subpixel 20 shown in FIG. 1. Otherwise, the modification is the same as the embodiment described above. The same components are marked with the same reference numerals, and a detailed description is omitted.

According to the modification, the color conversion layer 183 extends through the seed plate 130*a*, the first inter-layer insulating film 112, the insulating film 108, the insulating layer 105, the TFT underlying film 106, and the substrate 102. Similarly to the embodiment described above, the light-emitting surface 151S of the light-emitting element 150 is provided over the seed plate 130*a* and the color conversion layer 183.

The substrate 102 is a light-transmitting substrate including surfaces 102*a* and 102*b*, and the surface 102*b* is positioned at the side opposite to the surface 102*a*. The substrate 102 is, for example, a glass substrate. The TFT underlying film 106 is located on the one surface 102*a* of the substrate 102. Similarly to the embodiment described above, the circuit 101 that includes the TFT channel 104, etc., is located on the TFT underlying film 106.

The color filter 180, and in the example, the light-shielding part 181, are located at the other surface 102*b* of the substrate 102. That is, the circuit 101 is located on the light-shielding part 181 of the color filter 180 with the substrate 102 interposed. The light-emitting element 150 is located on the color conversion layer 183 that extends through the seed plate 130*a*, the first inter-layer insulating film 112, the insulating film 108, the insulating layer 105, the TFT underlying film, and the substrate 102.

Modification 2

Figure 3:
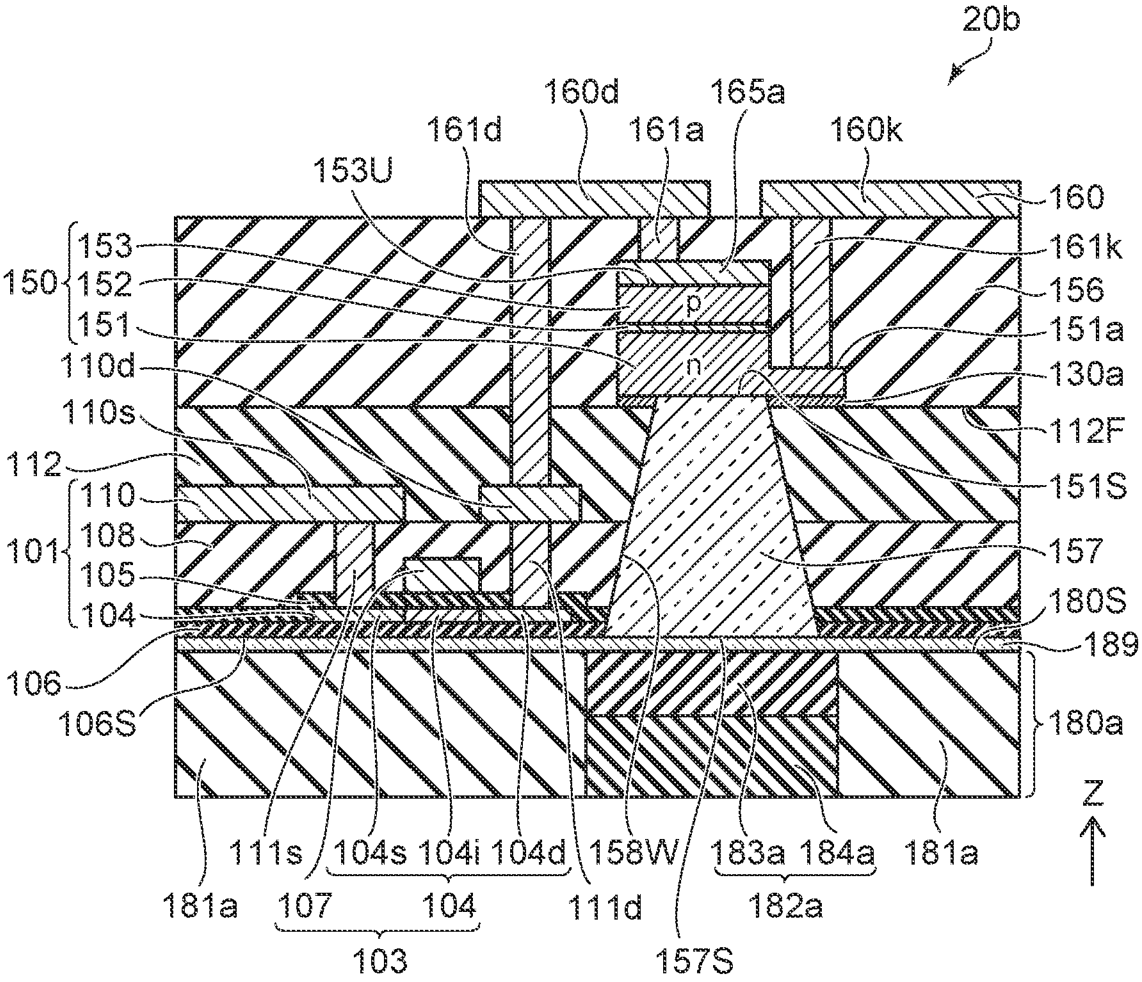
FIG. 3 is a schematic cross-sectional view illustrating a portion of an image display device according to a modification of the first embodiment.

FIG. 3 is a schematic cross-sectional view illustrating a portion of an image display device according to a modification of the embodiment.

According to the modification, a subpixel 20*b* includes a color filter 180*a* that is different from those of the embodiment shown in FIG. 1 and the modification shown in FIG. 2. The color filter 180 according to the embodiment described above is formed by inkjet printing, whereas the color filter 180*a* according to the modification is formed as a film-type. As described below using FIG. 15, the color filter 180*a* is formed by being adhered to surfaces 106S and 157S via a transparent thin film adhesive layer 189. The same components are marked with the same reference numerals, and a detailed description is omitted as appropriate.

As shown in FIG. 3, the color filter 180*a* includes a light-shielding part 181*a* and a color conversion part 182*a*. The light-shielding part 181*a* and the color conversion part 182*a* correspond respectively to the light-shielding part 181 and the color conversion part 182 according to the embodiment described above and respectively have the same functions.

According to the modification, the TFT underlying film 106 and a transparent resin layer 157 are located on the connection surface 180S of the color filter 180*a*.

Similarly to the embodiment described above, the circuit 101 that includes the TFT channel 104, etc., is located on the TFT underlying film 106. The light-emitting element 150 is located on the transparent resin layer 157, and the light-emitting surface 151S is provided over the seed plate 130*a* and the transparent resin layer 157. The transparent resin layer 157 extends through the seed plate 130*a*, the first inter-layer insulating film 112, the insulating film 108, the insulating layer 105, and the TFT underlying film. The transparent resin layer 157 covers the light-emitting surface 151S and the wall surface 158W.

The transparent thin film adhesive layer 189 is located at the surface 106S of the TFT underlying film 106 at the side opposite to the surface of the TFT underlying film 106 at which the circuit 101 is located. The transparent thin film adhesive layer 189 is located at the surface 157S of the transparent resin layer 157 at the side opposite to the surface of the transparent resin layer 157 at which the light-emitting surface 151S is located. The surface 106S of the TFT underlying film 106 and the surface 157S of the transparent resin layer 157 are surfaces in substantially the same XY plane, and the transparent thin film adhesive layer 189 is provided over the surfaces 106S and 157S.

That is, the color filter 180*a* is provided over the surfaces 106S and 157S with the transparent thin film adhesive layer 189 interposed. In the example, the surface 157S of the transparent resin layer 157 is located on the color conversion part 182*a* of the color filter 180*a*, and the surface 106S of the TFT underlying film 106 is located on the light-shielding part 181*a* of the color filter 180*a*.

Modification 3

Figure 4:
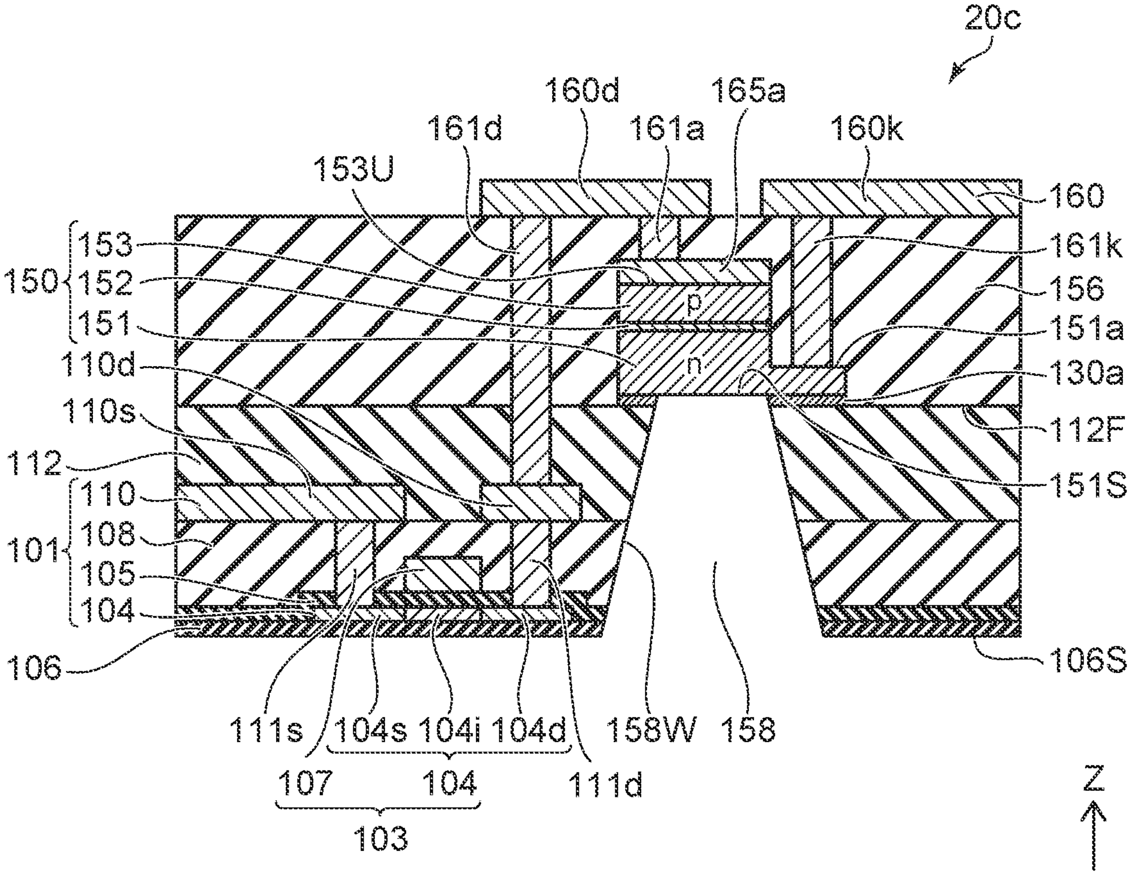
FIG. 4 is a schematic cross-sectional view illustrating a portion of an image display device according to a modification of the first embodiment.

FIG. 4 is a schematic cross-sectional view illustrating a portion of the modification.

The modification differs from the embodiment and the two modifications described above in that a subpixel 20*c* does not include a color filter.

As shown in FIG. 4, the image display device of the modification includes the subpixel 20*c*. In the subpixel 20*c*, a circuit is located on the TFT underlying film 106. The light-emitting element 150 is located on the seed plate 130*a*.

An opening 158 is provided in the subpixel 20*c*, and the opening 158 extends through the seed plate 130*a*, the first inter-layer insulating film 112, the insulating film 108, the insulating layer 105, and the TFT underlying film 106. The light-emitting surface 151S is exposed from the seed plate 130*a*, the first inter-layer insulating film 112, the insulating film 108, the insulating layer 105, and the TFT underlying film 106 via the opening 158, and the light that is radiated from the light-emitting surface 151S passes through the opening 158 and is radiated in the negative direction of the Z-axis.

The TFT underlying film 106 may be located on the one surface 102*a* of the substrate 102 shown in FIG. 2. By supporting the structural component that is higher than the TFT underlying film 106 with the substrate 102, the image display device can be protected from damage, etc., during movement and transportation.

Figure 5:
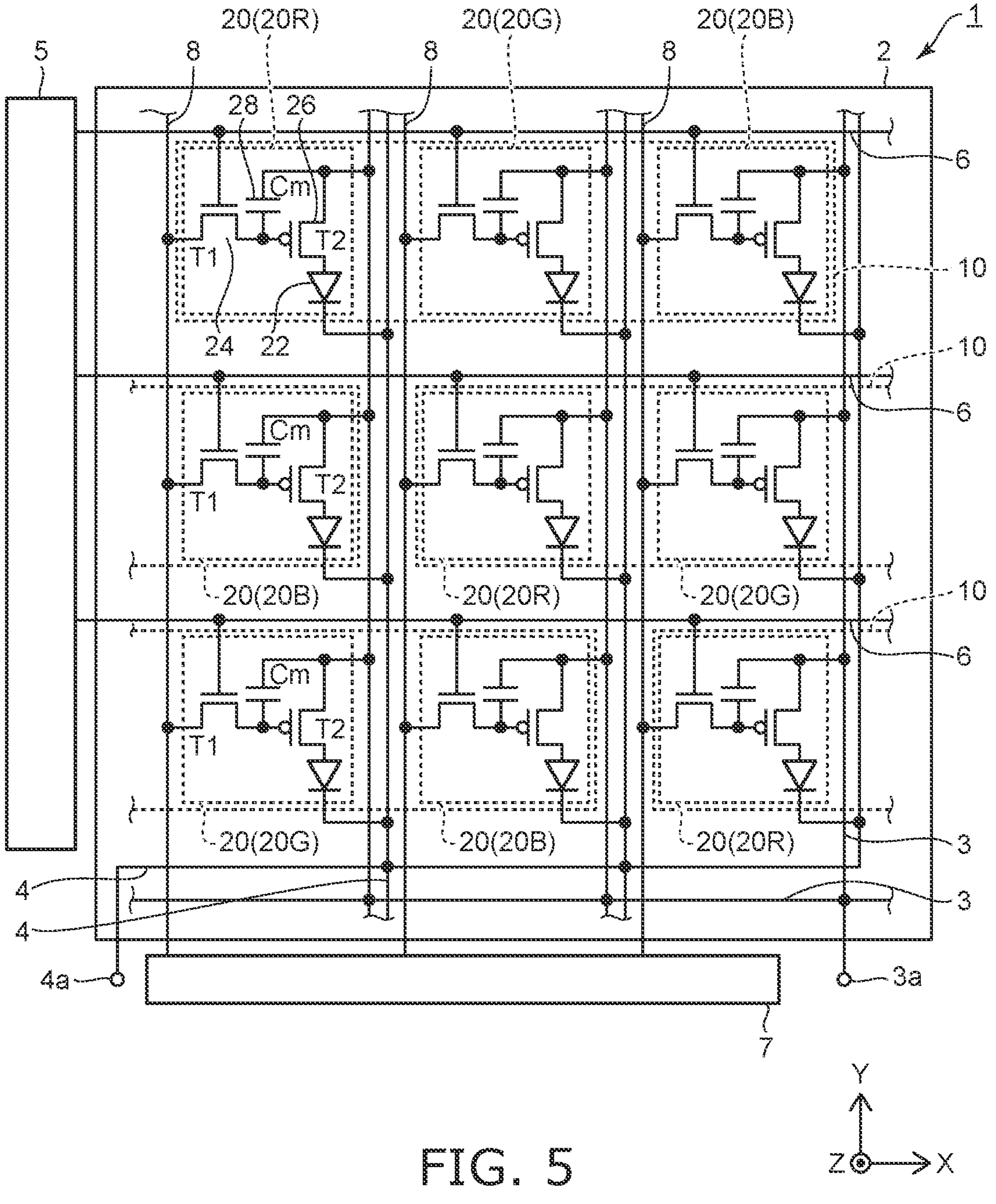
FIG. 5 is a schematic block diagram illustrating the image display device of the first embodiment.

FIG. 5 is a schematic block diagram illustrating the image display device according to the embodiment.

As shown in FIG. 5, the image display device 1 of the embodiment includes a display region 2. The subpixels 20 are arranged in the display region 2. For example, the subpixels 20 are arranged in a lattice shape. For example, n subpixels 20 are arranged along the X-axis, and m subpixels 20 are arranged along the Y-axis.

A pixel 10 includes multiple subpixels 20 that emit light of different colors. A subpixel 20R emits red light. A subpixel 20G emits green light. A subpixel 20B emits blue light. The light emission color and luminance of one pixel 10 are determined by the three types of the subpixels 20R, 20G, and 20B emitting light of the desired luminances.

One pixel 10 includes the three subpixels 20R, 20G, and 20B; for example, the subpixels 20R, 20G, and 20B are arranged in a straight line along the X-axis as shown in FIG. 5. In each pixel 10, subpixels of the same color may be arranged in the same column, or subpixels of different colors may be arranged in each column as in the example.

The image display device 1 further includes the power supply line 3 and the ground line 4. The power supply line 3 and the ground line 4 are wired in a lattice shape along the arrangement of the subpixels 20. The power supply line 3 and the ground line 4 are electrically connected to each subpixel 20, and electrical power is supplied to each subpixel 20 from a DC power supply connected between a power supply terminal 3*a* and the GND terminal 4*a*. The power supply terminal 3*a* and the GND terminal 4*a* are located respectively at end portions of the power supply line 3 and the ground line 4, and are connected to a DC power supply circuit located outside the display region 2. The power supply terminal 3*a* supplies a positive voltage when referenced to the GND terminal 4*a*.

The image display device 1 further includes a scanning line 6 and a signal line 8. The scanning line 6 is wired in a direction parallel to the X-axis. That is, the scanning lines 6 are wired along the arrangement in the row direction of the subpixels 20. The signal line 8 is wired in a direction parallel to the Y-axis. That is, the signal lines 8 are wired along the arrangement in the column direction of the subpixels 20.

The image display device 1 further includes a row selection circuit 5 and a signal voltage output circuit 7. The row selection circuit 5 and the signal voltage output circuit 7 are located along the outer edge of the display region 2. The row selection circuit 5 is located along the outer edge of the display region 2 in the Y-axis direction. The row selection circuit 5 is electrically connected to the subpixel 20 of each column via the scanning line 6, and supplies a select signal to each subpixel 20.

The signal voltage output circuit 7 is located along the outer edge of the display region 2 in the X-axis direction. The signal voltage output circuit 7 is electrically connected to the subpixel 20 of each row via the signal line 8, and supplies a signal voltage to each subpixel 20.

Figure 6:
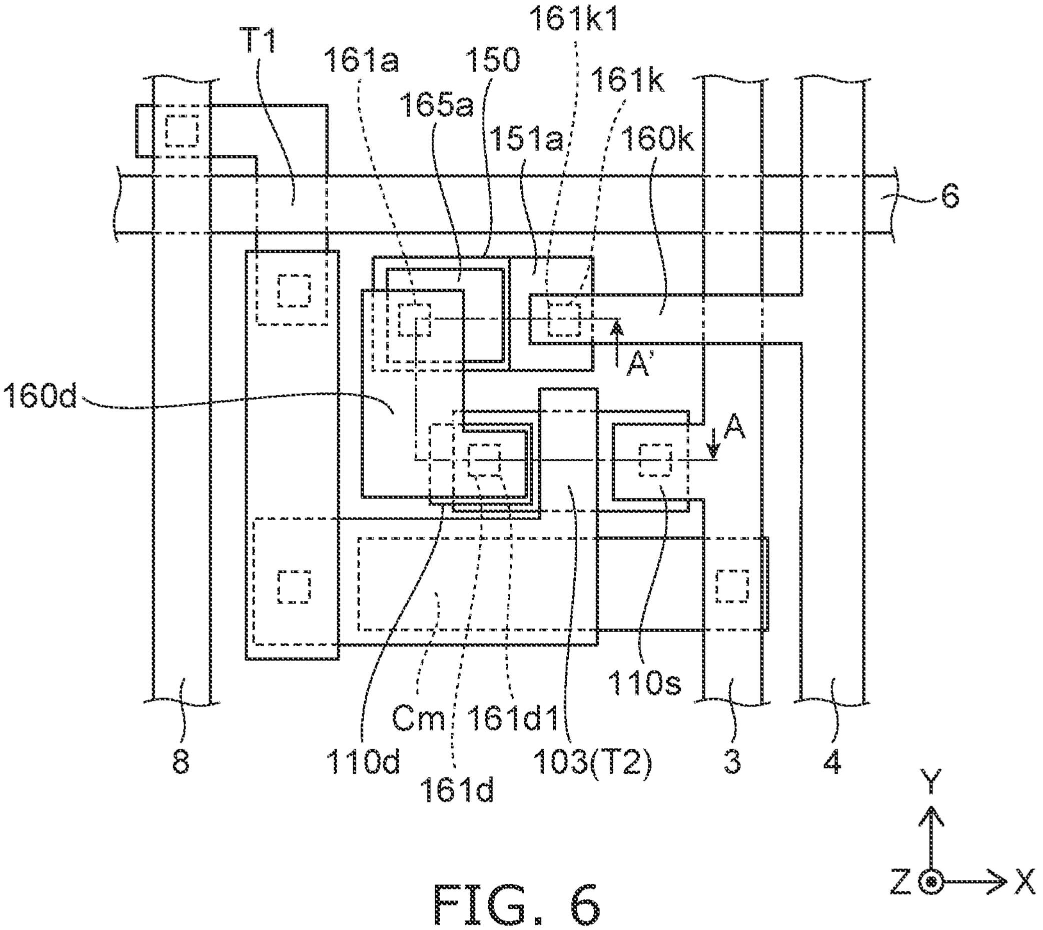
FIG. 6 is a schematic plan view illustrating a portion of the image display device of the first embodiment.

The subpixel 20 includes a light-emitting element 22, the select transistor 24, the drive transistor 26, and the capacitor 28. In FIGS. 5 and 6 below, the select transistor 24 may be displayed as T1, the drive transistor 26 may be displayed as T2, and the capacitor 28 may be displayed as Cm.

The light-emitting element 22 is connected in series with the drive transistor 26. According to the embodiment, the drive transistor 26 is a p-channel TFT, and the anode electrode of the light-emitting element 22 is connected to the drain electrode of the drive transistor 26. Major electrodes of the drive transistor 26 and the select transistor 24 are drain electrodes and source electrodes. The anode electrode of the light-emitting element 22 is connected to the p-type semiconductor layer. The cathode electrode of the light-emitting element 22 is connected to the n-type semiconductor layer. A series circuit of the light-emitting element 22 and the drive transistor 26 is connected between the power supply line 3 and the ground line 4. The drive transistor 26 corresponds to the transistor 103 of FIG. 1, and the light-emitting element 22 corresponds to the light-emitting element 150 of FIG. 1. The current that flows in the light-emitting element 22 is determined by the voltage applied between the gate and source of the drive transistor 26, and the light-emitting element 22 emits light of a luminance corresponding to the current flowing in the light-emitting element 22.

The select transistor 24 is connected between the signal line 8 and the gate electrode of the drive transistor 26 via a major electrode. The gate electrode of the select transistor 24 is connected to the scanning line 6. The capacitor 28 is connected between the power supply line 3 and the gate electrode of the drive transistor 26.

The row selection circuit 5 selects one row from the arrangement of m rows of the subpixels 20 and supplies a select signal to the scanning line 6. The signal voltage output circuit 7 supplies a signal voltage that has an analog voltage value necessary for each subpixel 20 of the selected row. The signal voltage is applied between the gate and source of the drive transistor 26 of the subpixels 20 of the selected row. The signal voltage is maintained by the capacitor 28. The drive transistor 26 allows a current corresponding to the signal voltage to flow in the light-emitting element 22. The light-emitting element 22 emits light of a luminance corresponding to the current that flows.

The row selection circuit 5 sequentially switches the row that is selected, and supplies the select signal. That is, the row selection circuit 5 scans through the rows in which the subpixels 20 are arranged. Light emission is performed by currents that correspond to the signal voltages flowing in the light-emitting elements 22 of the subpixels 20 that are sequentially scanned. The luminance of the subpixel 20 is determined by the current flowing in the light-emitting element 22. An image is displayed in the display region 2 by the subpixels 20 emitting light of the gradations based on the determined luminances.

FIG. 6 is a schematic plan view illustrating a portion of the image display device of the embodiment.

In FIG. 6, the cutting plane line of the cross-sectional views of FIG. 1, etc., is illustrated by line AA'. According to the embodiment, the light-emitting element 150 and the drive transistor 103 are stacked in the Z-axis direction with the first and second inter-layer insulating films 112 and 156 interposed. The light-emitting element 150 corresponds to the light-emitting element 22 of FIG. 5. The drive transistor 103 corresponds to the drive transistor 26 of FIG. 5 and is labeled T2 as well.

As shown in FIG. 6, the anode electrode of the light-emitting element 150 is provided by the p-type semiconductor layer 153 shown in FIG. 1. The electrode 165*a* is located on the top surface 153U of the p-type semiconductor layer 153. The electrode 165*a* is connected to the wiring part 160*d* via the connection member 161*a*. The wiring part 160*d* is connected to the via 161*d* by a contact hole 161*d*1, and the wiring part 160*d* is connected to the wiring part 110*d* located in the lower layer by the via 161*d*.

The wiring part 110*d* is connected to the drain electrode of the transistor 103 by the via 111*d* shown in FIG. 1. The drain electrode of the transistor 103 is the region 104*d* shown in FIG. 1. The source electrode of the transistor 103 is connected to the wiring part 110*s* by the via 111*s* shown in FIG. 1. The source electrode of the transistor 103 is the region 104*s* shown in FIG. 1. In the example, the first wiring layer 110 includes the power supply line 3, and the wiring part 110*s* is connected to the power supply line 3.

The cathode electrode of the light-emitting element 150 is provided by the connection part 151*a*. The connection part 151*a* is located in a higher layer than the transistor 103 and the first wiring layer 110. The connection part 151*a* is electrically connected to the wiring part 160*k* by the via 161*k*. More specifically, one end of the via 161*k* is connected to the connection part 151*a*. The other end of the via 161*k* is connected to the wiring part 160*k* via a contact hole 161*kl*. The wiring part 160*k* is connected to the ground line 4.

Thus, by using the via 161*d* in the light-emitting element 150, the first wiring layer 110 that is located in a lower layer than the light-emitting element 150 can be electrically connected to the second wiring layer 160. By using the via 161*k* in the light-emitting element 150, the connection part 151*a* that is located lower than the second wiring layer 160 can be electrically connected to the second wiring layer 160.

A method for manufacturing the image display device of the embodiment will now be described.

FIGS. 7A to 12B are schematic cross-sectional views illustrating a portion of the method for manufacturing the image display device of the embodiment.

Figure 7A:
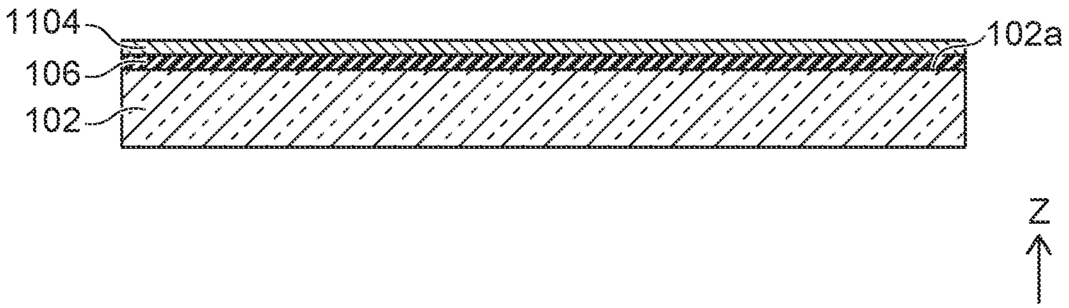
FIG. 7A is a schematic cross-sectional view illustrating a portion of a method for manufacturing the image display device of the first embodiment.

As shown in FIG. 7A, the substrate 102 is prepared according to the method for manufacturing the image display device of the embodiment. The substrate 102 is a light-transmitting substrate and is, for example, a substantially rectangular glass substrate of about 1500 mm×1800 mm. The TFT underlying film 106 is formed on the one surface 102*a* of the substrate 102. For example, the TFT underlying film 106 is formed by CVD. A Si layer 1104 is formed on the TFT underlying film 106 that is formed. The Si layer 1104 is an amorphous Si layer when forming, and is polycrystallized after forming by, for example, scanning an excimer laser pulse multiple times.

Figure 7B:
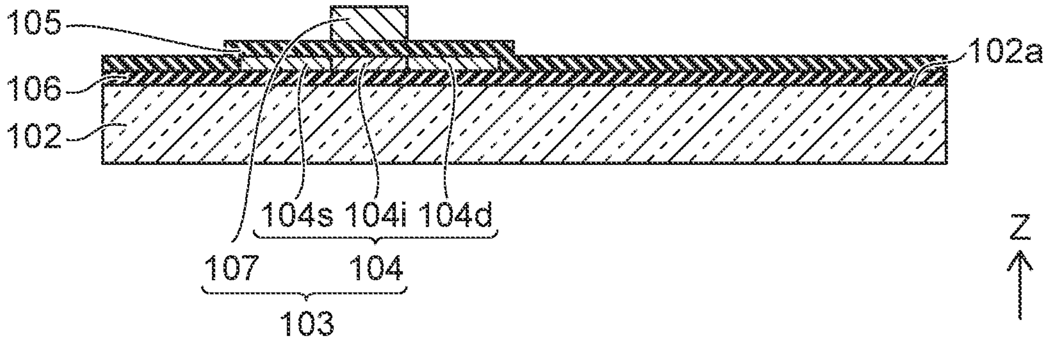
FIG. 7B is a schematic cross-sectional view illustrating a portion of the method for manufacturing the image display device of the first embodiment.

As shown in FIG. 7B, the transistor 103 is formed at a prescribed position on the TFT underlying film 106. For example, the transistor 103 is formed as follows in a LTPS process.

The polycrystallized Si layer 1104 shown in FIG. 7A is patterned into an island configuration such as the transistor 103 shown in FIG. 6 to form the TFT channel 104. The insulating layer 105 is formed to cover the TFT underlying film 106 and the TFT channel 104. The insulating layer 105 functions as a gate insulating film. The gate 107 is formed on the TFT channel 104 with the insulating layer 105 interposed. The gate 107 is selectively doped with an impurity such as B or the like and thermally activated to form the transistor 103. The regions 104*s* and 104*d* are used as p-type active regions and function respectively as the source region and drain region of the transistor 103. The region 104*i* is used as an n-type active region and functions as a channel.

Figure 8A:
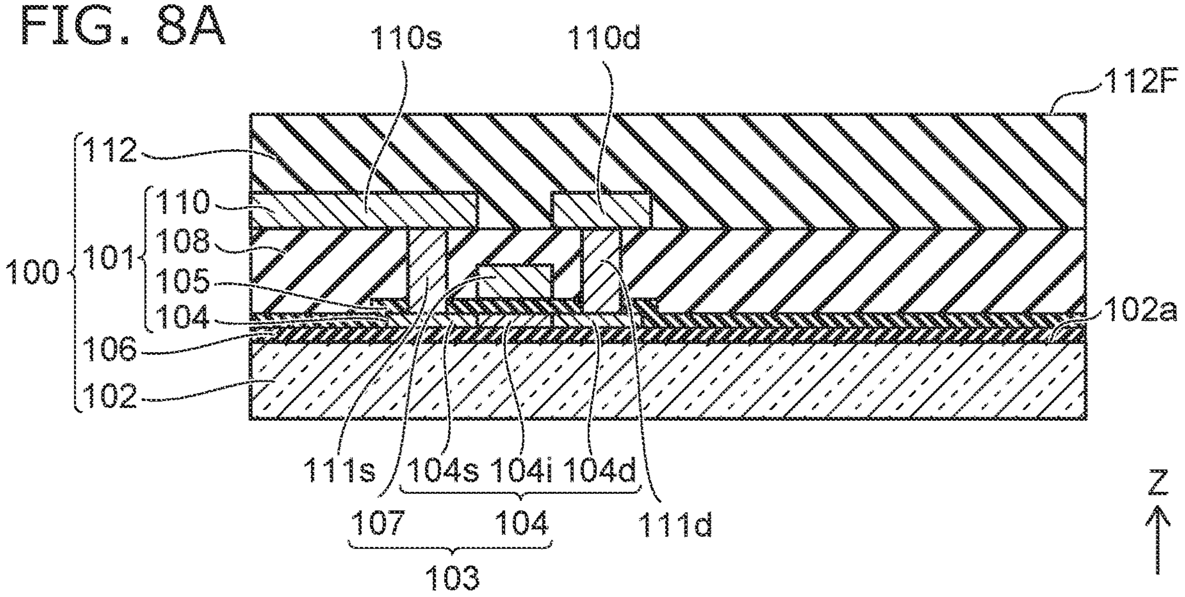
FIG. 8A is a schematic cross-sectional view illustrating a portion of the method for manufacturing the image display device of the first embodiment.

As shown in FIG. 8A, the insulating film 108 is provided to cover the insulating layer 105 and the gate 107. An appropriate formation method according to the material of the insulating film 108 is applied to form the insulating film 108. For example, technology such as ALD, CVD, or the like is used when the insulating film 108 is formed of $SiO_2$.

It is sufficient for the insulating film 108 to be flat enough to form the first wiring layer 110, and a planarizing process may not always be performed. The number of processes can be reduced when a planarizing process of the insulating film 108 is not performed.

The vias 111*s* and 111*d* are formed to extend through the insulating film 108 and the insulating layer 105. The via Ills is formed to reach the region 104*s*. The via 111*d* is formed to reach the region 104*d*. For example, RIE or the like is used to form via holes for forming the vias 111*s* and 111*d*.

The first wiring layer 110 that includes the wiring parts 110*s* and 110*d* is formed on the insulating film 108. The wiring part 110*s* is connected to one end of the via 111*s*. The wiring part 110*d* is connected to one end of the via 111*d*. The first wiring layer 110 may be formed simultaneously with the formation of the vias 111*s* and 111*d*.

The first inter-layer insulating film (the first insulating film) 112 is formed to cover the insulating film 108 and the first wiring layer 110. The planarized surface 112F is formed by planarizing the surface of the first inter-layer insulating film 112 by chemical mechanical polishing (CMP), etc.

Thus, a drive circuit substrate (a first substrate) 100 is formed. The manufacturing processes of the drive circuit substrate 100 may be performed in the same plant or in a different plant from the formation process of the semiconductor layer described below and subsequent processes.

Figure 8B:
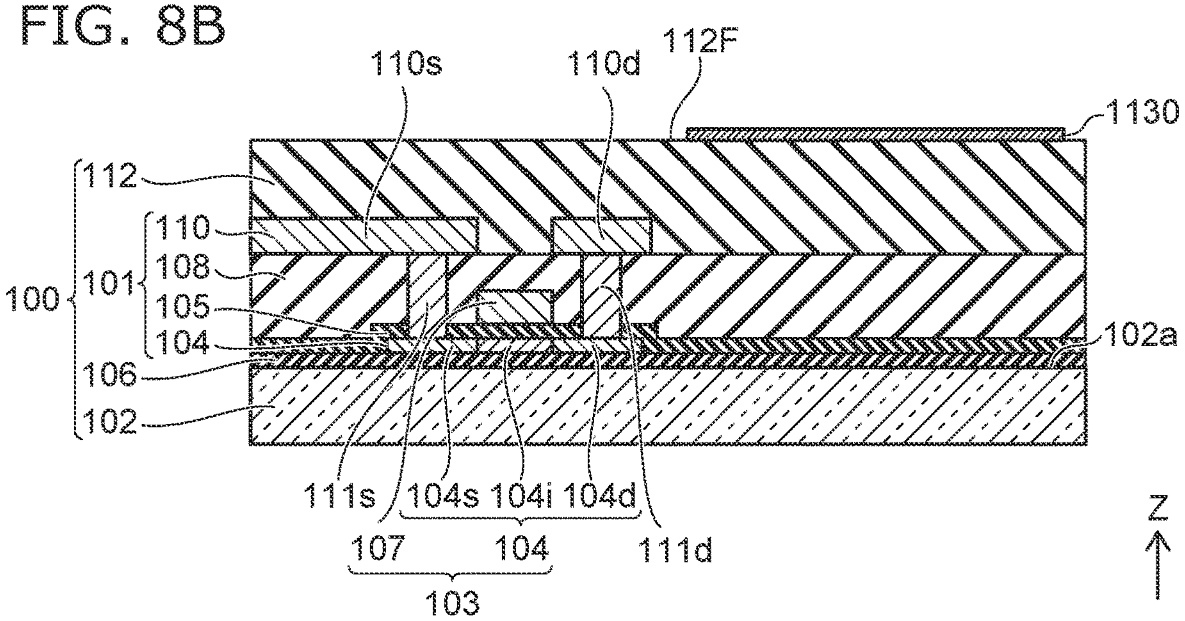
FIG. 8B is a schematic cross-sectional view illustrating a portion of the method for manufacturing the image display device of the first embodiment.

As shown in FIG. 8B, a metal layer 1130 is formed on the planarized surface 112F. For example, the metal layer 1130 is formed by forming a layer of a metal material on the entire surface of the planarized surface 112F by sputtering or the like and then patterning so that the location at which the semiconductor layer is to be formed remains.

Or, a mask that includes a pattern having an opening at the location at which the semiconductor layer is to be formed may be provided on the planarized surface 112F, after which the patterned metal layer 1130 is formed.

For example, the metal layer 1130 is formed using a metal material such as Cu, Hf, etc. It is favorable to use sputtering or the like to form the metal layer 1130 at a low temperature.

The patterned metal layer 1130 is monocrystallized by annealing treatment. It is favorable to perform annealing treatment so that the entire patterned metal layer 1130 is monocrystallized. For example, annealing treatment by laser irradiation is favorably used to monocrystallize the metal layer 1130. Pulsed laser annealing can monocrystallize the metal layer 1130 in a state in which the effects of the temperature on the layers lower than the metal layer 1130 are suppressed to a low temperature of about 400° C. to about 500° C. Therefore, the substrate 102 can include a substrate of glass, an organic resin, etc.

The layer that is formed by monocrystallization treatment of the metal layer 1130 is called the metal seed layer hereinbelow. The relationship between the monocrystallized region of the metal seed layer and the region in which a semiconductor layer 1150 is grown will now be described.

Figure 9A:
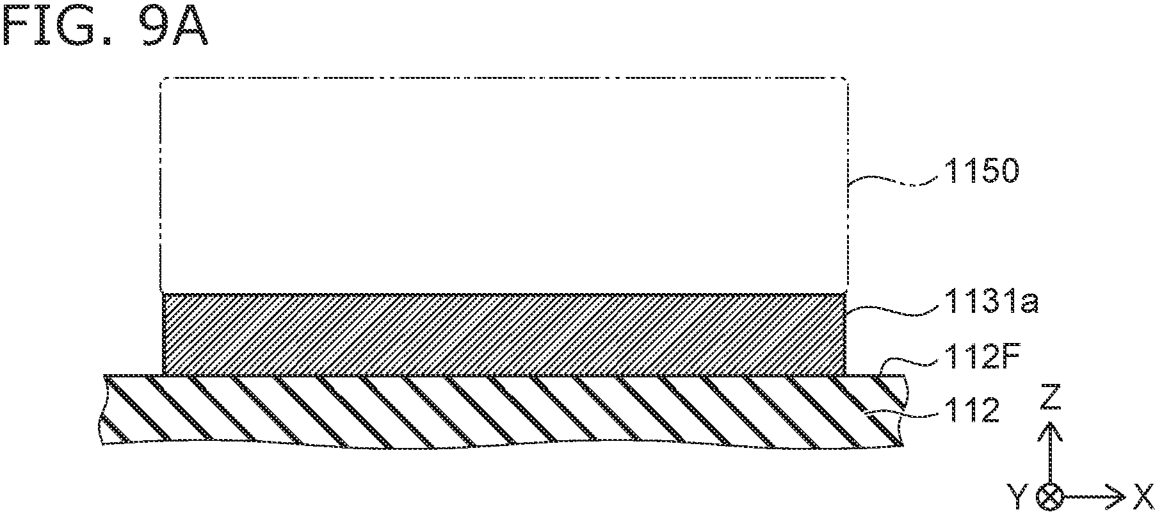
FIG. 9A is a schematic cross-sectional view illustrating a portion of the method for manufacturing the image display device of the first embodiment.
Figure 9B:
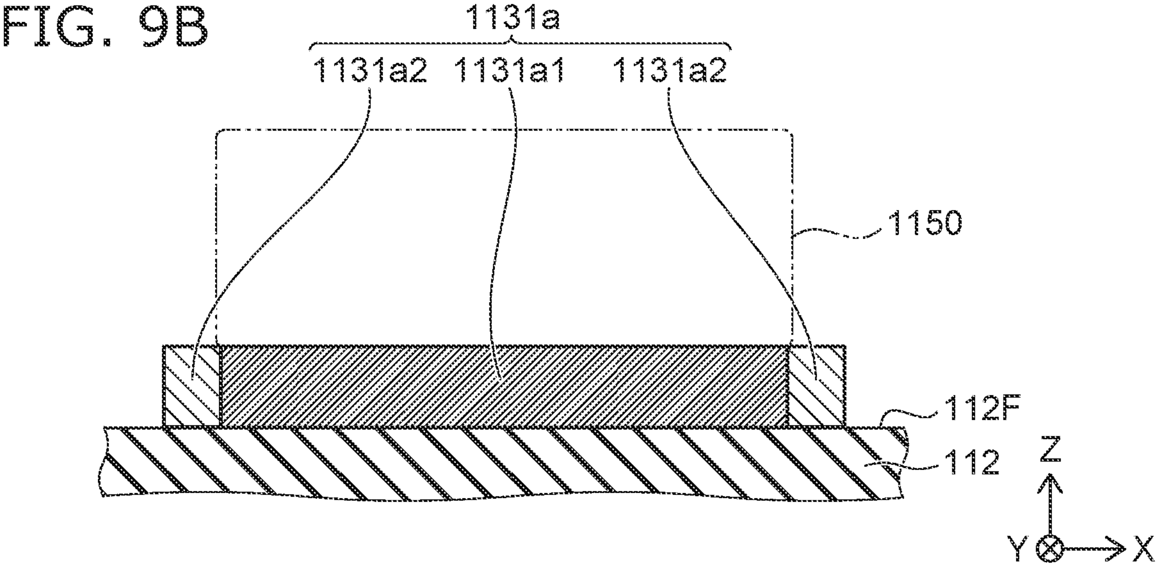
FIG. 9B is a schematic cross-sectional view illustrating a portion of the method for manufacturing the image display device of the first embodiment.
Figure 9C:
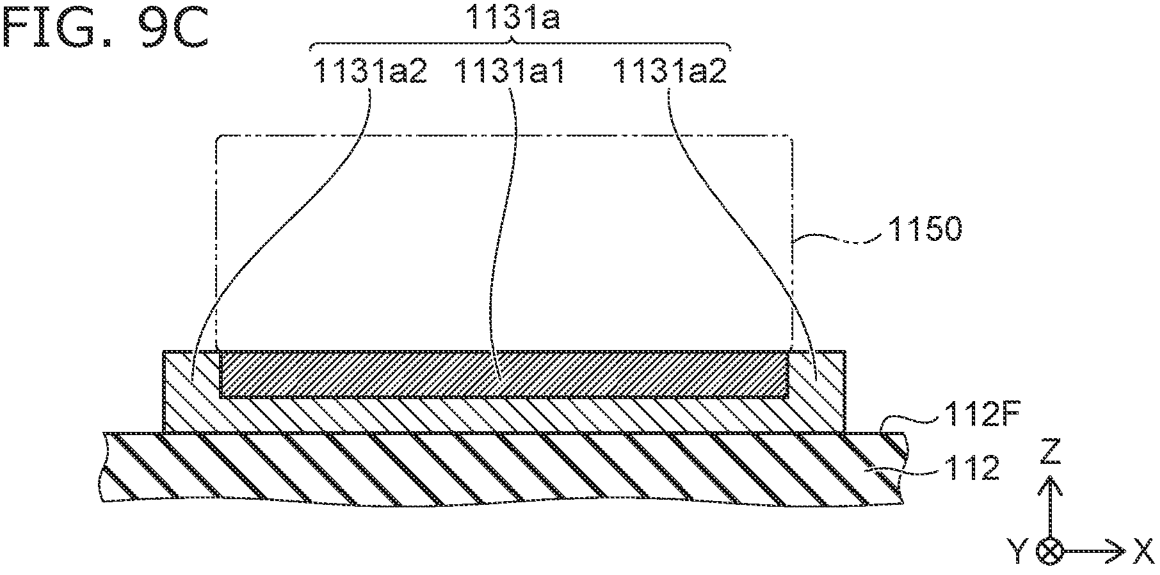
FIG. 9C is a schematic cross-sectional view illustrating a portion of the method for manufacturing the image display device of the first embodiment.

FIGS. 9A to 9C are cross-sectional views of three types of a patterned part 1131*a*. The patterned part 1131*a* is the part formed by patterning the metal seed layer 1130*a* shown in FIG. 10A.

FIG. 9A shows a state in which the entire patterned part 1131*a* is monocrystallized.

As shown in FIG. 9A, the entire patterned part 1131*a* is monocrystallized. More specifically, the patterned part 1131*a* is monocrystallized over the XY plane, and is monocrystallized from the surface of the patterned part 1131*a* to the planarized surface 112F in the Z-axis direction. As shown by the double dot-dash line of FIG. 9A, the semiconductor layer 1150 is formed over the patterned part 1131*a*.

FIGS. 9B and 9C show states in which portions of the patterned part 1131*a* are monocrystallized.

As shown in FIG. 9B, the patterned part 1131*a* includes a monocrystallized part 1131*a*1, and a part 1131*a*2 that is not monocrystallized. The monocrystallized part 1131*a*1 is formed from the surface of the patterned part 1131*a* to the planarized surface 112F in the Z-axis direction. Although the non-monocrystallized part 1131*a*2 is formed to surround the periphery of the monocrystallized part 1131*a*1 in the example, the non-monocrystallized part 1131*a*2 is formed to contact at least a portion of the outer perimeter of the monocrystallized part 1131*a*1. As shown by the double dot-dash line of FIG. 9B, the semiconductor layer 1150 is formed over the monocrystallized part 1131*a*1 of the patterned part 1131*a*. For example, amorphous deposits that include materials of the growth species such as Ga are deposited on the planarized surface 112F and on the non-monocrystallized part 1131*a*2.

As shown in FIG. 9C, the patterned part 1131*a* includes the monocrystallized part 1131*a*1 and the non-monocrystallized part 1131*a*2. The monocrystallized part 1131*a*1 is formed at the surface vicinity of the patterned part 1131*a* in the Z-axis direction and does not reach the planarized surface 112F. Similarly to FIG. 9B, the non-monocrystal part 1131*a*2 is formed at the periphery of the monocrystallized part 1131*a*1. As shown by the double dot-dash line of FIG. 9C, the semiconductor layer 1150 is formed over the monocrystallized part 1131*a*1 of the patterned part 1131*a*. For example, amorphous deposits that include materials of the growth species such as Ga are deposited on the non-monocrystal part 1131*a*2 and on the planarized surface 112F.

Thus, the semiconductor layer 1150 is formed on the monocrystallized part of the patterned part 1131*a*. Therefore, the area of the monocrystallized part of the patterned part 1131*a* when projected onto the XY plane is sufficiently greater than the area of the bottom surface of the light-emitting element, and the outer perimeter of the monocrystallized part is set to include the outer perimeter of the light-emitting element when projected onto the XY plane. That is, the outer perimeter of the light-emitting element is located within the outer perimeter of the monocrystallized part of the patterned part 1131*a* when projected onto the XY plane.

The metal material that is used to form the metal layer 1130 shown in FIG. 8B is, for example, Cu, Hf, etc. The metal material that is included in the metal layer 1130 is not limited to Cu or Hf as long as the metal material can be monocrystallized by annealing treatment. From the perspective of decreasing thermal stress on the drive circuit substrate 100, a metal material that can be monocrystallized by annealing treatment at a lower temperature is favorable. When the semiconductor layer 1150 is formed on the metal seed layer 1130*a*, a conductive buffer layer may be provided on the metal seed layer 1130*a*, and then the semiconductor layer may be grown on the buffer layer by the low-temperature sputtering described above, etc. Any type of buffer layer may be used as long as the material promotes the crystal formation of GaN. A graphene sheet may be used as the buffer layer.

Although the metal seed layer 1130*a* in the following description has the entire patterned part 1131*a* monocrystallized as shown in FIG. 9A above, the metal seed layer 1130*a* is not limited thereto, and the semiconductor layer 1150 may be formed on a monocrystallized part as shown in FIGS. 9B and 9C.

Figure 10A:
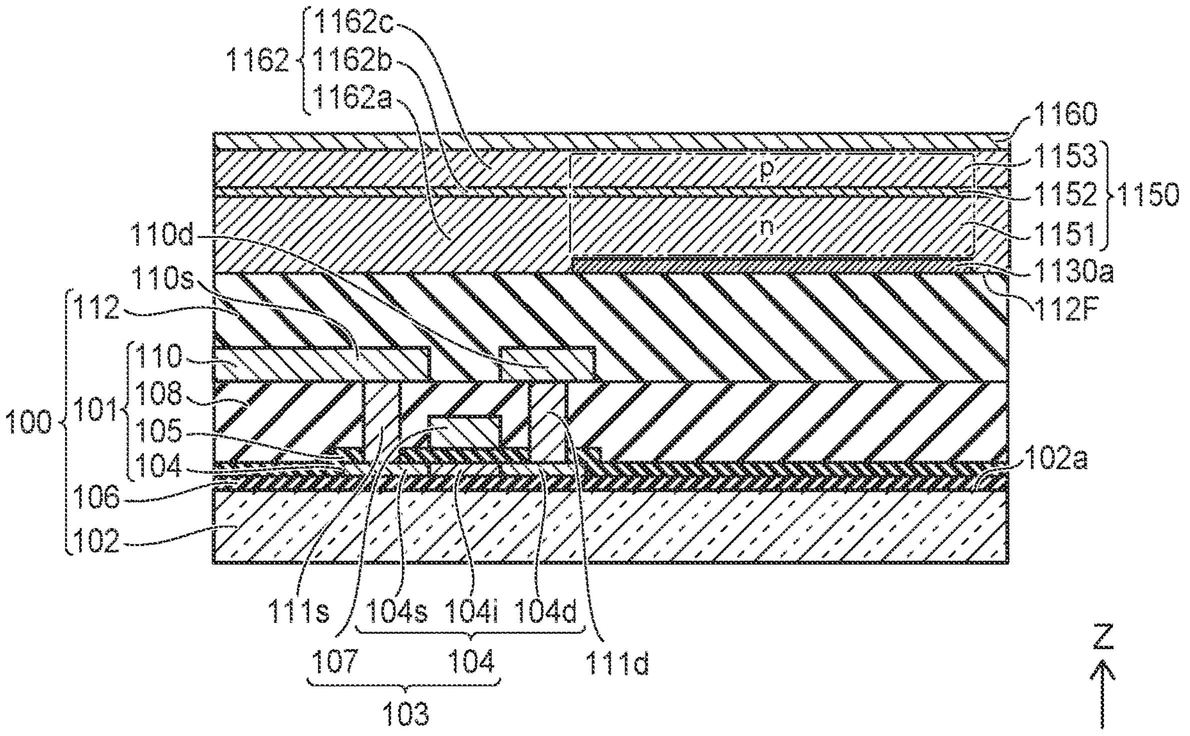
FIG. 10A is a schematic cross-sectional view illustrating a portion of the method for manufacturing the image display device of the first embodiment.

As shown in FIG. 10A, the metal seed layer (the conductive layer) 1130*a* that is monocrystallized by annealing treatment is formed. The semiconductor layer 1150 is formed over the metal seed layer 1130*a*. The semiconductor layer 1150 includes an n-type semiconductor layer 1151, a light-emitting layer 1152, and a p-type semiconductor layer 1153 formed in this order from the metal seed layer 1130*a* in the positive direction of the Z-axis.

To form the semiconductor layer 1150, physical vapor deposition such as vapor deposition, ion beam deposition, molecular beam epitaxy (MBE), sputtering, or the like is used, and it is favorable to use low-temperature sputtering. Low-temperature sputtering is favorable because a lower temperature when forming is possible by assisting with light and/or plasma. There are cases where 1000° C. is exceeded in epitaxial growth by MOCVD. In contrast, it is known that a GaN crystal including a light-emitting layer can be epitaxially grown on the single-crystal metal layer in low-temperature sputtering at a low temperature of about 400° C. to about 700° C. (see Non-Patent Literature 1 and 2, etc.). Such low-temperature sputtering is self-aligning when forming the semiconductor layer 1150 on a circuit board including a TFT, etc., formed by a LTPS process.

The semiconductor layer 1150 includes, for example, GaN, and more specifically, $In_XAl_YGa_{1-X-Y}N$ ($0 \le X$, $0 \le Y$, and $X+Y<1$), etc.

In the initial crystal growth, crystal defects caused by crystal lattice constant mismatch may occur, and crystals in which crystal defects occur are of the n-type. It is therefore advantageous to form the semiconductor layer 1150 from the n-type semiconductor layer 1151 on the planarized surface 112F as in the example because the yield is easily increased because the production process margin can be increased.

By using appropriate film formation technology, the monocrystallized semiconductor layer 1150 including the light-emitting layer 1152 is formed on the metal seed layer 1130*a* by growing the GaN semiconductor layer 1150 on the metal seed layer 1130*a* that is monocrystallized over the entire surface. The semiconductor layer 1150 is formed inside the region shown by the double dot-dash line of FIG. 10A.

In the growth process of the semiconductor layer 1150, there are also cases where an amorphous deposit 1162 that includes materials of the growth species such as Ga is deposited on the planarized surface 112F at which the metal seed layer 1130*a* does not exist. In the example, the deposit 1162 is stacked in the order of deposits 1162*a*, 1162*b*, and 1162*c* from the planarized surface 112F in the positive direction of the Z-axis. In the illustration, the deposit 1162*a* is deposited when forming the n-type semiconductor layer 1151, the deposit 1162*b* is deposited when forming the light-emitting layer 1152, and the deposit 1162*c* is deposited when forming the p-type semiconductor layer 1153; however, the configuration is not limited thereto.

A metal layer (a conductive layer) 1160 is formed on the semiconductor layer 1150. In the example, the metal layer 1160 also is formed on the deposit 1162. More specifically, the metal layer 1160 is formed on the p-type semiconductor layer 1153 and on the deposit 1162*c*.

Figure 10B:
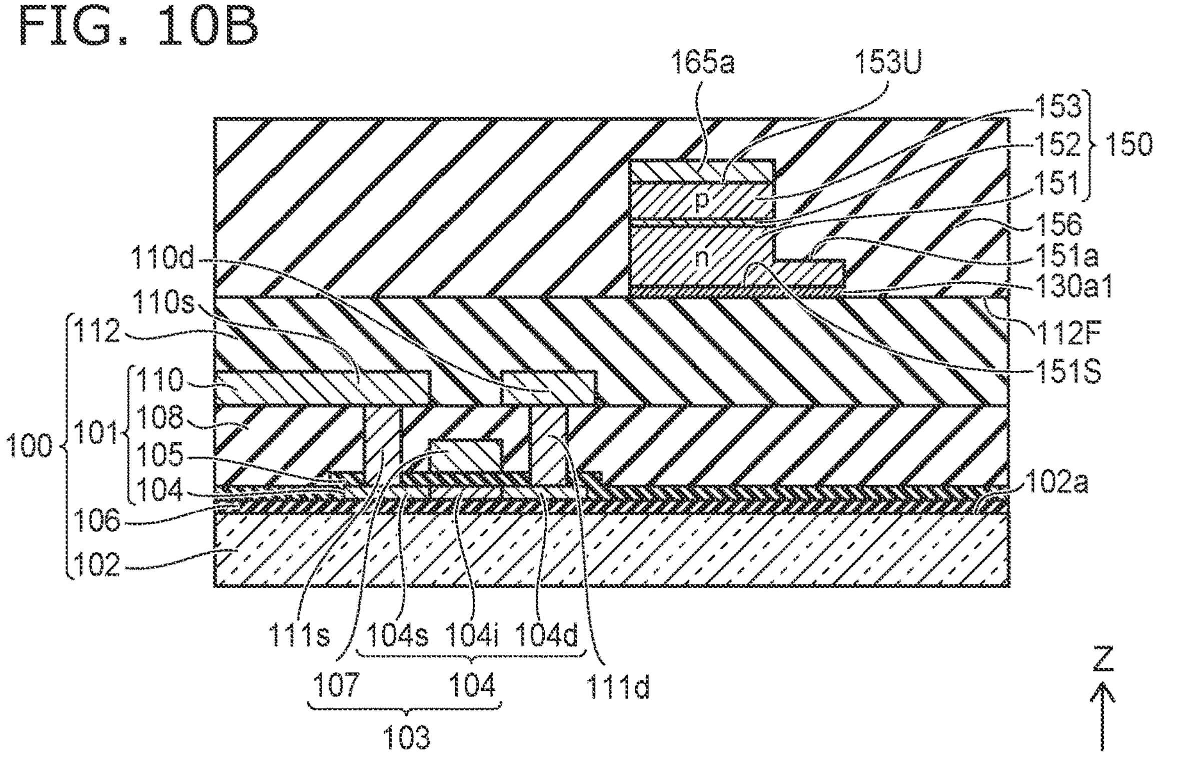
FIG. 10B is a schematic cross-sectional view illustrating a portion of the method for manufacturing the image display device of the first embodiment.

As shown in FIG. 10B, the metal seed layer 1130*a* shown in FIG. 10A is patterned by etching to form a seed plate (a first part) 130*a*1. The semiconductor layer 1150 shown in FIG. 10A is patterned by etching to form the light-emitting element 150. The metal layer 1160 is patterned by etching to form the electrode 165*a*.

In the formation process of the seed plate 130*a*1 of the example, the outer perimeter of the seed plate 130*a*1 when projected onto the XY plane is formed to match the outer perimeter of the light-emitting element 150 when projected onto the XY plane. The outer perimeters are not limited thereto; the outer perimeter of the seed plate 130*al* when projected onto the XY plane may be formed to include the outer perimeter of the light-emitting element 150 when projected onto the XY plane. That is, the outer perimeter of the light-emitting element 150 may be located within the outer perimeter of the seed plate 130*a*1 when projected onto the XY plane.

In the formation process of the light-emitting element 150, the connection part 151*a* is formed, and then the electrode 165*a* on the top surface 153U and the other parts are formed by further etching. The light-emitting element 150 that includes the connection part 151*a* protruding in the positive direction of the X-axis from the n-type semiconductor layer 151 over the planarized surface 112F can be formed thereby. To form the light-emitting element 150, for example, a dry etching process is used, and it is favorable to use anisotropic plasma etching (Reactive Ion Etching (RIE)).

The first inter-layer insulating film (the first insulating film) 112 is formed to cover the planarized surface 112F, the seed plate 130*a*1, the light-emitting element 150, and the electrode 165*a*.

Figure 11A:
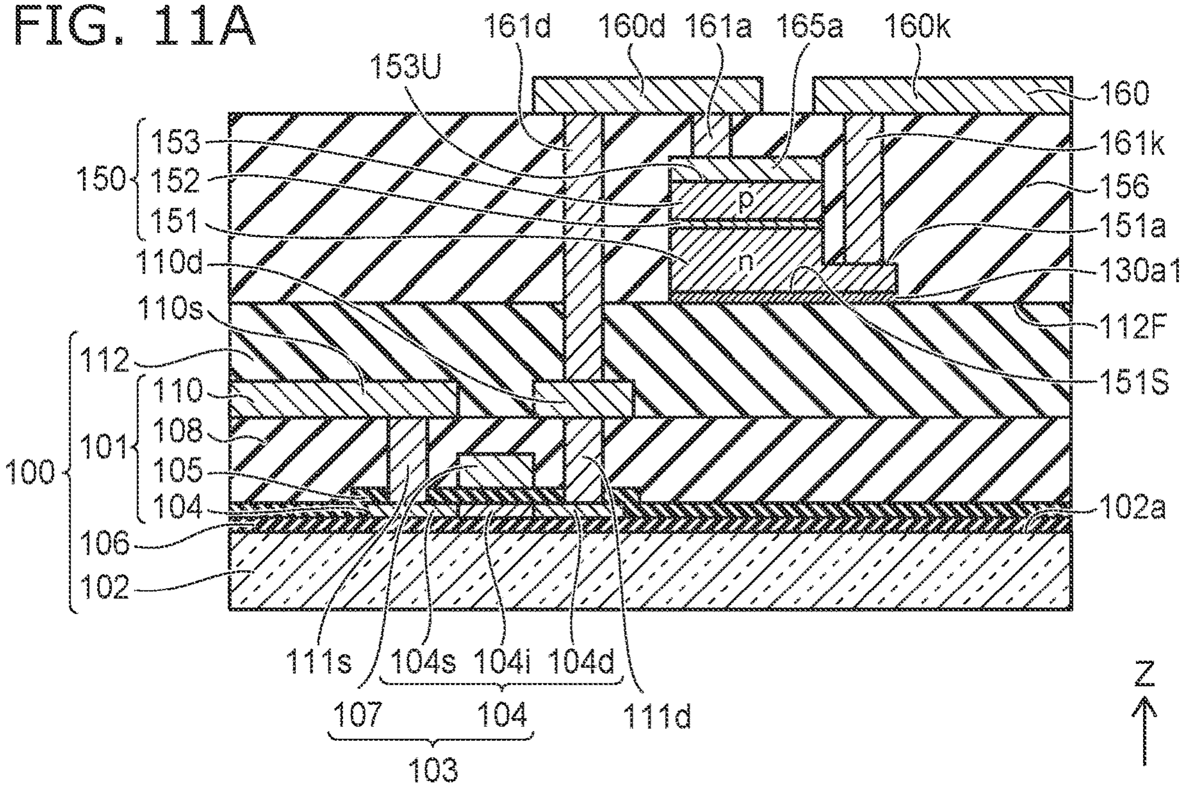
FIG. 11A is a schematic cross-sectional view illustrating a portion of the method for manufacturing the image display device of the first embodiment.

As shown in FIG. 11A, a via hole that extends through the second and first inter-layer insulating films 156 and 112 and reaches the wiring part 110*d* is filled with a conductive material to form the via 161*d* (the first via). Via holes that extend through the second inter-layer insulating film 156 and reach the connection part (the first connection part) 151*a* are filled with a conductive material to form the via (the second via) 161*k*. A contact hole that is formed to reach the electrode 165*a* is filled with a conductive material to form the connection member 161*a*. For example, RIE or the like is used to form the via holes and the contact holes.

The second wiring layer 160 that includes the wiring parts 160*d* and 160*k* is formed on the second inter-layer insulating film 156. The wiring part 160*d* is connected to the connection member 161*a* and one end of the via 161*d*. The wiring part 160*k* is connected to one end of the via 161*k*. The second wiring layer 160 may be formed simultaneously with the formation of the vias 161*k* and 161*d* and the connection member 161*a*.

Figure 11B:
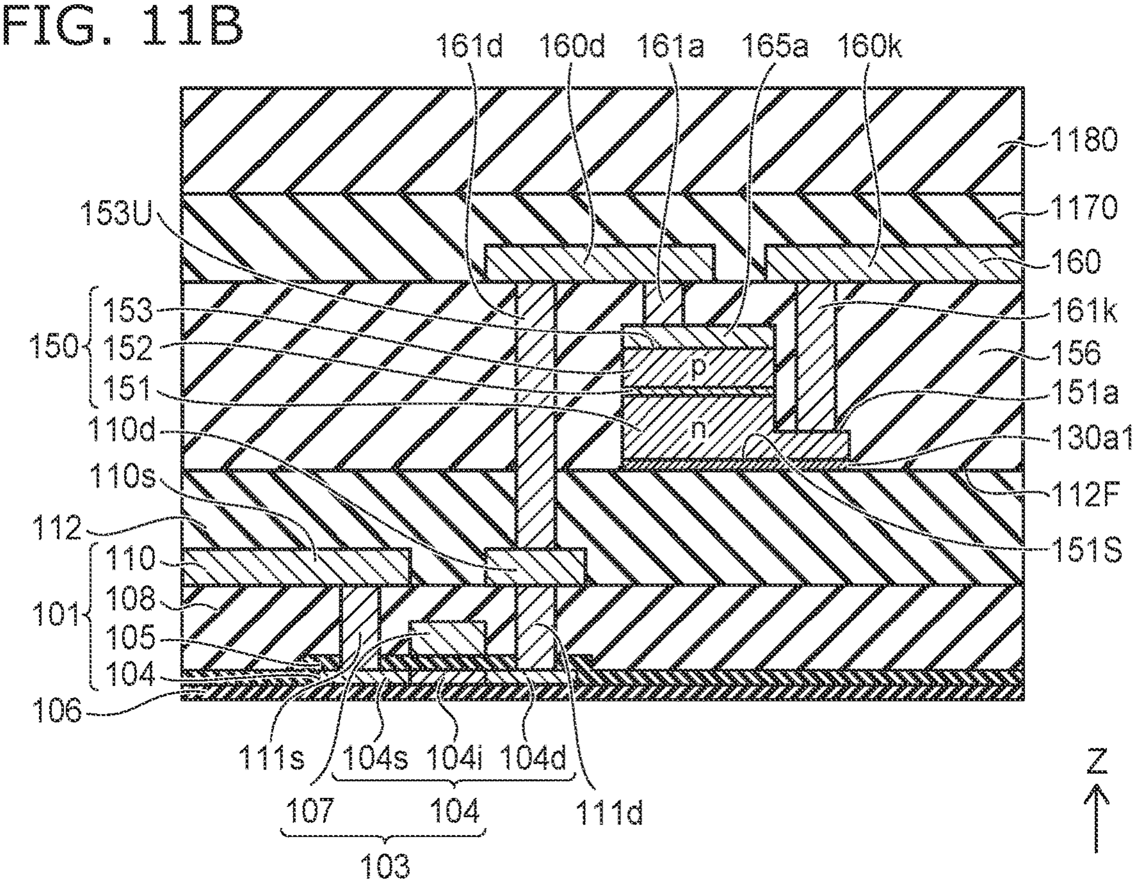
FIG. 11B is a schematic cross-sectional view illustrating a portion of the method for manufacturing the image display device of the first embodiment.

As shown in FIG. 11B, an adhesive layer 1170 is formed on the second inter-layer insulating film 156 and the second wiring layer 160, and a reinforcing substrate 1180 is bonded via the adhesive layer 1170. The reinforcing substrate 1180 is provided to maintain the strength of the structural component after removing the substrate 102 shown in FIG. 11A to be sufficient for the processing, movement, etc., in the subsequent processes. The substrate 102 is subsequently removed. Wet etching and/or laser lift-off is used to remove the substrate 102.

Figure 12A:
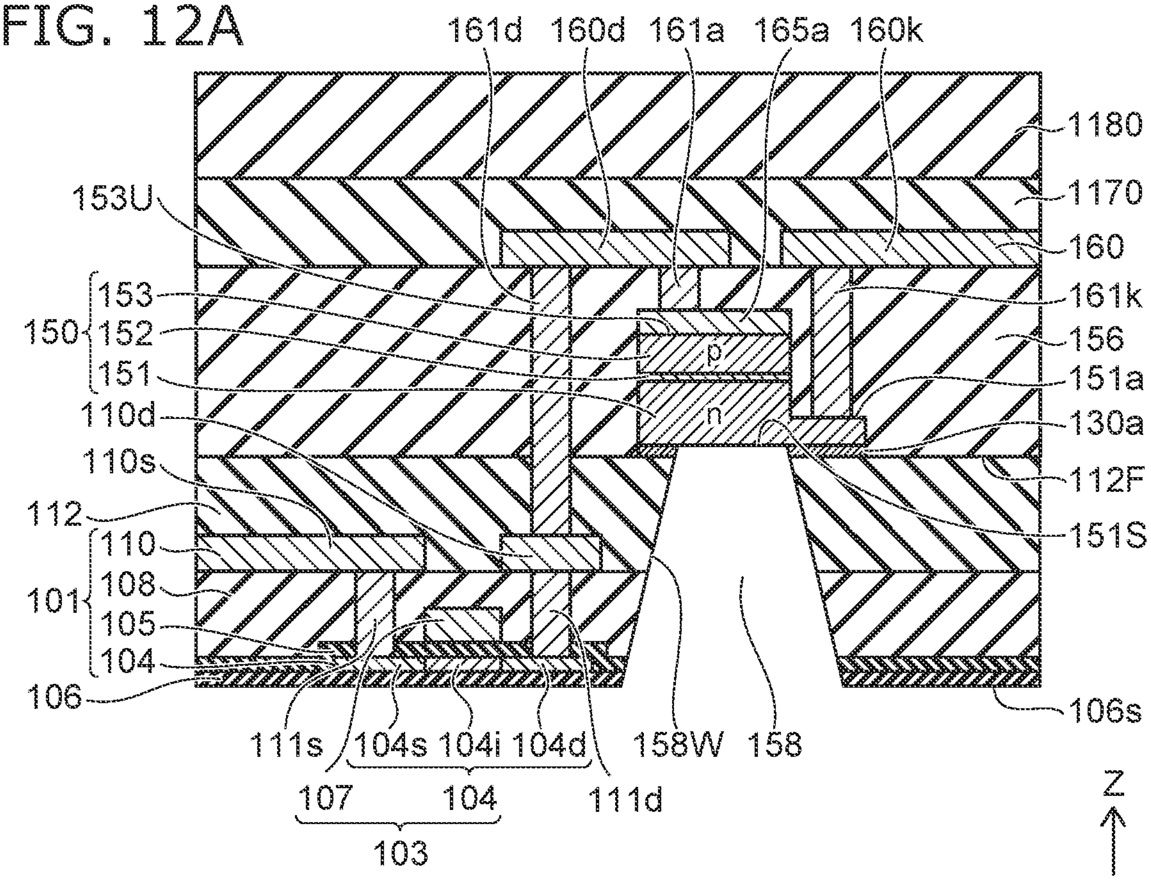
FIG. 12A is a schematic cross-sectional view illustrating a portion of the method for manufacturing the image display device of the first embodiment.

As shown in FIG. 12A, the opening 158 is formed from the surface 106S of the TFT underlying film 106 exposed by removing the substrate 102 to expose the light-emitting surface 151S. The opening 158 is formed by sequentially removing a portion of the TFT underlying film 106, the insulating layer 105, the insulating film 108, the first inter-layer insulating film 112, and the seed plate 130*a*1 shown in FIG. 11B. For example, wet etching is used to form the opening 158. The etching solvent may be modified as appropriate or combined with dry etching according to the material of the layer or film to be removed.

By mainly using wet etching, the shape of the wall surface 158W of the opening 158 when projected onto the XY plane has a truncated circular conic shape that gradually decreases from the surface 106S toward the light-emitting surface 151S.

Figure 12B:
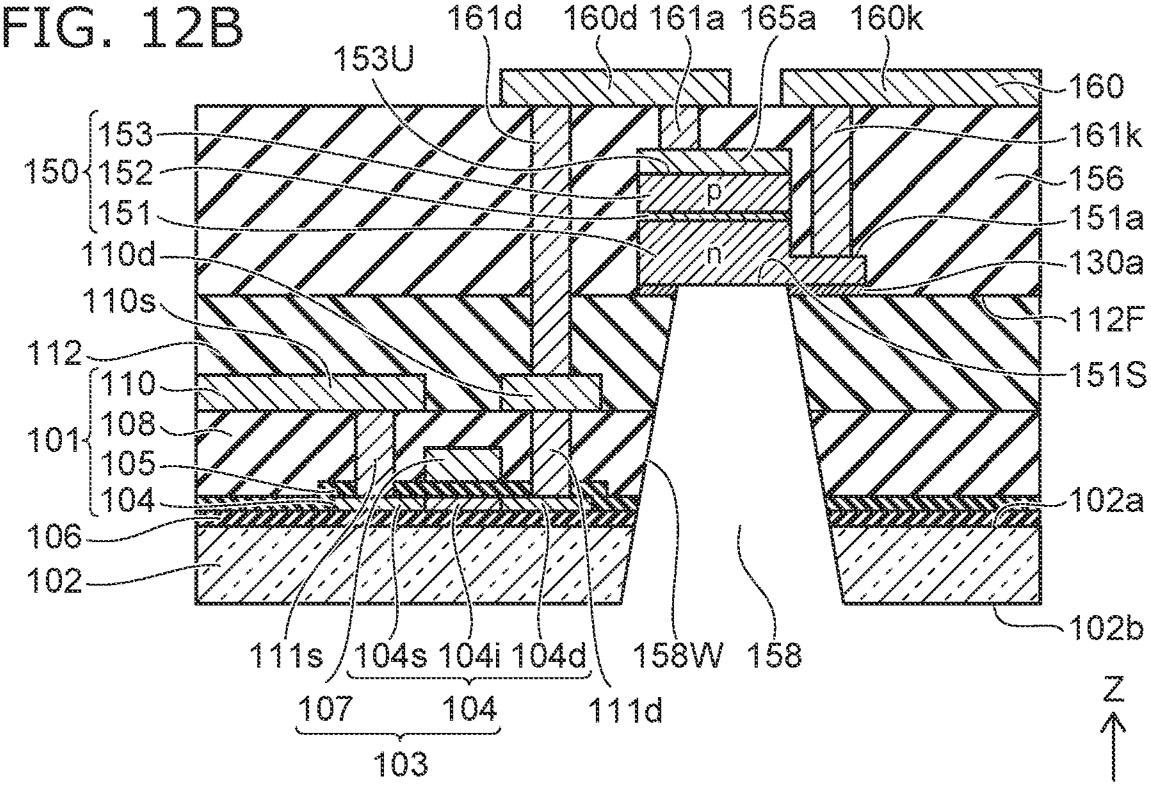
FIG. 12B is a schematic cross-sectional view illustrating a portion of a method for manufacturing an image display device of a modification of the first embodiment.

FIG. 12B illustrates a process of the modification 1 shown in FIG. 2.

As shown in FIG. 12B, the opening 158 is formed from the surface 102*b* of the substrate 102 to expose the light-emitting surface 151S. The opening 158 is formed by sequentially removing the substrate 102, the TFT underlying film 106, the insulating layer 105, the insulating film 108, the first inter-layer insulating film 112, and the seed plate 130*a* shown in FIG. 11B. The opening 158 is formed by wet etching using a solvent corresponding to the material, etc. Thus, according to the modification 1, the overall processes can be reduced by omitting the process of removing the substrate 102.

FIGS. 13A to 13D are schematic cross-sectional views illustrating portions of the method for manufacturing the image display device of the embodiment.

FIGS. 13A to 13D show a method of forming a color filter by inkjet printing. The color filter formation process is applicable similarly to the embodiment described above and the modification 1.

Figure 13A:
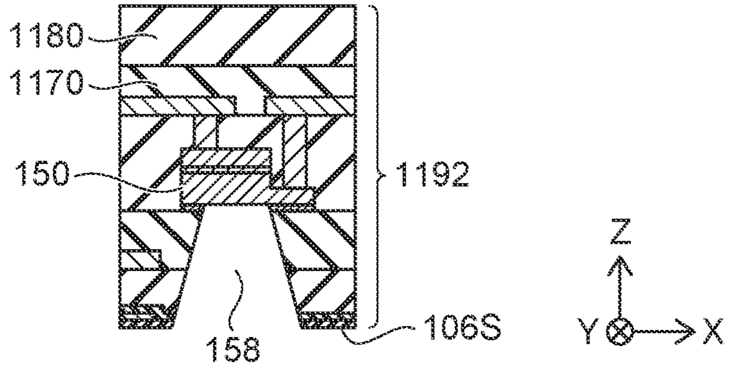
FIG. 13A is a schematic cross-sectional view illustrating a portion of the method for manufacturing the image display device of the first embodiment.

As shown in FIG. 13A, a structure body 1192 is prepared in which the surface 106S is exposed and the opening 158 is formed. In addition to the light-emitting element 150, the adhesive layer 1170, and the reinforcing substrate 1180, the structure body 1192 includes the TFT underlying film 106, the circuit 101, the first inter-layer insulating film 112, the seed plate 130*a*, the electrode 165*a*, the vias 161*d* and 161*k*, the second wiring layer 160, etc., shown in FIG. 12A.

Figure 13B:
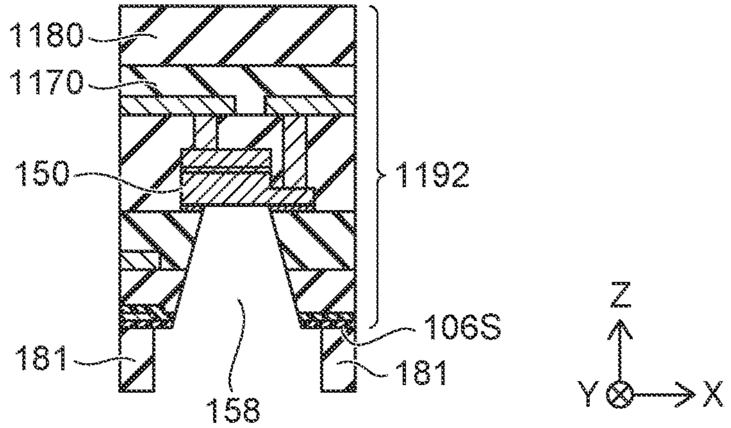
FIG. 13B is a schematic cross-sectional view illustrating a portion of the method for manufacturing the image display device of the first embodiment.

As shown in FIG. 13B, the light-shielding part 181 is formed in the region on the surface 106S in which the opening 158 is not included. For example, the light-shielding part 181 is formed using screen printing, photolithography technology, etc.

Figure 13C:
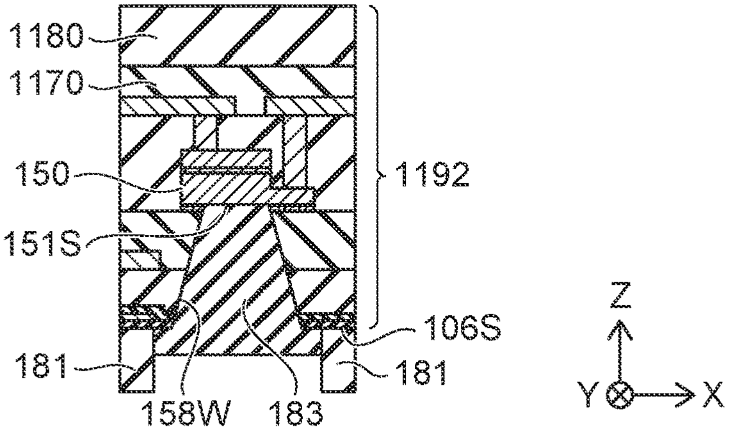
FIG. 13C is a schematic cross-sectional view illustrating a portion of the method for manufacturing the image display device of the first embodiment.

As shown in FIG. 13C, a fluorescer that corresponds to the light emission color is dispensed from an inkjet nozzle to form the color conversion layer 183. The fluorescer that forms the color conversion layer 183 is dispensed to cover the light-emitting surface 151S and the wall surface 158W of the opening 158. The fluorescer also colors the region between the light-shielding part 181 on the surface 106S. A sufficient amount of the fluorescer is dispensed so that the exposed surface of the color conversion layer 183 is sufficiently further in the negative direction than the position in the Z-axis direction of the surface 106S.

The fluorescer includes, for example, a fluorescent coating that uses a general fluorescer material, a perovskite fluorescer material, or a quantum dot fluorescer material. It is favorable to use a perovskite fluorescer material or a quantum dot fluorescer material because the light emission colors can be realized with high monochromaticity and high color reproducibility.

After printing with the inkjet nozzle, drying processing is performed using an appropriate temperature and time.

As described above, the color conversion layer 183 is not formed in the subpixel of blue light emission when the color conversion part is not formed. Also, when a blue color conversion layer is formed in the subpixel of blue light emission, and when the color conversion part may have one layer, it is favorable to set the dispensed amount of the blue fluorescer to completely fill the region formed by the light-shielding part 181.

Figure 13D:
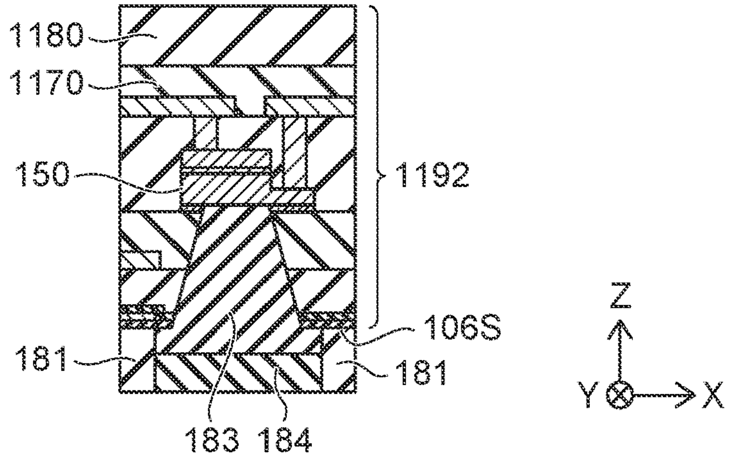
FIG. 13D is a schematic cross-sectional view illustrating a portion of the method for manufacturing the image display device of the first embodiment.

As shown in FIG. 13D, the coating for the filter layer 184 is dispensed from the inkjet nozzle. The coating is coated to overlap the coating of the fluorescer. The dispensed amount is set to completely fill the region formed by the light-shielding part 181.

After the color filter 180 is formed, the structure body 1192 is diced together with the color filter 180 to form the image display device. The formation process of the color filter 180 may be performed after dicing the structure body 1192.

A process of forming the film-type color filter 180*a* shown in FIG. 3 will now be described.

Figure 14:
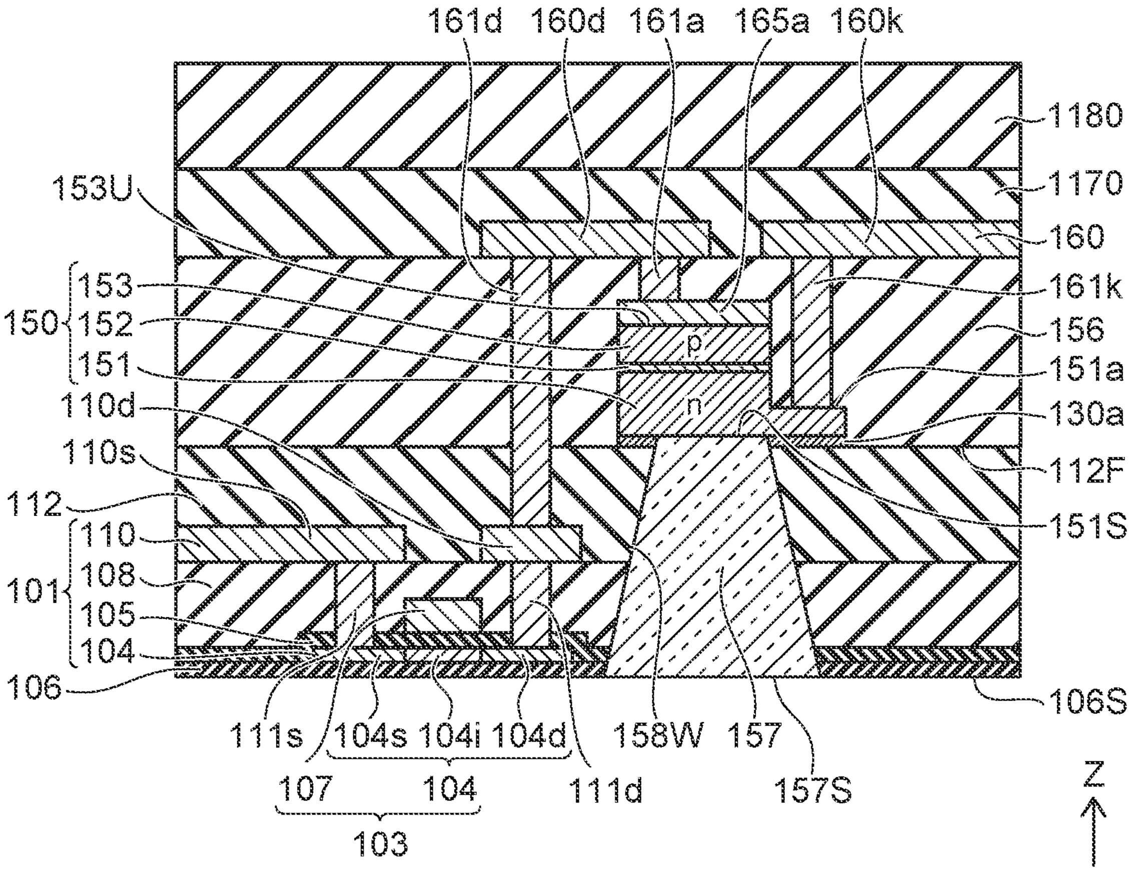
FIG. 14 is a schematic cross-sectional view illustrating a portion of a method for manufacturing an image display device of a modification of the first embodiment.
Figure 15:
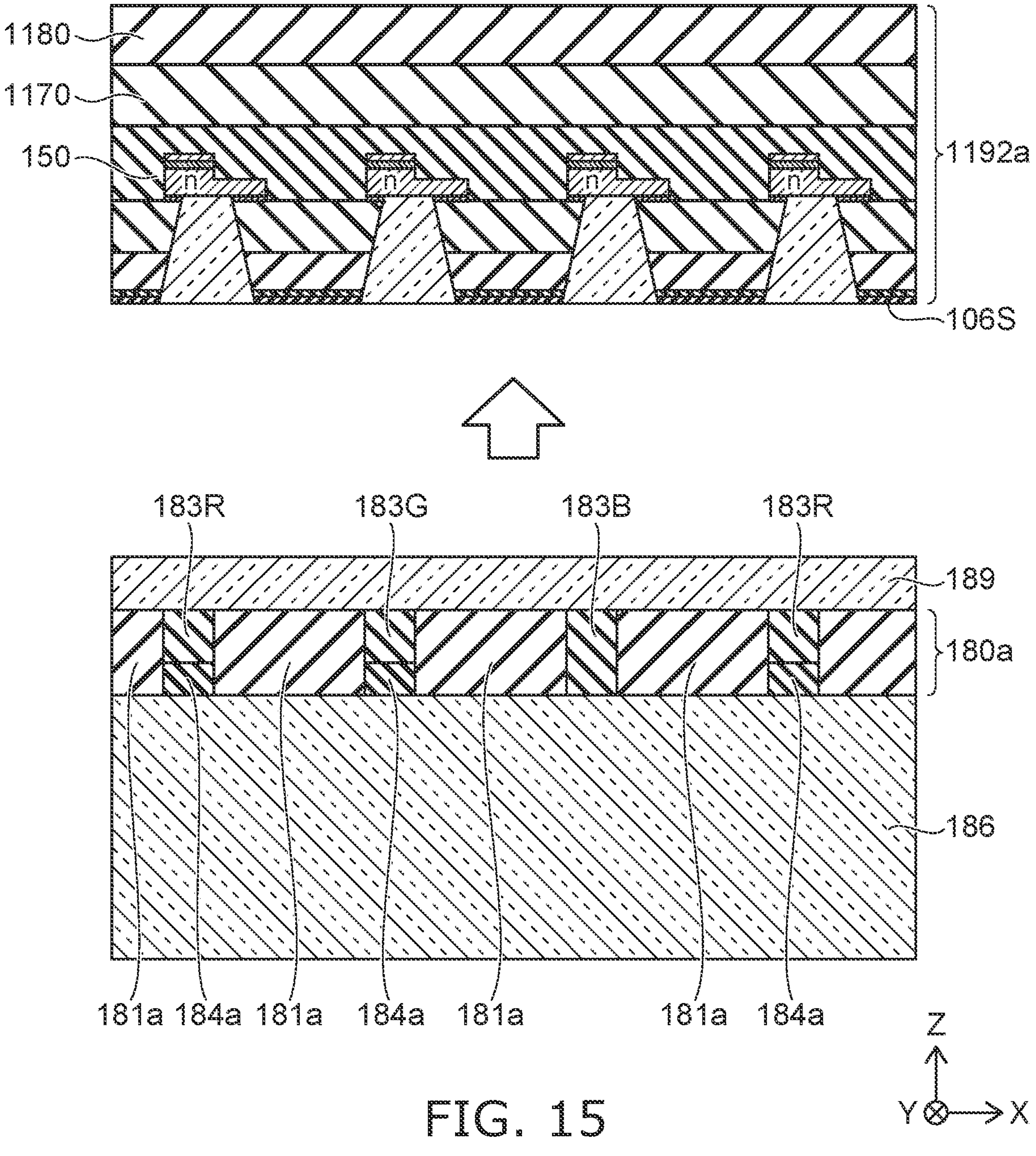
FIG. 15 is a schematic cross-sectional view illustrating a portion of a method for manufacturing an image display device of a modification of the first embodiment.

FIGS. 14 and 15 are schematic cross-sectional views illustrating a method for manufacturing the image display device of the embodiment.

The process shown in FIG. 14 is performed after the process shown in FIG. 12A.

As shown in FIG. 14, the opening 158 shown in FIG. 12A is filled with the transparent resin layer 157. The transparent resin layer 157 is formed to cover the light-emitting surface 151S and the wall surface 158W. The exposed surface 157S of the transparent resin layer 157 is formed in substantially the same plane as the exposed surface 106S of the TFT underlying film 106.

The drawing above the arrow in FIG. 15 shows a structure body 1192*a*. In addition to the light-emitting element 150, the adhesive layer 1170, and the reinforcing substrate 1180, the structure body 1192*a* includes the transparent resin layer 157, the TFT underlying film 106, the circuit 101, the first inter-layer insulating film 112, the seed plate 130*a*, the electrode 165*a*, the vias 161*d* and 161*k*, the second wiring layer 160, etc., shown in FIG. 14. The drawing below the arrow shows a glass substrate 186, the color filter 180*a* bonded to the glass substrate 186, and the transparent thin film adhesive layer 189 that bonds the color filter 180*a* to the structure body 1192*a*. The arrow illustrates how the color filter 180*a* is adhered, together with the glass substrate 186 and the transparent thin film adhesive layer 189, to the structure body 1192.

To avoid complexity in FIG. 15, the components and/or their reference numerals are not illustrated for some of the components of the structure body 1192*a*. The components inside the structure body 1192*a* that are not illustrated are the circuit 101, the vias 161*d* and 161*k*, the connection member 161*a*, and the second wiring layer 160 shown in FIG. 14.

As shown in FIG. 15, the color filter (the wavelength conversion member) 180*a* includes the light-shielding part 181*a*, color conversion layers 183R, 183G, and 183B, and a filter layer 184*a*. The light-shielding part 181*a* has a function similar to when an inkjet technique is used. The color conversion layers 183R, 183G, and 183B are formed to have functions and materials similar to those of the color conversion layer 183 when an inkjet technique is used. The filter layer 184*a* also has a function similar to when an inkjet technique is used.

The color filter 180*a* is bonded to the structure body 1192*a* at one surface. The other surface of the color filter 180*a* is bonded to the glass substrate 186. The transparent thin film adhesive layer 189 is located at the one surface of the color filter 180*a*, and the one surface of the color filter 180*a* is bonded to the exposed surface 106S of the TFT underlying film of the structure body 1192*a* via the transparent thin film adhesive layer 189.

In the color filter 180*a* of the example, color conversion parts are arranged in the positive direction of the X-axis in the order of red, green, and blue. For the red color conversion part, a red color conversion layer 183R is located in the layer at the transparent thin film adhesive layer 189 side. For the green color conversion part, the green color conversion layer 183G is located in the layer at the transparent thin film adhesive layer 189 side. For the red color conversion part and the green color conversion part, the filter layers 184*a* are located in the layer at the glass substrate 186 side. For the blue color conversion part in the example, the single-layer color conversion layer 183B is located from the glass substrate 186 side to the transparent thin film adhesive layer 189 side. The configuration is not limited thereto; the filter layer 184*a* may be located at the glass substrate 186 side similarly to the other colors. For the red and green color conversion parts, for example, the frequency characteristic of the filter layer 184*a* may be the same characteristic that transmits light of red and green wavelengths, or may be a different characteristic for each color of the color conversion parts. The light-shielding part 181*a* is located between the color conversion parts.

As shown by the arrow of FIG. 15, the color filter 180*a* is adhered to the structure body 1192*a* via the transparent thin film adhesive layer 189 by aligning the positions of the color conversion layers 183R, 183G, and 183B of the colors with the positions of the light-emitting elements 150.

Subsequently, the reinforcing substrate 1180 is removed together with the adhesive layer 1170; however, the image display device may be made without removing the reinforcing substrate 1180 and the adhesive layer 1170.

The glass substrate 186 may be removed or may remain as-is. When the glass substrate 186 remains, the color filter 180*a* can be protected from the external environment.

After the color filter 180*a* is formed, the structure body 1192*a* is diced together with the color filter 180*a* to form the image display device. The formation process of the color filter 180*a* may be performed after dicing the structure body 1192*a*.

Thus, the color filters 180 and 180*a* are formed in the structure bodies 1192 and 1192*a*, and the subpixels are formed. An appropriate technique for the color filter is selected among inkjet techniques, film techniques, and other techniques that can form an equivalent color filter. By forming the color filter 180 by inkjet printing, the film adhesion process, etc., can be omitted, and the image display device can be manufactured more inexpensively.

It is desirable to make the color conversion layer 183 as thick as possible to increase the color conversion efficiency for both the color filter 180 formed by inkjet printing and the film-type color filter 180*a*. On the other hand, when the color conversion layer 183 is too thick, the light emitted by the color conversion approximates Lambertian, but the blue light that is not color-converted has an emission angle limited by the light-shielding part 181. Therefore, a problem undesirably occurs in that the display color of the display image has viewing angle dependence. To match the light distribution of the light of the subpixels in which the color conversion layer 183 is provided with the light distribution of the blue light that is not color-converted, it is desirable to set the thickness of the color conversion layer 183 to be about half of the opening size of the light-shielding part 181.

For example, in the case of a high-definition image display device of about 250 ppi (pitch per inch), the pitch of the subpixels 20 is about 30 μm, and so it is desirable for the thickness of the color conversion layer 183 to be about 15 μm. Here, when the color conversion material is made of spherical fluorescer particles, it is favorable to stack in a close-packed structure to suppress light leakage from the light-emitting element 150. It is therefore necessary to use at least three layers of particles. Accordingly, it is favorable for the particle size of the fluorescer material included in the color conversion layer 183 to be, for example, not more than about 5 μm, and more favorably not more than about 3 μm.

According to the modification 3 shown in FIG. 4, the color filter formation process can be omitted because the color filter is not formed.

FIG. 16 is a schematic perspective view illustrating the image display device according to the embodiment.

In the image display device of the embodiment as shown in FIG. 16, the circuit 101 that includes a transistor is located on the color filter 180, and a light-emitting circuit part 172 that includes many light-emitting elements 150 is located on the planarized surface 112F. In addition to the light-emitting element 150 on which the electrode 165*a* shown in FIG. 1 is formed, the light-emitting circuit part 172 includes the seed plate 130*a*, the second inter-layer insulating film 156, and the second wiring layer 160 shown in FIG. 1. The circuit 101 and the light-emitting circuit part 172 are electrically connected by the vias 161*d* and 161*k* shown in FIG. 1.

Modification

FIG. 17 is a schematic perspective view illustrating an image display device according to a modification of the embodiment.

According to the modification 3 shown in FIG. 4 above, a monochromatic light-emitting image display device is formed as in the example without providing a color filter.

In the image display device of the modification as shown in FIG. 17, the light-emitting circuit part 172 that includes many light-emitting elements 150 is located on the planarized surface 112F of the circuit 101.

Effects of the image display device of the embodiment will now be described.

According to the method for manufacturing the image display device of the embodiment, the semiconductor layer 1150 that is formed by crystal growth on the planarized surface 112F of the drive circuit substrate 100 is etched to form the light-emitting element 150. Subsequently, the light-emitting element 150 is covered with the second inter-layer insulating film 156 and electrically connected with the circuit 101 made inside the drive circuit substrate 100. Therefore, the manufacturing processes are markedly reduced compared to when singulated light-emitting elements are individually transferred to the substrate 102.

According to the method for manufacturing the image display device 1 of the embodiment, the metal seed layer 1130*a* can be formed by monocrystallizing the metal layer 1130 formed on the planarized surface 112F, and can be used as the seed for performing crystal growth of the semiconductor layer 1150. For example, sufficiently high productivity can be realized because laser annealing treatment can be utilized to monocrystallize the metal layer 1130.

For example, in an image display device having 4K image quality, the number of subpixels is greater than 24 million, and in the case of an image display device having 8K image quality, the number of subpixels is greater than 99 million. When individually forming and mounting such a large quantity of light-emitting elements to a circuit board, an enormous amount of time is necessary. It is therefore difficult to realize an image display device that uses micro LEDs at a realistic cost. Also, when individually mounting a large quantity of light-emitting elements, the yield decreases due to connection defects when mounting, etc., and an even higher cost is unavoidable; however, the method for manufacturing the image display device of the embodiment provides the following effects.

According to the method for manufacturing the image display device of the embodiment, the transfer process of the light-emitting elements 150 can be reduced because the light-emitting elements 150 are formed after forming the entire semiconductor layer 1150 on the metal seed layer 1130*a* formed on the planarized surface 112F. Therefore, according to the method for manufacturing the image display device 1 of the embodiment, compared to a conventional manufacturing method, the time of the transfer process can be reduced, and the number of processes can be reduced.

Because the semiconductor layer 1150 that has a uniform crystal structure is grown on the metal seed layer 1130*a* made of the single-crystal metal, the light-emitting element 150 can be located through self-alignment by appropriately patterning the metal seed layer 1130*a*. This is favorable for a higher-definition display because alignment of the light-emitting elements on the substrate 102 is unnecessary, and it is easy to reduce the size of the light-emitting element 150.

The light-emitting element is formed directly by etching, etc., on the drive circuit substrate 100 in which the circuit 101 is already embedded, and then the light-emitting element 150 and the circuit 101 in a lower layer than the light-emitting element 150 are electrically connected by via formation, etc.; therefore, a uniform connection structure can be realized, and the reduction of the yield can be suppressed.

The drive circuit substrate 100 can include a drive circuit, a scanning circuit, and the like including TFTs, etc. A LTPS process or the like is advantageous in that existing manufacturing processes and plants of flat panel displays can be utilized, and the circuit 101 that is included in the drive circuit substrate 100 can be made in a light-transmitting substrate such as a glass substrate, etc.

In the image display device of the embodiment, the light-emitting element 150 is stacked on the drive circuit substrate 100, and there are cases where the optical path from the light-emitting surface 151S to the outside is long. For example, the optical path is the length in the Z-axis direction of the opening 158 shown in FIG. 12A, and there are cases where the optical path is about 1 μm to about several μm. That is, the light that is output from the light-emitting surface 151S is radiated externally via the optical path of about 1 μm to about several μm. Therefore, the light that is output from the light-emitting surface 151S is attenuated more than when directly radiated externally according to the length of the optical path. The optical path is filled with the color conversion layer 183, and the intensity of the emitted light is further attenuated according to the absorptance for the light by the fluorescer included in the color conversion layer 183.

According to the embodiment, the light-reflective electrode 165*a* is provided over the top surface 153U located at the side opposite to the light-emitting surface 15 IS. Therefore, the upward-scattered light and the like of the light-emitting element 150 is reflected toward the light-emitting surface 151S side by the electrode 165*a*.

Other than the light-emitting surface 151S and the top surface 153U, the light-emitting element 150 is covered with the second inter-layer insulating film 156. By forming the second inter-layer insulating film 156 of a material having high light reflectivity such as a white resin, etc., the sideward-scattered light and the like of the light-emitting element 150 can be reflected so that the sideward-scattered light and the like do not leak sideward from the light-emitting element 150.

Thus, in the image display device of the embodiment, the light-emitting element 150 is covered with the electrode 165*a* and the second inter-layer insulating film 156, and the light that travels in directions other than the light-emitting surface 151S can be confined inside the light-emitting element 150. The light that is confined inside the light-emitting element 150 is reflected at the interface between the light-emitting element 150 and the second inter-layer insulating film 156, and a portion of the light is guided toward the light-emitting surface 151S side. Accordingly, the substantial luminous efficiency of the light-emitting element 150 can be increased, and light of sufficient intensity can be radiated externally even when the intensity of the light is attenuated by the optical absorptance of the fluorescer and/or the long optical path until being radiated externally from the light-emitting surface 151S.

Second Embodiment

Figure 18:
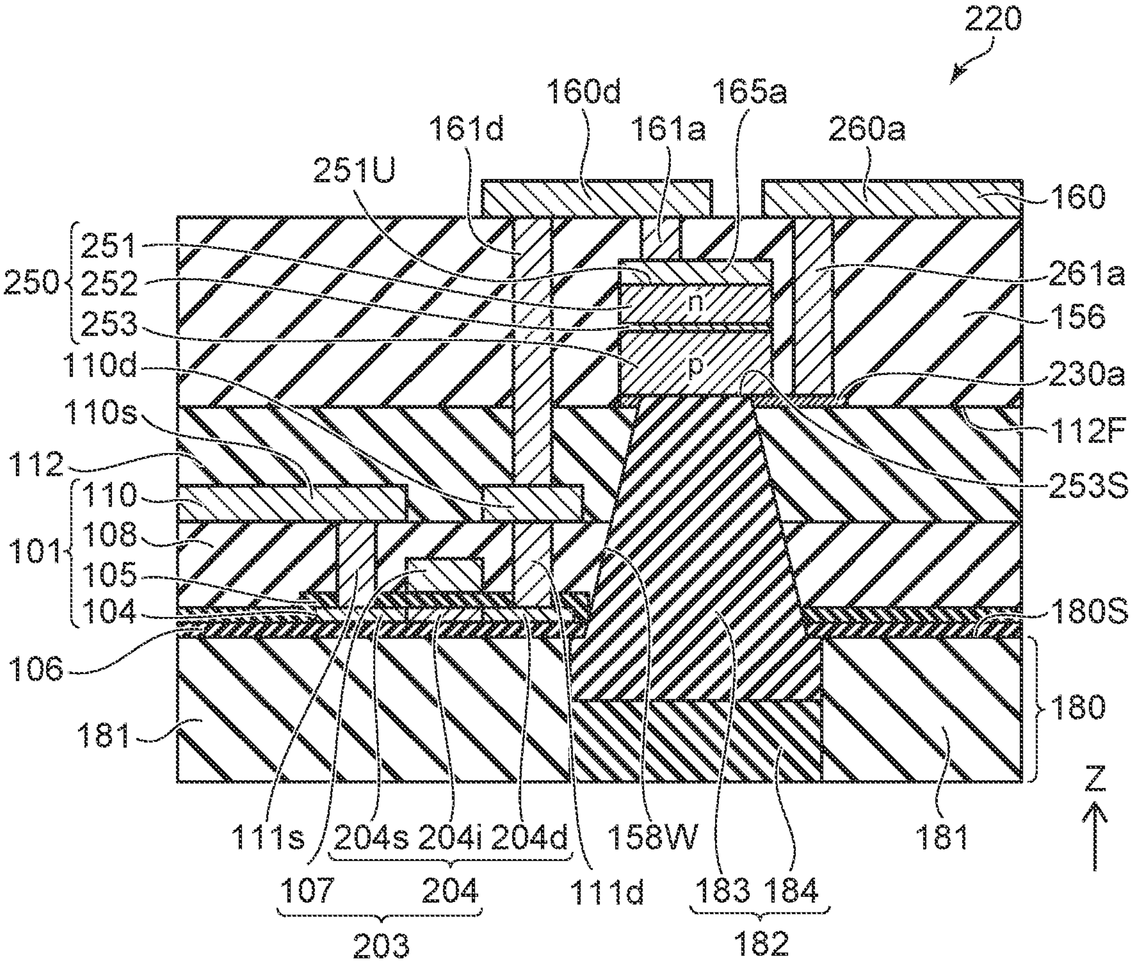
FIG. 18 is a schematic cross-sectional view illustrating a portion of an image display device according to a second embodiment.

FIG. 18 is a schematic cross-sectional view illustrating a portion of an image display device according to the embodiment.

According to the embodiment as shown in FIG. 18, the configurations of a light-emitting element 250 and a transistor 203 are different from those of the other embodiment described above. Specifically, a light-emitting surface 253S of the light-emitting element 250 is provided by a p-type semiconductor layer 253, and the transistor 203 has an n-channel. The embodiment also differs from the other embodiment described above in that the p-type semiconductor layer 253 and a via 261*a* are connected by a connection plate 230*a*. The same components as those of the other embodiment are marked with the same reference numerals, and a detailed description is omitted as appropriate.

The image display device of the embodiment includes a subpixel 220. The subpixel 220 includes the transistor 203, the first wiring layer 110, the first inter-layer insulating film 112, the light-emitting element 250, the second inter-layer insulating film 156, the via 161*d*, and the second wiring layer 160. The subpixel 220 further includes the color filter 180. The subpixel 220 further includes the light-reflective electrode 165*a*. The subpixel 220 further includes the connection plate 230*a*.

According to the embodiment, similarly to the other embodiment described above, the transistor 203 is located on the color filter 180. The light-emitting element 250 is located on the color conversion part 182 of the color filter 180. The configuration of the color filter 180 is the same as that of the other embodiment described above, and a detailed description is omitted.

The transistor 203 is located on the TFT underlying film 106. The transistor 203 is an n-channel TFT. The transistor 203 includes the TFT channel 204 and the gate 107. Similarly to the other embodiment described above, the transistor 203 is favorably formed by a LTPS process, etc. According to the embodiment, the circuit 101 includes the TFT channel 204, the insulating layer 105, the insulating film 108, the vias 111*s* and 111*d*, and the first wiring layer 110.

The TFT channel 204 includes regions 204*s*, 204*i*, and 204*d*. The regions 204*s*, 204*i*, and 204*d* are located on the TFT underlying film 106. The regions 204*s* and 204*d* are doped with an impurity such as phosphorus (P) or the like and activated to form n-type semiconductor regions. The region 204*s* has an ohmic connection with the via 111*s*. The region 204*d* has an ohmic connection with the via 111*d*.

The gate 107 is located on the TFT channel 204 with the insulating layer 105 interposed. The insulating layer 105 insulates the TFT channel 204 and the gate 107.

In the transistor 203, a channel is formed in the region 204*i* when a higher voltage than that of the region 204*s* is applied to the gate 107. The current that flows between the regions 204*s* and 204*d* is controlled by the voltage of the gate 107 with respect to the region 204*s*. The TFT channel 204 and the gate 107 are formed using materials and formation methods similar to those of the TFT channel 104 and the gate 107 according to the other embodiment described above.

The first wiring layer 110 includes the wiring parts 110*s* and 110*d*. For example, the wiring part 110*s* is connected to the ground line 4 shown in FIG. 19 below.

The vias 111*s* and 111*d* extend through the insulating film 108. The via 111*s* is located between the wiring part 110*s* and the region 204*s*. The via 111*s* electrically connects the wiring part 110*s* and the region 204*s*. The via 111*d* is located between the wiring part 110*d* and the region 204*d*. The via 111*d* electrically connects the wiring part 110*d* and the region 204*d*. The vias 111*s* and 111*d* are formed using materials and formation methods similar to those of the other embodiment described above.

The connection plate 230*a* is located on the planarized surface 112F, and the light-emitting surface 253S of the light-emitting element 250 is provided over the connection plate 230*a* and the color conversion part 182. One end of the via 261*a* is connected to the connection plate 230*a*.

The light-emitting element 250 radiates light via the color conversion part 182. The light-emitting element 250 includes a top surface 251U located at the side opposite to the light-emitting surface 253S. Similarly to the other embodiment described above, the light-emitting element 250 is a prismatic or cylindrical element.

The light-emitting element 250 includes the p-type semiconductor layer 253, a light-emitting layer 252, and an n-type semiconductor layer 251. The p-type semiconductor layer 253, the light-emitting layer 252, and the n-type semiconductor layer 251 are stacked in this order from the light-emitting surface 253S toward the top surface 251U. According to the embodiment, the light-emitting surface 253S is provided by the p-type semiconductor layer 253. The top surface 251U is the surface at the side opposite to the light-emitting surface 253S.

The light-emitting element 250 has a shape similar to that of the light-emitting element 150 of the other embodiment described above when projected onto the XY plane. An appropriate shape is selected according to the layout of the circuit elements, etc.

The light-emitting element 250 is a light-emitting diode similar to the light-emitting element 150 of the other embodiment described above.

The light-reflective electrode 165*a* is located on the top surface 251U of the light-emitting element 250. Similarly to the other embodiment described above, the electrode 165*a* reflects the upward-scattered light and the like toward the light-emitting surface 253S side and substantially improves the luminous efficiency of the light-emitting element 250.

The second wiring layer 160 is located on the second inter-layer insulating film 156. The second wiring layer 160 includes the wiring parts 160*d* and 260*a*. Similarly to the other embodiment described above, a portion of the wiring part 160*d* is located above the light-emitting element 250, and another portion is located above the wiring part 110*d*. A portion of the wiring part 260*a* is located above the connection plate 230*a*. For example, the wiring part 260*a* is connected to the power supply line 3 of the circuit of FIG. 19.

Similarly to the other embodiment described above, the via (the first via) 161*d* is included. Specifically, the via 161*d* extends through the second and first inter-layer insulating films 156 and 112 and reach the wiring part 110*d*. The via 161*d* is located between the wiring part (the first wiring part) 160*d* and the wiring part 110*d* and electrically connects the wiring part 160*d* and the wiring part 110*d*. Accordingly, the n-type semiconductor layer 251 is electrically connected to the drain region of the transistor 203 via the electrode 165*a*, the connection member 161*a*, the wiring part 160*d*, the via 161*d*, the wiring part 110*d*, and the via 111*d*.

The via (the second via) 261*a* extends through the second inter-layer insulating film 156 and reach the connection plate (the second connection part) 230*a*. The via 261*a* is located between the wiring part (the second wiring part) 260*a* and the connection plate 230*a* and electrically connects the wiring part 260*a* and the connection plate 230*a*. Accordingly, for example, the p-type semiconductor layer 253 is electrically connected to the power supply line 3 of the circuit of FIG. 19 via the connection plate 230*a*, the via 261*a*, and the wiring part 260*a*.

Figure 19:
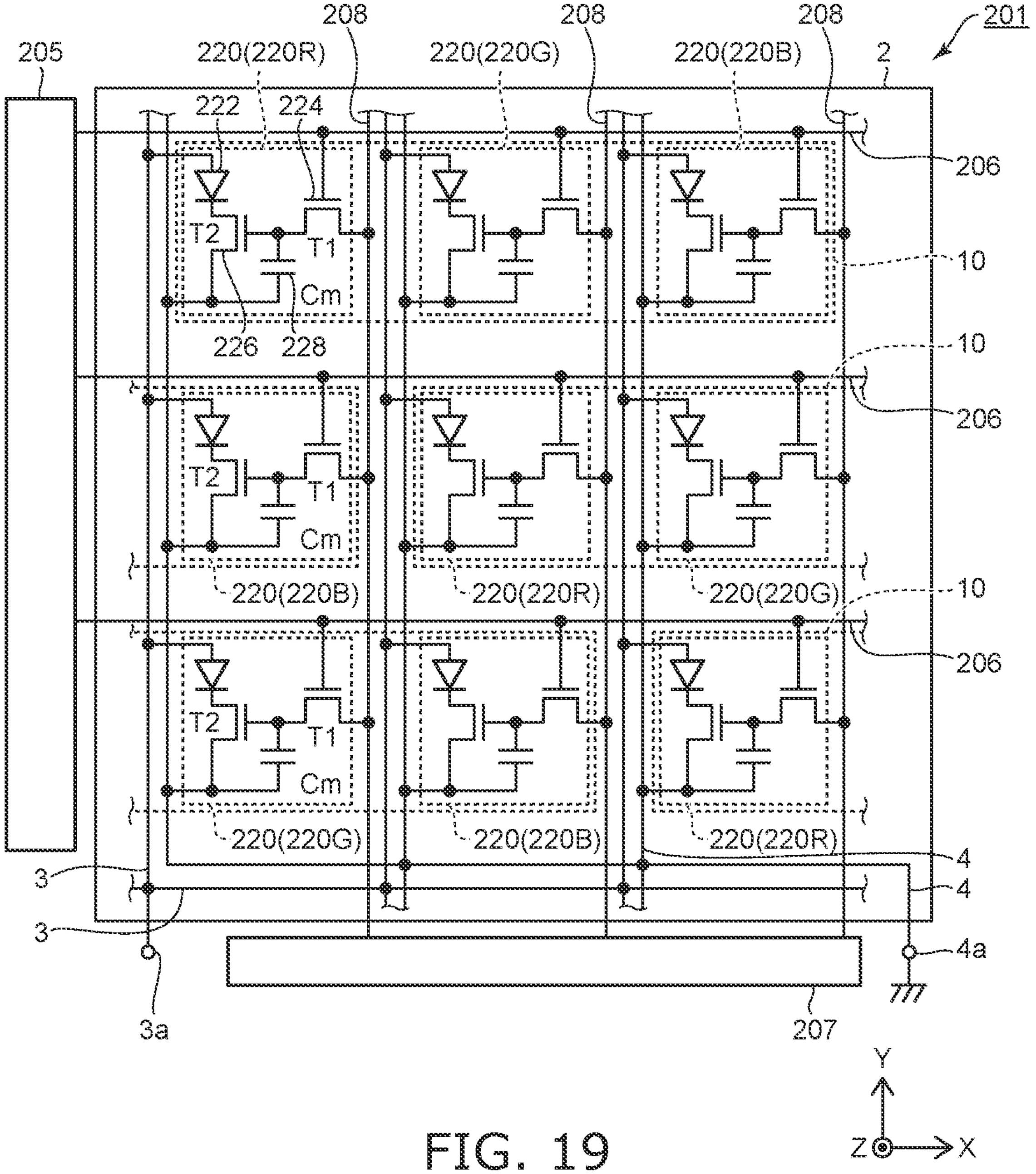
FIG. 19 is a schematic block diagram illustrating the image display device of the second embodiment.

FIG. 19 is a schematic block diagram illustrating the image display device of the embodiment.

As shown in FIG. 19, the image display device 201 of the embodiment includes the display region 2, a row selection circuit 205, and a signal voltage output circuit 207. In the display region 2, similarly to the other embodiment described above, for example, the subpixels 220 are arranged in a lattice shape in the XY plane.

Similarly to the other embodiment described above, the pixel 10 includes the multiple subpixels 220 that emit light of different colors. A subpixel 220R emits red light. A subpixel 220G emits green light. A subpixel 220B emits blue light. The light emission color and luminance of one pixel 10 are determined by the three types of the subpixels 220R, 220G, and 220B emitting light of the desired luminances.

One pixel 10 includes three subpixels 220R, 220G, and 220B, and, for example, the subpixels 220R, 220G, and 220B are arranged in a straight line along the X-axis as in the example. In the pixels 10, subpixels of the same color may be arranged in the same column, or subpixels of different colors may be arranged in each column as in the example.

The subpixel 220 includes a light-emitting element 222, a select transistor 224, a drive transistor 226, and a capacitor 228. In FIG. 19, the select transistor 224 may be displayed as T1, the drive transistor 226 may be displayed as T2, and the capacitor 228 may be displayed as Cm.

According to the embodiment, the light-emitting element 222 is located at the power supply line 3 side, and the drive transistor 226 that is connected in series to the light-emitting element 222 is located at the ground line 4 side. That is, the drive transistor 226 is connected to a lower potential side than the light-emitting element 222. The drive transistor 226 is an n-channel transistor.

The select transistor 224 is connected between a signal line 208 and the gate electrode of the drive transistor 226. The capacitor 228 is connected between the power supply line 3 and the gate electrode of the drive transistor 226.

To drive the drive transistor 226 that is an n-channel transistor, the row selection circuit 205 and the signal voltage output circuit 207 supply, to the signal line 208, a signal voltage that has a different polarity from that of the other embodiment described above.

According to the embodiment, because the polarity of the drive transistor 226 is an n-channel, the polarity of the signal voltage and the like are different from those of the other embodiment described above. Specifically, the row selection circuit 205 supplies a select signal to a scanning line 206 to sequentially select one row from the arrangement of the m rows of subpixels 220. The signal voltage output circuit 207 supplies a signal voltage having an analog voltage value necessary for the subpixels 220 of the selected row. The drive transistors 226 of the subpixels 220 of the selected row allow currents corresponding to the signal voltage to flow in the light-emitting elements 222. The light-emitting elements 222 emit light of luminances corresponding to the currents that flow.

A manufacturing method of the embodiment will now be described.

FIGS. 20A to 23 are schematic cross-sectional views illustrating a portion of the method for manufacturing the image display device of the embodiment.

The substrate 102 according to the other embodiment described above with reference to FIG. 7A is used according to the embodiment. In FIG. 7A, the Si layer 1104 is formed on the one surface 102*a* of the substrate 102. In the following description, the process of FIG. 20A and subsequent processes are applied after the process of FIG. 7A.

Figure 20A:
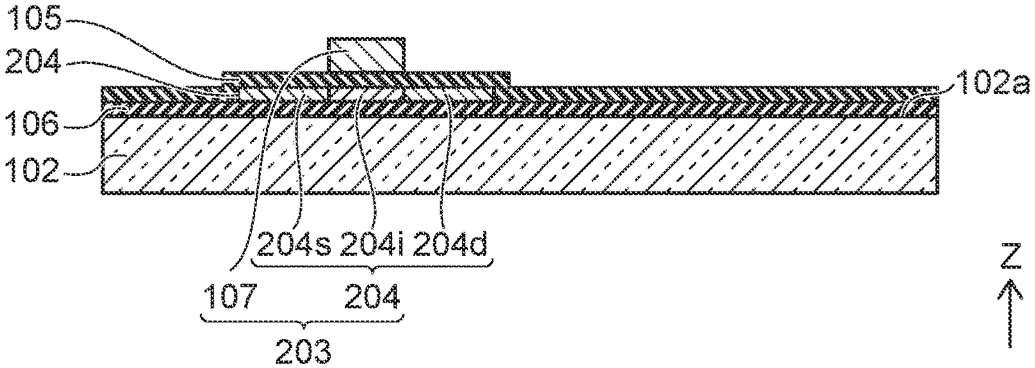
FIG. 20A is a schematic cross-sectional view illustrating a portion of a method for manufacturing the image display device of the second embodiment.

As shown in FIG. 20A, the polycrystallized Si layer 1104 shown in FIG. 7A is patterned into an island configuration to form the TFT channel 204. The insulating layer 105 is formed to cover the TFT underlying film 106 and the TFT channel 204. The insulating layer 105 functions as a gate insulating film. The gate 107 is formed on the TFT channel 204 with the insulating layer 105 interposed. The gate 107 is selectively doped with an impurity such as P or the like and thermally activated to form the transistor (the circuit element) 203. The regions 204*s* and 204*d* are used as n-type active regions and function respectively as the source region and drain region of the transistor 203. The region 204*i* is used as the p-type active region and function as a channel.

Figure 20B:
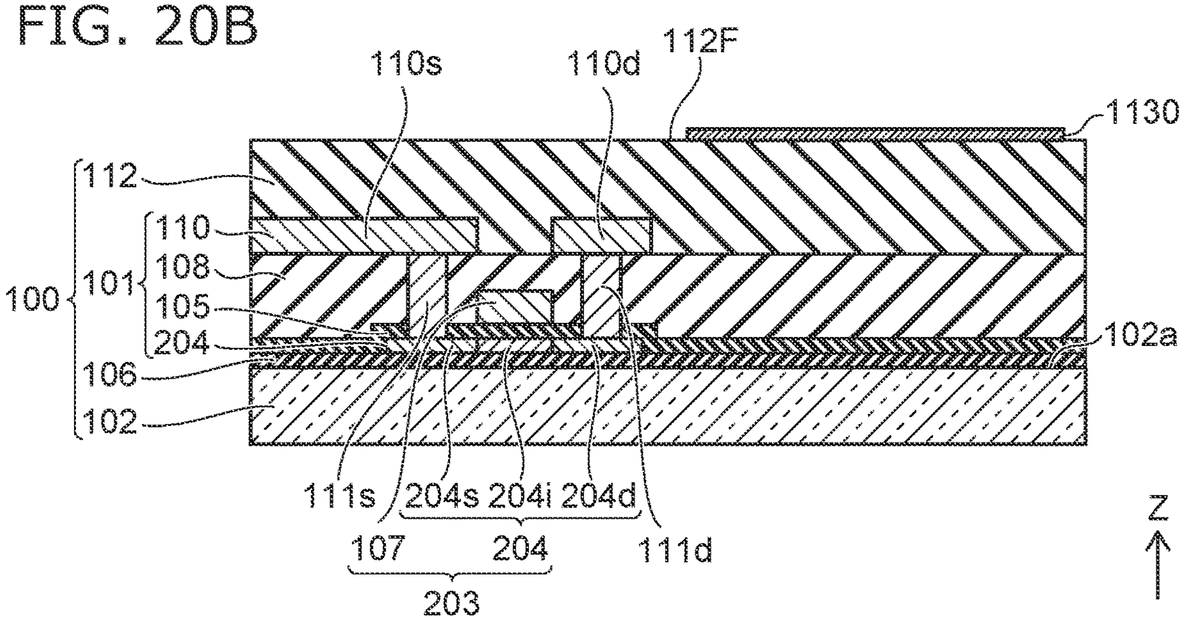
FIG. 20B is a schematic cross-sectional view illustrating a portion of the method for manufacturing the image display device of the second embodiment.

As shown in FIG. 20B, the insulating film 108 is formed to cover the insulating layer 105 and the transistor 203. The vias 111*s* and 111*d* that extend through the insulating film 108 and the insulating layer 105 are formed. The first wiring layer 110 that includes the wiring parts 110*s* and 110*d* is formed on the insulating film 108. The wiring part 110*s* is connected to the via 111*s*, and the wiring part 110*d* is connected to the via 111*d*. Thus, the drive circuit substrate (the first substrate) 100 is formed.

The first inter-layer insulating film 112 is formed to cover the insulating film 108 and the first wiring layer 110. The metal layer 1130 is formed at a prescribed position on the planarized surface 112F.

Figure 21A:
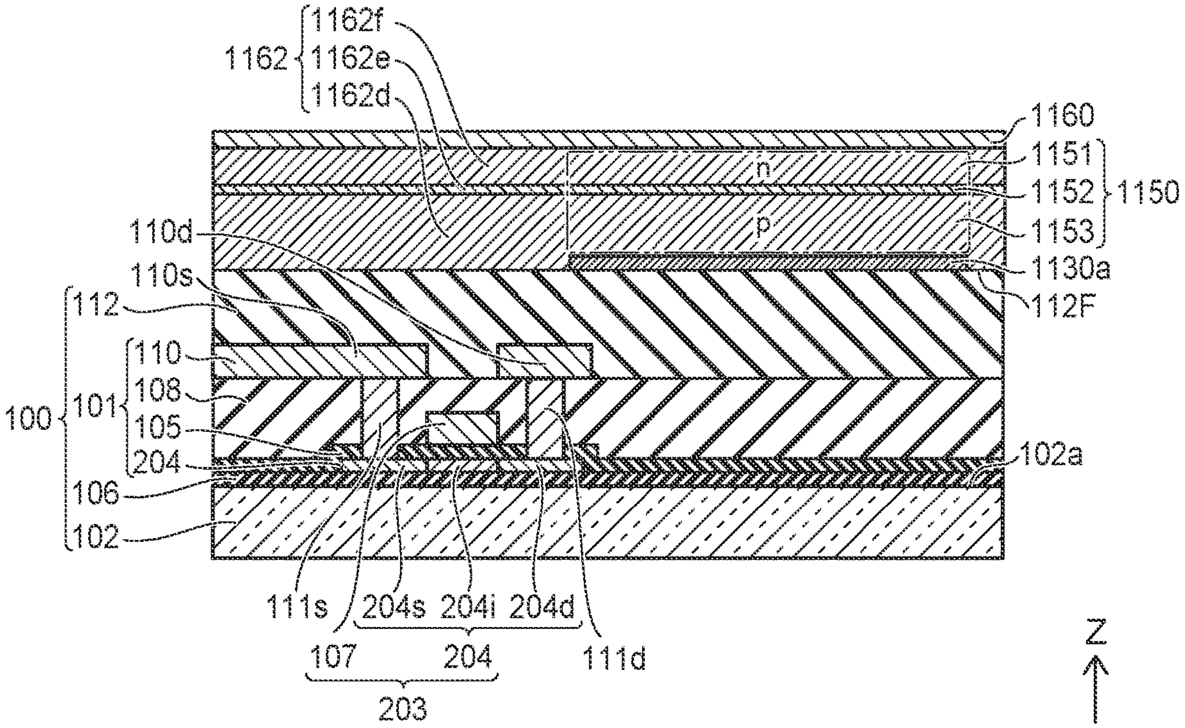
FIG. 21A is a schematic cross-sectional view illustrating a portion of the method for manufacturing the image display device of the second embodiment.

As shown in FIG. 21A, the metal layer 1130 shown in FIG. 20B is monocrystallized by laser annealing, etc., to form the metal seed layer 1130*a*. The semiconductor layer 1150 is formed over the monocrystallized metal seed layer 1130*a*. The semiconductor layer 1150 is formed in the order of the p-type semiconductor layer 1153, the light-emitting layer 1152, and the n-type semiconductor layer 1151 from the metal seed layer 1130*a* in the positive direction of the Z-axis.

The semiconductor layer 1150 is formed over the metal seed layer 1130*a* inside the double dot-dash line of FIG. 21A. Similarly to the other embodiment described above, there are cases where the amorphous deposit 1162 that includes materials of the growth species such as Ga is deposited on the planarized surface 112F at which the metal seed layer 1130*a* does not exist. In the example, the deposit 1162 is stacked in the order of deposits 1162*d*, 1162*e*, and 1162*f* from the planarized surface 112F in the positive direction of the Z-axis. The deposit 1162*d* is deposited when forming the p-type semiconductor layer 1153, the deposit 1162*e* is deposited when forming the light-emitting layer 1152, and the deposit 1162*f* is deposited when forming the n-type semiconductor layer 1151; however, the configuration is not limited thereto.

The metal layer 1160 is formed on the semiconductor layer 1150. In the example, the metal layer 1160 also is formed on the deposit 1162. More specifically, the metal layer 1160 is formed on the n-type semiconductor layer 1151 and on the deposit 1162*f*.

Figure 21B:
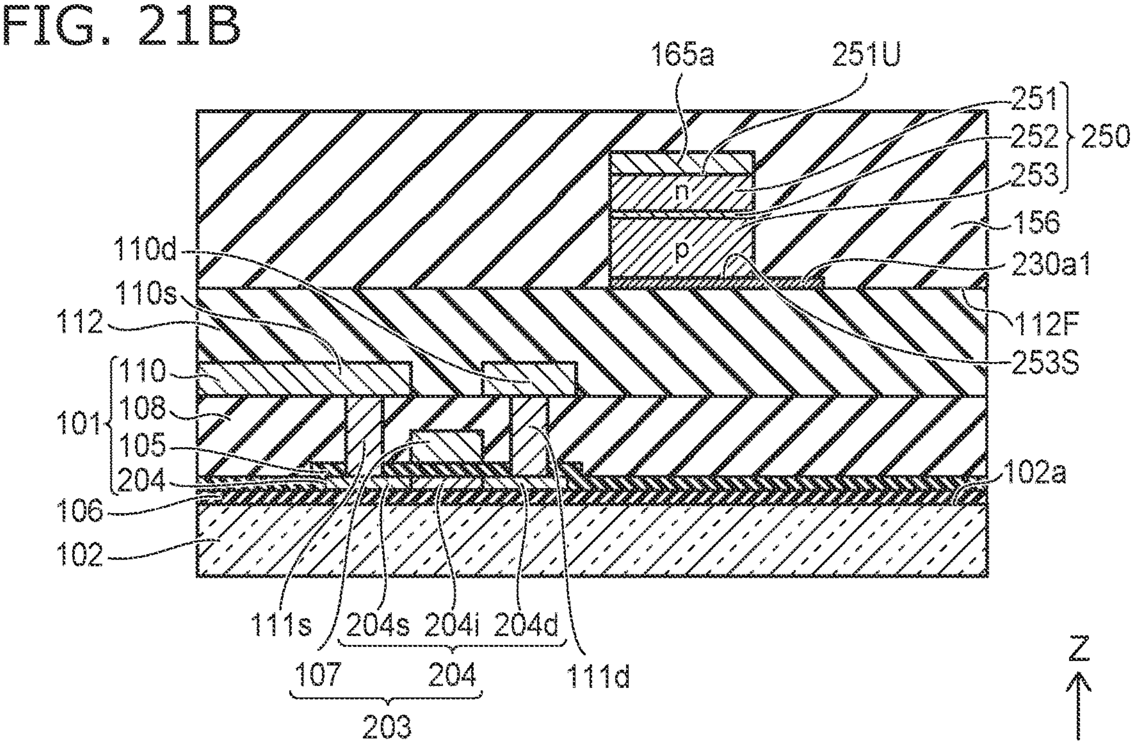
FIG. 21B is a schematic cross-sectional view illustrating a portion of the method for manufacturing the image display device of the second embodiment.

As shown in FIG. 21B, the electrode 165*a*, the light-emitting element 250, and a connection plate 230*a*1 are formed. The electrode 165*a* is formed similarly to that of the other embodiment described above. The connection plate (the first part) 230*a*1 is formed by etching the metal seed layer 1130*a* shown in FIG. 21A. The light-emitting element 250 is formed after forming the connection plate 230*al*.

In the formation process of the connection plate 230*a*1, the connection plate 230*a*1 is formed to protrude in one direction from the light-emitting element 250 on the planarized surface 112F. When projected onto the XY plane, the outer perimeter of the connection plate 230*a*1 is set to include the outer perimeter of the light-emitting element 250 when the light-emitting element 250 is projected onto the connection plate 230*a*1. That is, the outer perimeter of the light-emitting element 250 is located within the outer perimeter of the connection plate 230*a*1 when projected onto the XY plane. The protruding part of the connection plate 230*a*1 is formed to ensure the region at which one end of the via 261*a* shown in FIG. 22A below is connected.

The connection plate 230*a*1 is patterned into the connection plate 230*a* shown in FIG. 18 in a subsequent process. Because the p-type semiconductor layer 253 of the light-emitting element 250 is connected to the via 261*a* by the connection plate 230*a* shown in FIG. 18, the light-emitting element 250 is shaped to be a single prism or have a circular columnar shape without forming a connection part such as that of the other embodiment described above.

The second inter-layer insulating film 156 is formed after forming the electrode 165*a*, the light-emitting element 250, and the connection plate 230*a*1. The second inter-layer insulating film 156 is formed to cover the planarized surface 112F, the connection plate 230*a*1, the light-emitting element 250, and the electrode 165*a*.

Figure 22A:
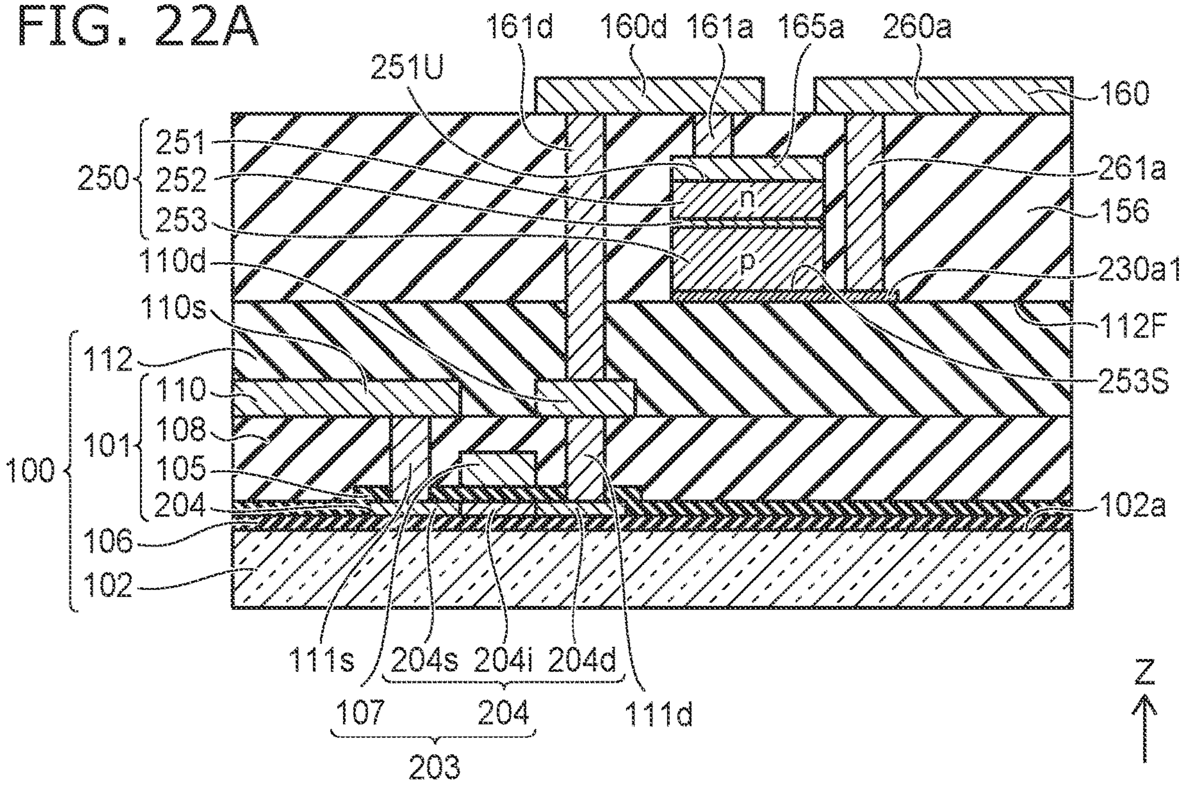
FIG. 22A is a schematic cross-sectional view illustrating a portion of the method for manufacturing the image display device of the second embodiment.

As shown in FIG. 22A, a via hole that is formed to extend through the second inter-layer insulating film 156 and reach the connection plate 230*a*1 is filled with a conductive material to form the via (the second via) 261*a*. The connection plate 230*al* is patterned into the connection plate (the second connection part) 230*a* shown in FIG. 23 below in a subsequent process. The via 161*d* and the connection member 161*a* are formed similarly to those of the other embodiment described above. Specifically, a via hole that is formed to extend through the second and first inter-layer insulating films 156 and 112 and reach the wiring part 110*d* is filled with a conductive material to form the via 161*d*. A contact hole that is formed to reach the electrode 165*a* is filled with a conductive material to form the connection member 161*a*. For example, similarly to the other embodiment described above, RIE or the like is used to form the via holes and the contact holes.

Subsequently, the second wiring layer 160 is formed on the second inter-layer insulating film 156, the wiring part 160*d* is connected to the via 161*d* and the connection member 161*a*, and the wiring part 260*a* is connected to the via 261*a*.

Figure 22B:
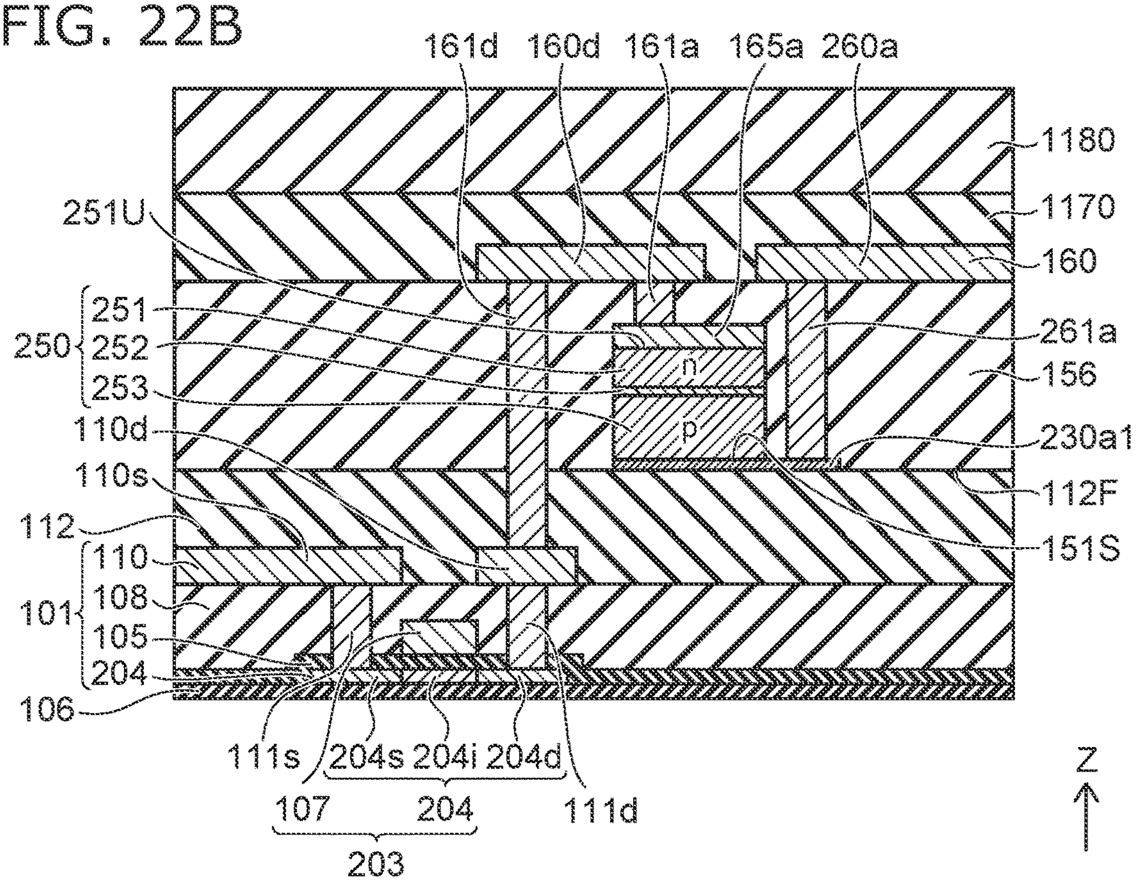
FIG. 22B is a schematic cross-sectional view illustrating a portion of the method for manufacturing the image display device of the second embodiment.

As shown in FIG. 22B, the adhesive layer 1170 is formed on the second inter-layer insulating film 156 and the second wiring layer 160, and the reinforcing substrate 1180 is bonded via the adhesive layer 1170. Subsequently, the substrate 102 is removed by wet etching, etc.

Figure 23:
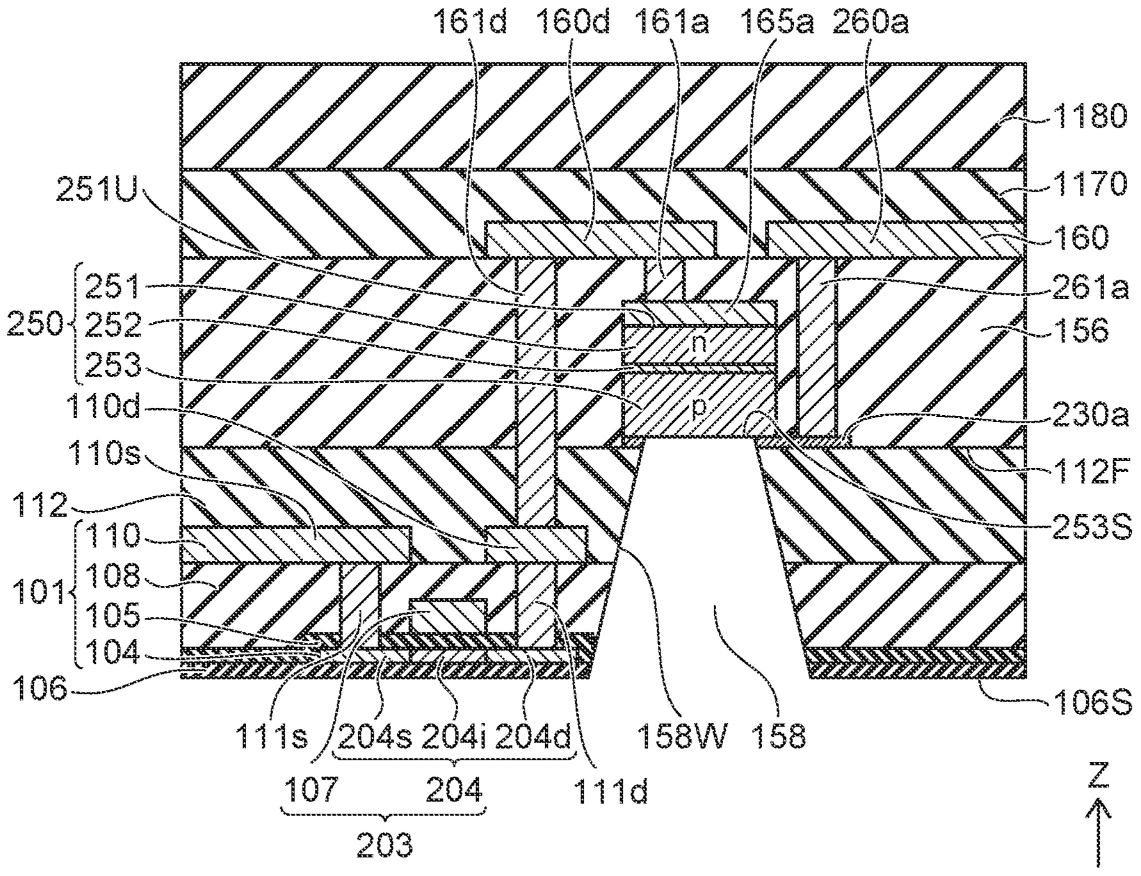
FIG. 23 is a schematic cross-sectional view illustrating a portion of the method for manufacturing the image display device of the second embodiment.

As shown in FIG. 23, the opening 158 is formed from the TFT underlying film 106 side toward the light-emitting surface 253S by wet etching, etc. The opening 158 is formed to extend through the TFT underlying film 106, the insulating layer 105, the insulating film 108, the first inter-layer insulating film 112, the second inter-layer insulating film 156, and the connection plate 230*a*1 shown in FIG. 22B and reach the light-emitting surface 253S. The connection plate (the first part) 230*a*1 is shaped into the connection plate 230*a* by being etched when forming the opening 158.

Subsequently, a color filter is formed similarly to the other embodiment described above, and the subpixel 220 is formed.

Effects of the image display device of the embodiment will now be described.

Similarly to the other embodiment described above, the image display device of the embodiment has the effects of reducing the time of the transfer process for forming the light-emitting element 250 and reducing the number of processes. Also, the light-emitting surface 253S can be the p-type semiconductor layer 253 by setting the polarity of the TFT to be a p-channel. This is advantageous in that the degree of freedom of the circuit element arrangement and circuit design is increased, etc.

According to the embodiment, the connection plate 230*a* can be formed of a metal material and can have a high conductivity. Therefore, the p-type semiconductor layer 253 at the light-emitting surface 253S side can be connected to the via 261*a* with a low resistance.

Third Embodiment

Figure 24:
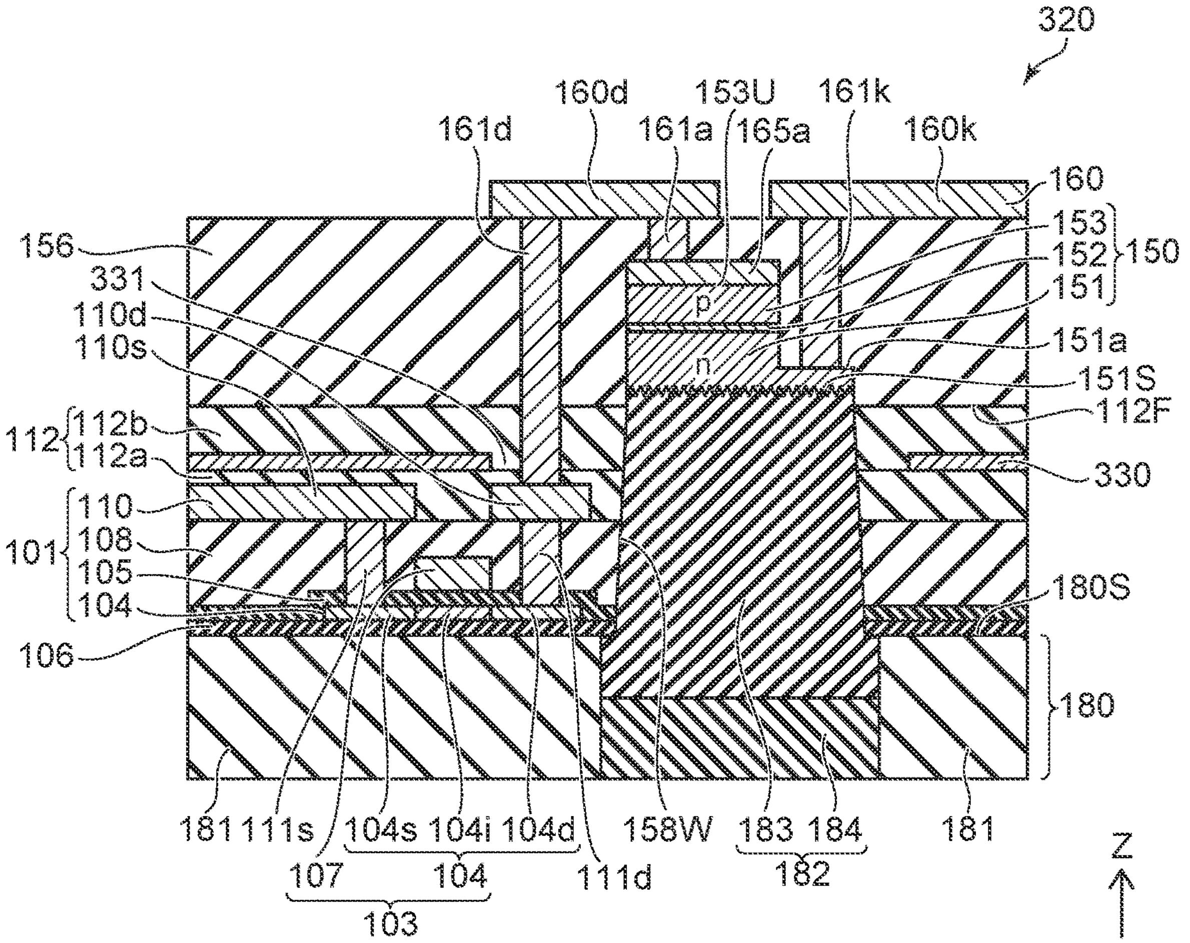
FIG. 24 is a schematic cross-sectional view illustrating a portion of an image display device according to a third embodiment.

FIG. 24 is a schematic cross-sectional view illustrating a portion of an image display device according to the embodiment.

The embodiment differs from the other embodiments described above in that a light-shielding layer 330 is located between the light-emitting element 150 and the transistor 103. The light-emitting element 150 of the embodiment also differs from that of the other embodiment described above in that the light-emitting surface 151S is roughened. The same components as those of the other embodiments described above are marked with the same reference numerals, and a detailed description is omitted as appropriate.

As shown in FIG. 24, a subpixel 320 of the image display device includes the transistor 103, the first wiring layer 110, the first inter-layer insulating film 112, the light-emitting element 150, the second inter-layer insulating film 156, the via 161*d*, and the second wiring layer 160. The subpixel 320 further includes the color filter 180. The subpixel 320 further includes the light-reflective electrode 165*a*. The subpixel 320 further includes the light-shielding layer 330.

According to the embodiment, the first inter-layer insulating film 112 includes two insulating films 112*a* and 112*b*. The insulating films 112*a* and 112*b* are formed of the same material and form the first inter-layer insulating film 112. The insulating film 112*a* is located on the insulating film 108 and the first wiring layer 110. The light-shielding layer 330 is located on the insulating film 112*a*. The insulating film 112*b* is located on the light-shielding layer 330. That is, the light-shielding layer 330 is located between the insulating films 112*a* and 112*b*. The light-shielding layer 330 is located between the first inter-layer insulating film 112 and the second inter-layer insulating film 156 over all but a portion of the entire surface.

According to the embodiment, the color conversion part 182 of the color filter 180 extends through the insulating film 112*b*, the light-shielding layer 330, the insulating film 112*a*, the insulating film 108, the insulating layer 105, and the TFT underlying film 106. Therefore, the light-shielding layer 330 includes a through-hole 331 having a larger diameter than the color conversion part 182 when projected onto the XY plane. In the example, the via 161*d* is located proximate to the color conversion part 182, and so the through-hole 331 has a diameter large enough for the via 161*d* to pass.

For example, the light-shielding layer 330 is formed of a light-reflective metal material, but may not be conductive as long as the material is light-shielding. The light-shielding layer 330 may be formed of a black resin. When the light-shielding layer 330 is formed of a black resin, the black resin can be collectively patterned together with the insulating films 112*a* and 112*b* when forming the opening for the color conversion part 182 without pre-forming a through-hole having a sufficiently large diameter.

According to the embodiment, when projected onto the XY plane, the light-shielding layer 330 is set to substantially include the outer perimeter of the transistor 103 when the transistor 103 is projected onto the light-shielding layer 330. That is, the outer perimeter of the transistor 103 is substantially located within the outer perimeter of the light-shielding layer 330 when projected onto the XY plane. Therefore, the scattered light and the like of the light-emitting element 150 can be shielded, and malfunction due to light of the transistor 103 can be prevented.

The light-emitting element 150 is located on the color conversion part 182 of the color filter 180. The light-emitting surface 151S is roughened, and is located on the color conversion layer 183 in the example.

A method for manufacturing the image display device of the embodiment will now be described.

FIGS. 25A to 28B are schematic cross-sectional views illustrating a portion of the method for manufacturing the image display device of the embodiment.

According to the method for manufacturing the image display device of the embodiment, the same manufacturing processes as the processes of preparing the drive circuit substrate 100 shown in FIG. 8A up to the formation of the first wiring layer 110 are applied. The processes after forming the first wiring layer 110 in FIG. 8A will be described in the manufacturing method of the embodiment.

Figure 25A:
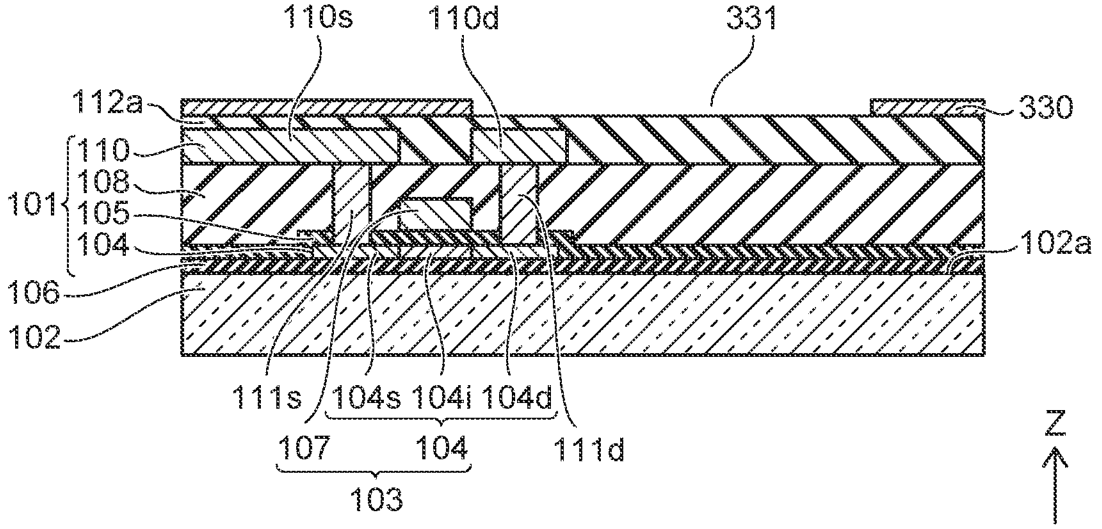
FIG. 25A is a schematic cross-sectional view illustrating a portion of a method for manufacturing the image display device of the third embodiment.

As shown in FIG. 25A, the insulating film 112*a* is formed on the insulating film 108 and the first wiring layer 110. The light-shielding layer 330 that includes the through-hole 331 is formed on the insulating film 112*a*.

Figure 25B:
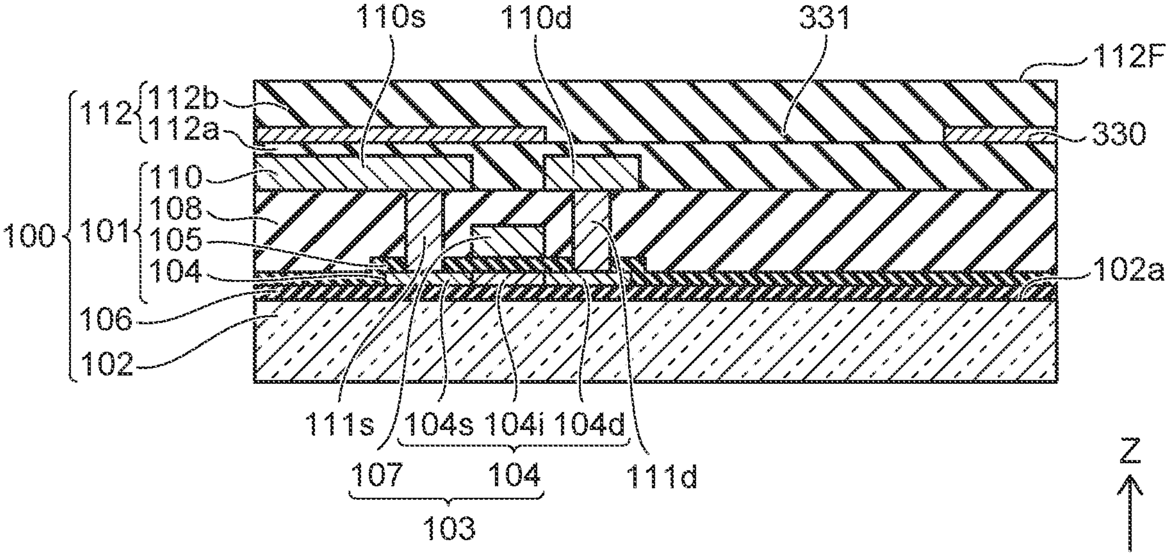
FIG. 25B is a schematic cross-sectional view illustrating a portion of the method for manufacturing the image display device of the third embodiment.

As shown in FIG. 25B, the insulating film 112*b* is formed on the insulating film 112*a* and the light-shielding layer 330. The insulating film 112*b* also is formed inside the through-hole 331. The surface of the insulating film 112*b* is planarized to form the planarized surface 112F. Thus, the drive circuit substrate (the first substrate) 100 that includes the light-shielding layer 330 is formed.

Figure 26A:
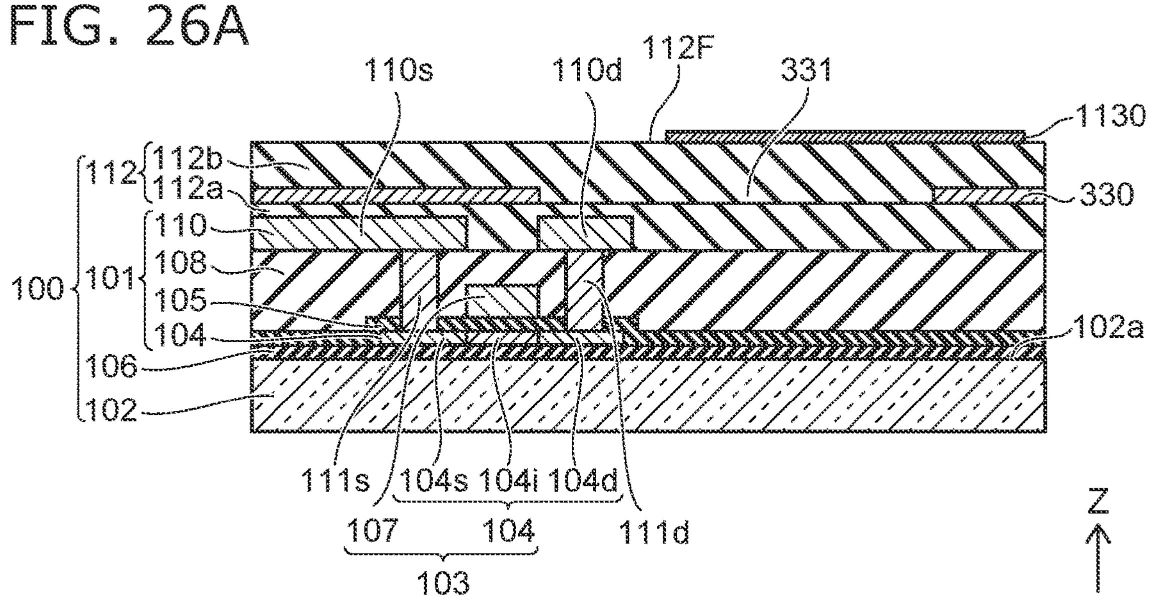
FIG. 26A is a schematic cross-sectional view illustrating a portion of the method for manufacturing the image display device of the third embodiment.

As shown in FIG. 26A, the metal layer 1130 is formed at a prescribed position on the planarized surface 112F.

Figure 26B:
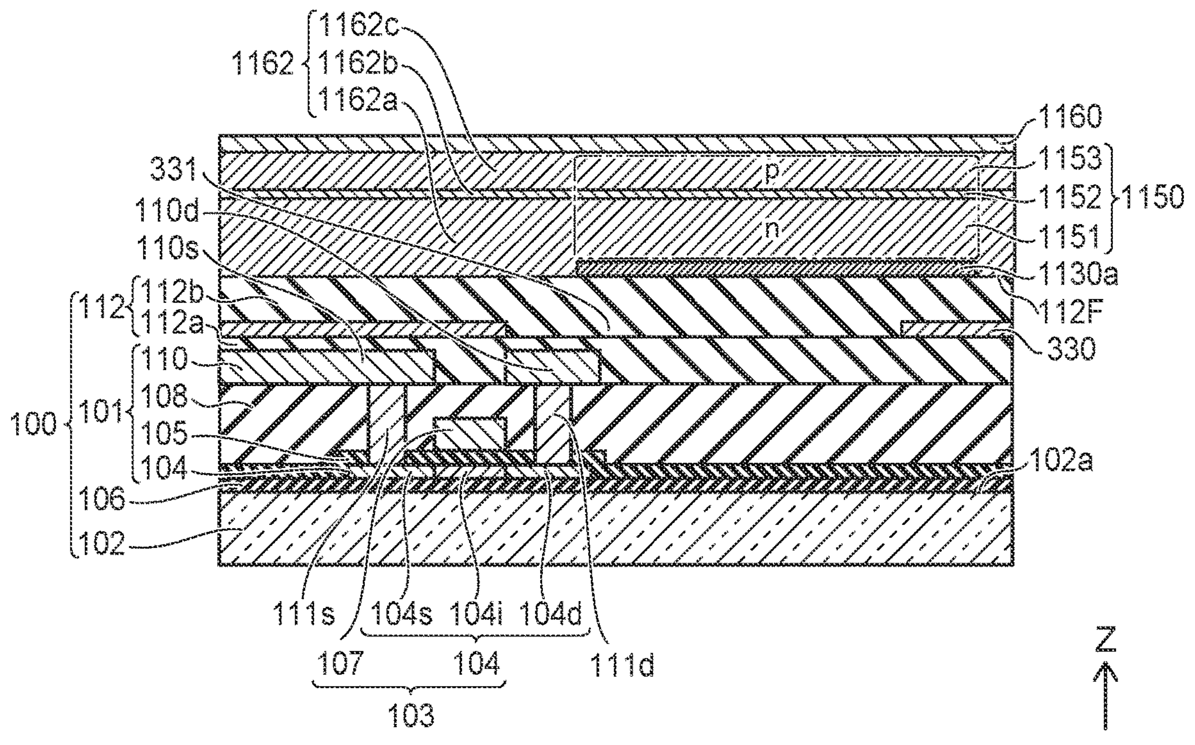
FIG. 26B is a schematic cross-sectional view illustrating a portion of the method for manufacturing the image display device of the third embodiment.

As shown in FIG. 26B, the metal layer 1130 shown in FIG. 26A is monocrystallized to form the metal seed layer 1130*a*. The semiconductor layer 1150 is formed over the metal seed layer 1130*a*. The formation process of the semiconductor layer 1150 and the technology to be applied are similar to those of the example described with reference to FIG. 10A.

Figure 27A:
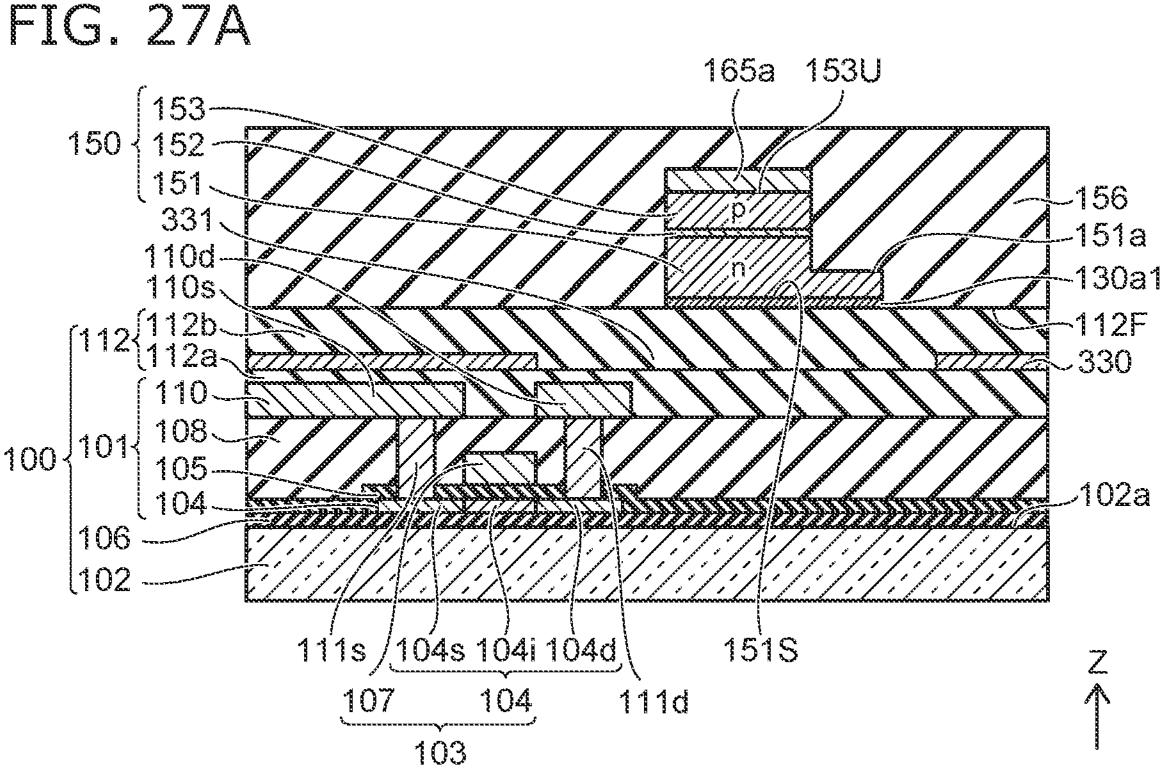
FIG. 27A is a schematic cross-sectional view illustrating a portion of the method for manufacturing the image display device of the third embodiment.

As shown in FIG. 27A, the electrode 165*a*, the light-emitting element 150, and the seed plate 130*a*1 are formed. Technologies and procedures similar to those of the other embodiments described above are applied to form these components. The second inter-layer insulating film 156 is formed to cover the electrode 165*a*, the light-emitting element 150, the seed plate 130*a*1, and the planarized surface 112F.

Figure 27B:
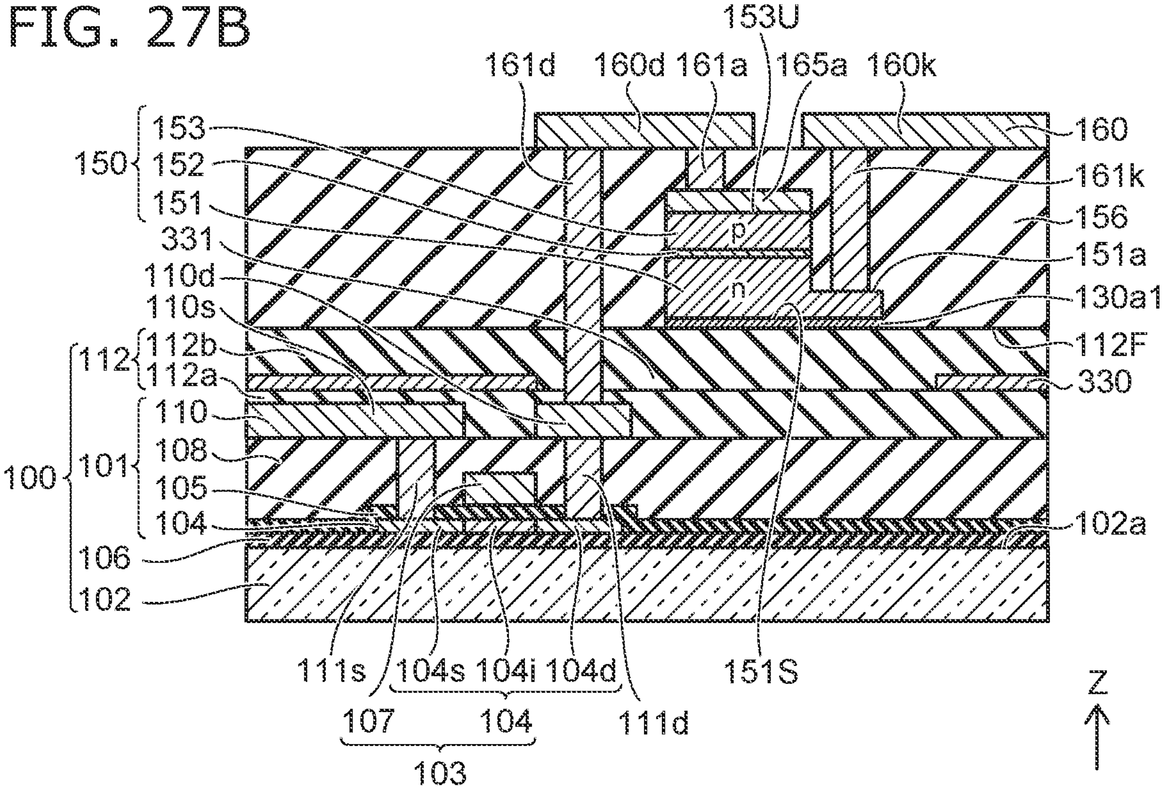
FIG. 27B is a schematic cross-sectional view illustrating a portion of the method for manufacturing the image display device of the third embodiment.

As shown in FIG. 27B, the via 161*d* that extends through the second and first inter-layer insulating films 156 and 112 is formed. The via 161*k* that extends through the second inter-layer insulating film 156 is formed. A contact hole that is formed in the second inter-layer insulating film 156 is filled with a conductive material to form the connection member 161*a*. The second wiring layer 160 is formed on the second inter-layer insulating film 156, the wiring part 160*d* is connected to the via 161*d* and the connection member 161*a*, and the wiring part 160*k* is connected to the via 161*k*. Technologies and procedures similar to those of the other embodiments described above also are applied to these processes.

Figure 28A:
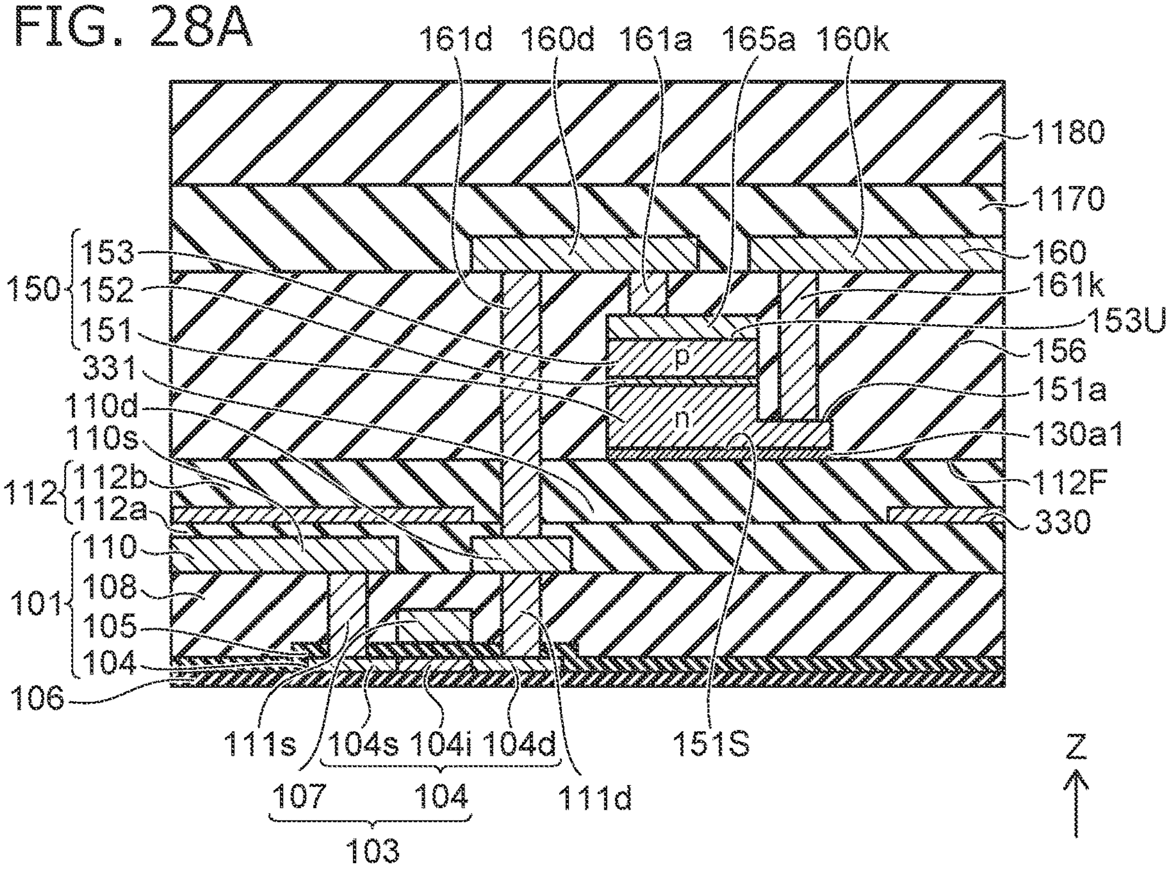
FIG. 28A is a schematic cross-sectional view illustrating a portion of the method for manufacturing the image display device of the third embodiment.

As shown in FIG. 28A, the adhesive layer 1170 is formed over the second inter-layer insulating film 156 and the second wiring layer 160, and the reinforcing substrate 1180 is bonded via the adhesive layer 1170. Subsequently, the surface 106S of the TFT underlying film 106 is exposed by removing the substrate 102 by wet etching, etc.

Figure 28B:
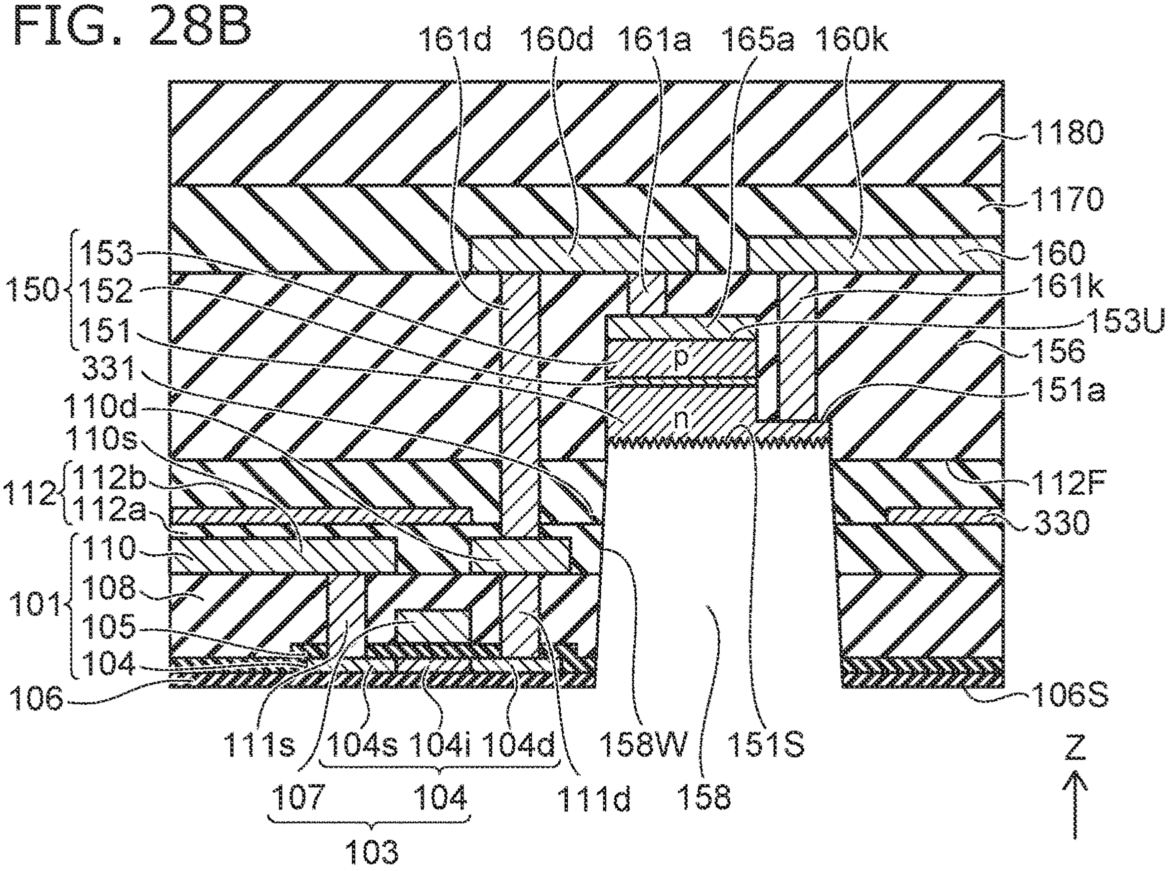
FIG. 28B is a schematic cross-sectional view illustrating a portion of the method for manufacturing the image display device of the third embodiment.

As shown in FIG. 28B, the opening 158 is formed from the surface 106S toward the light-emitting surface 151S. The opening 158 is formed to extend through the TFT underlying film 106, the insulating layer 105, the insulating film 108, the light-shielding layer 330, and the first inter-layer insulating film 112 and reach the light-emitting surface 151S. According to the embodiment, the entire seed plate 130*a*1 shown in FIG. 28A is removed when forming the opening 158. Technologies and procedures similar to those of the other embodiments described above are applicable to the formation process of the opening 158.

The light-emitting surface 151S that is exposed by forming the opening 158 is roughened by wet etching, etc. Subsequently, the processes described with reference to FIGS. 13A to 13D are applied, a color filter is formed, and the subpixel 320 is formed.

Effects of the image display device of the embodiment will now be described.

The method for manufacturing the image display device of the embodiment has the effects of reducing the time of the transfer process for forming the light-emitting element 150 and reducing the number of processes similarly to the other embodiments described above, but also uses the n-type semiconductor layer 151 having a lower resistance than the p-type as the light-emitting surface 151S; therefore, the n-type semiconductor layer 151 can be formed to be thick, and the light-emitting surface 151S can be sufficiently roughened.

In the image display device of the embodiment, the radiated light is diffused because the light-emitting surface 151S is roughened, and so even a small light-emitting element 150 can be used as a light source having a sufficient light emission area.

In the image display device of the embodiment, the light-shielding layer 330 is located between the insulating films 112*a* and 112*b*. That is, the light-shielding layer 330 is located between the light-emitting element 150 and the transistor 103. Therefore, even when the light-emitting element 150 radiates light, the radiated light, scattered light, and the like does not easily reach the TFT channel 104, and malfunction of the transistor 103 can be prevented.

The light-shielding layer 330 can be formed of a conductive material such as a metal, etc., and the light-shielding layer 330 can be connected to any potential. For example, the light-shielding layer 330 can assist noise suppression by providing a portion of the light-shielding layer 330 directly under a switching element such as the transistor 103, etc., and by connecting to a ground potential, a power supply potential, etc.

When the light-shielding layer 330 is formed of an insulating material such as a black resin, etc., the formation of the via 161*d* described with reference to FIG. 27B and the formation of the opening 158 described with reference to FIG. 28B can be performed sequentially by etching, etc., without pre-forming the through-hole 331. Therefore, malfunction of the transistor 103, etc., can be prevented more reliably because the formation process of the through-hole 331 can be omitted, and a gap due to the through-hole 331 that may pass light can be prevented.

The application of the light-shielding layer 330 is not limited to the embodiment; the light-shielding layer 330 is applicable commonly to the subpixels of the other embodiments described above and the other embodiments described below. Effects similar to those described above can be obtained when applying to the other embodiments as well.

The configuration and method for manufacturing a light-emitting element including a roughened light-emitting surface are described in the example above. The process of roughening the light-emitting surface of the light-emitting element is applicable to any of the embodiments or their modifications described above as well. For example, applications are possible to the light-emitting element 150 of the first embodiment and the light-emitting element 250 of the second embodiment. Applications also are possible to a light-emitting element 550 of the fifth embodiment and a semiconductor layer 650 of the sixth embodiment described below. Thus, the effects described above can be provided by roughening the light-emitting surface of a component of the light-emitting element.

Fourth Embodiment

Figure 29:
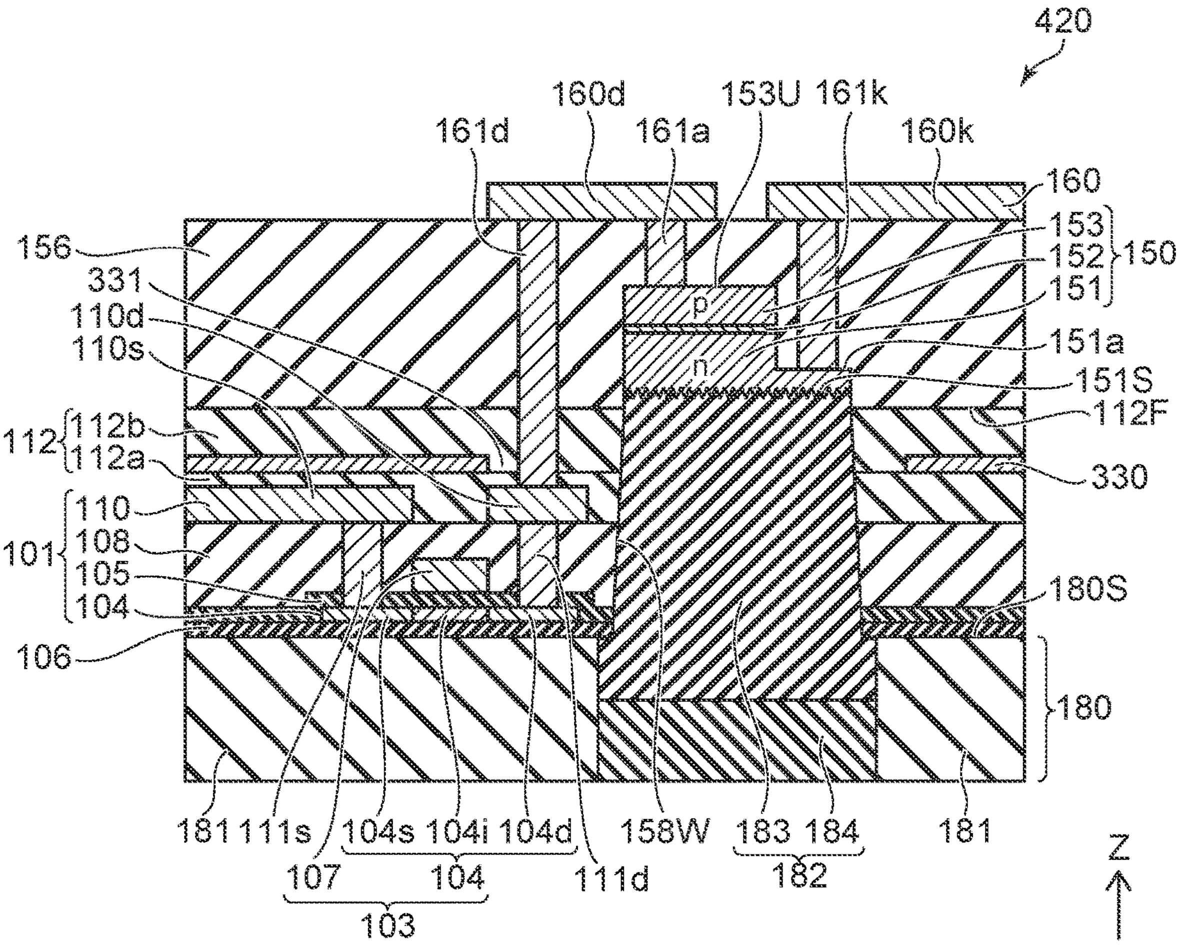
FIG. 29 is a schematic cross-sectional view illustrating a portion of a method for manufacturing an image display device of a fourth embodiment.

FIG. 29 is a schematic cross-sectional view illustrating a portion of an image display device of the embodiment.

The embodiment differs from the third embodiment in that the electrode 165*a* shown in FIG. 24 is not included, but otherwise is the same as the third embodiment. The same components as those of the other embodiments described above are marked with the same reference numerals, and a detailed description is omitted as appropriate.

As shown in FIG. 29, the image display device of the embodiment includes a subpixel 420. The subpixel 420 includes the transistor 103, the first wiring layer 110, the first inter-layer insulating film 112, the light-emitting element 150, the second inter-layer insulating film 156, the via 161*d*, and the second wiring layer 160. The subpixel 420 further includes the color filter 180. The subpixel 420 further includes the light-shielding layer 330.

According to the embodiment, an electrode is not located on the top surface 153U of the light-emitting element 150. Therefore, the connection member 161*a* is located between the wiring part 160*d* and the top surface 153U and electrically connects the wiring part 160*d* and the top surface 153U.

The light-shielding layer 330 is located between the second inter-layer insulating film 156 and the insulating film 108 and is formed similarly to that of the third embodiment. In other words, the light-shielding layer 330 is provided to cover the TFT channel 104; more specifically, when projected onto the XY plane, the light-shielding layer 330 is set to include the entire outer perimeter of the TFT channel 104 when the TFT channel 104 is projected onto the light-shielding layer 330. That is, the outer perimeter of the TFT channel 104 is located within the outer perimeter of the light-shielding layer 330 when projected onto the XY plane. Therefore, the scattered light that is radiated upward from the light-emitting element 150 is shielded by the light-shielding layer 330, and malfunction of the transistor 103 including the TFT channel 104 due to light is prevented.

A method for manufacturing the image display device of the embodiment will now be described.

FIGS. 30A to 31B are schematic cross-sectional views illustrating a portion of the method for manufacturing the image display device of the embodiment.

In the example, the processes up to the process described with reference to FIG. 26A of the third embodiment are applied similarly to the third embodiment. In the following description, the process of FIG. 30A and subsequent processes are applied after the process of FIG. 26A.

Figure 30A:
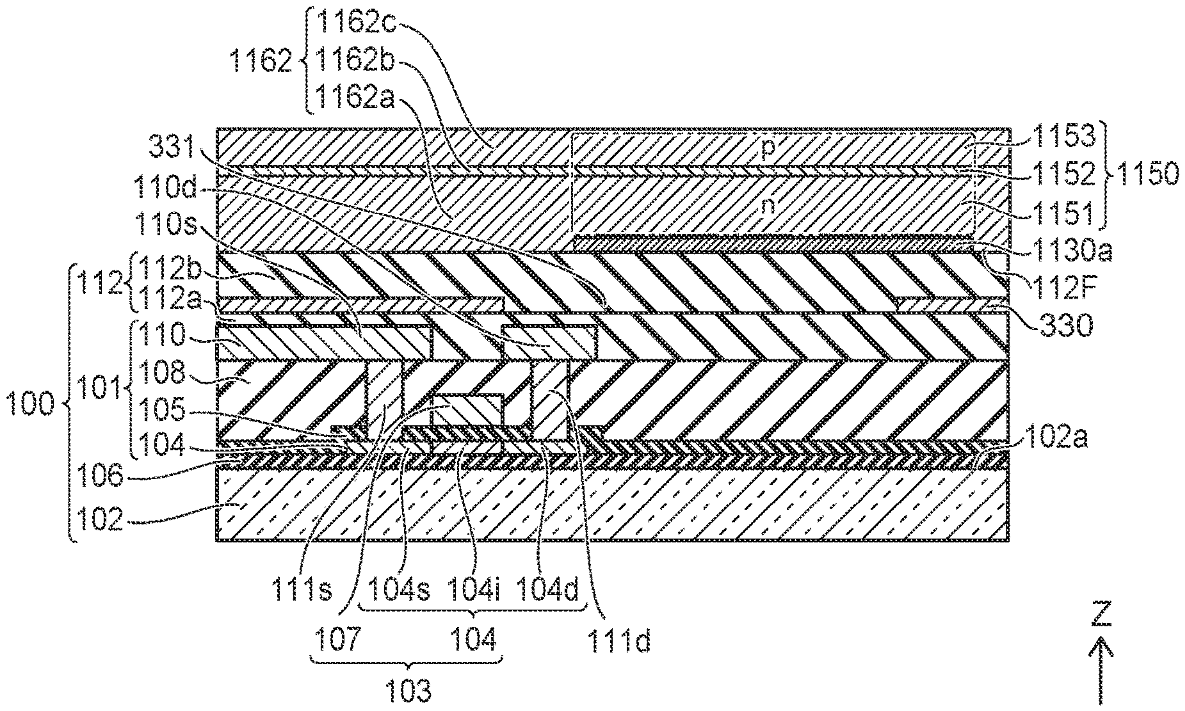
FIG. 30A is a schematic cross-sectional view illustrating a portion of the method for manufacturing the image display device of the fourth embodiment.

As shown in FIG. 30A, the semiconductor layer 1150 is formed over the monocrystallized metal seed layer 1130*a*. The semiconductor layer 1150 includes the n-type semiconductor layer 1151, the light-emitting layer 1152, and the p-type semiconductor layer 1153 formed in this order from the metal seed layer 1130*a* in the positive direction of the Z-axis. Similarly to the other embodiments described above, the deposit 1162 may be formed on the planarized surface 112F at which the metal seed layer 1130*a* is not formed.

Figure 30B:
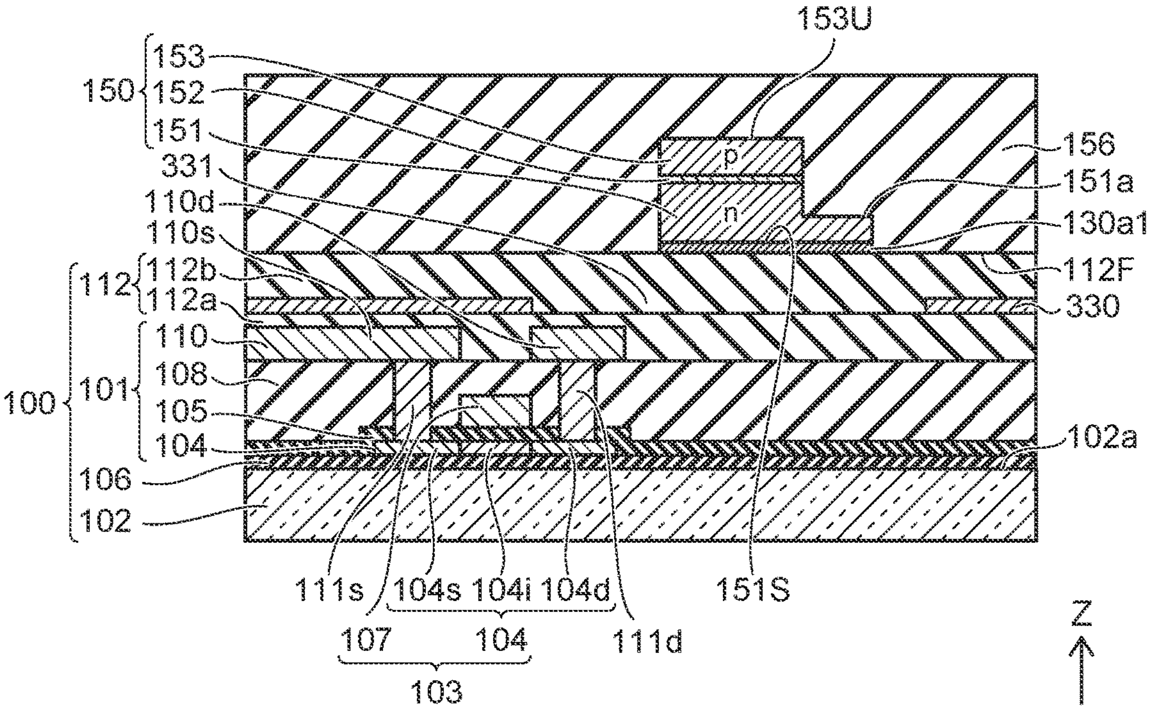
FIG. 30B is a schematic cross-sectional view illustrating a portion of the method for manufacturing the image display device of the fourth embodiment.

As shown in FIG. 30B, the metal seed layer 1130*a* shown in FIG. 30A is patterned by etching to form the seed plate 130*a*1. The semiconductor layer 1150 shown in FIG. 30A is patterned by etching to form the light-emitting element 150. In the formation process of the light-emitting element 150, similarly to the other embodiments described above, the other parts are formed after forming the connection part 151*a*. The second inter-layer insulating film 156 is formed to cover the planarized surface 112F, the seed plate 130*a*1, and the light-emitting element.

Figure 31A:
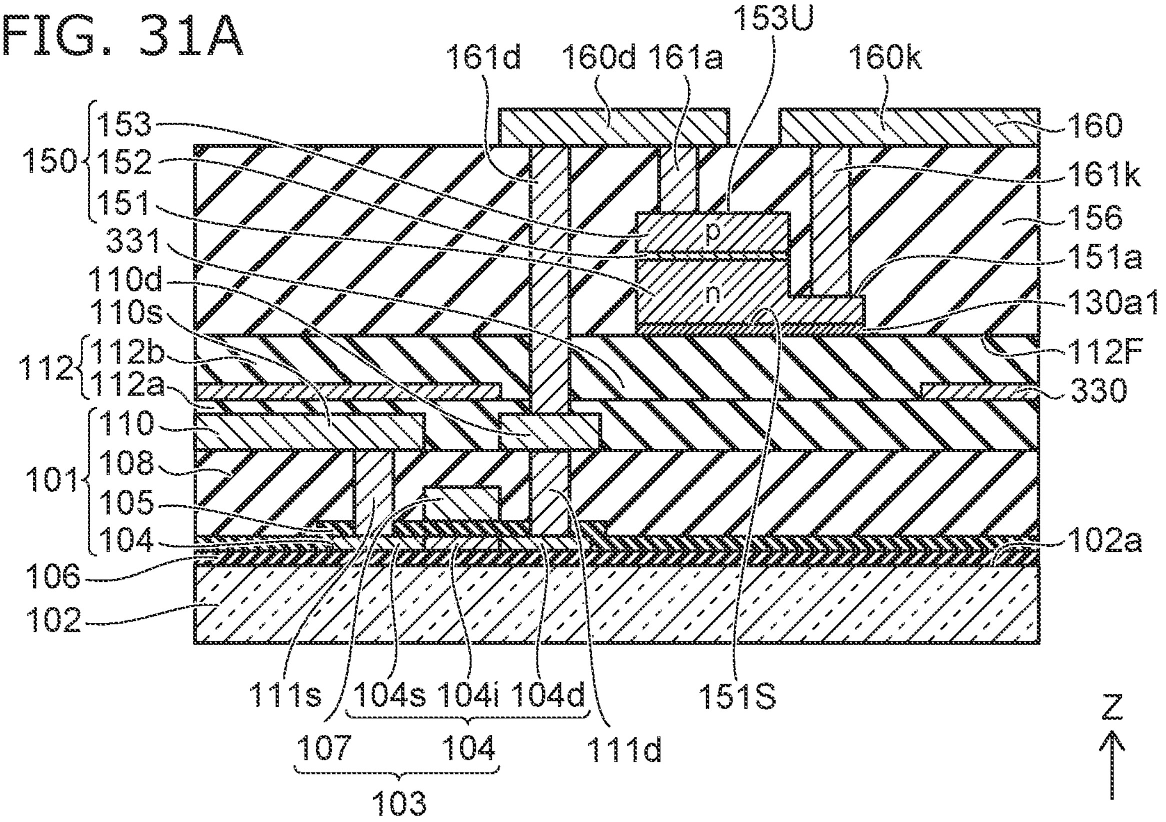
FIG. 31A is a schematic cross-sectional view illustrating a portion of the method for manufacturing the image display device of the fourth embodiment.

As shown in FIG. 31A, similarly to the third embodiment, the vias 161*d* and 161*k* and the connection member 161*a* are formed and connected with the second wiring layer 160.

Figure 31B:
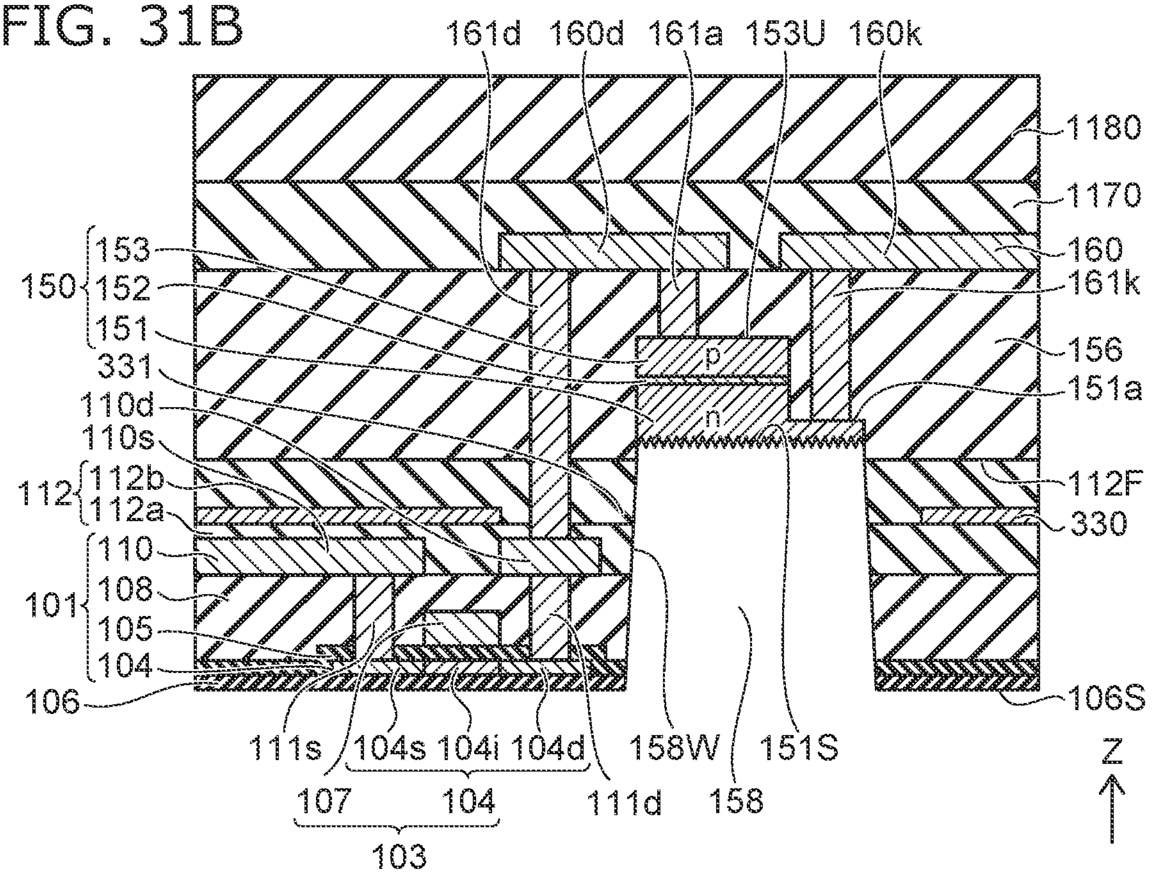
FIG. 31B is a schematic cross-sectional view illustrating a portion of the method for manufacturing the image display device of the fourth embodiment.

As shown in FIG. 31B, the reinforcing substrate 1180 is bonded via the adhesive layer 1170, and the substrate 102 shown in FIG. 31A is removed. After forming the opening 158 and roughening the light-emitting surface 151S, a color filter is formed, and the subpixel 420 is formed.

Effects of the image display device of the embodiment will now be described.

The image display device of the embodiment has the effects of reducing the time of the transfer process for forming the light-emitting element 150 and reducing the number of processes similarly to the other embodiments described above. Also, according to the embodiment, the formation process of the electrode can be omitted because an electrode is not formed at the top surface 153U of the light-emitting element 150.

Fifth Embodiment

Figure 32:
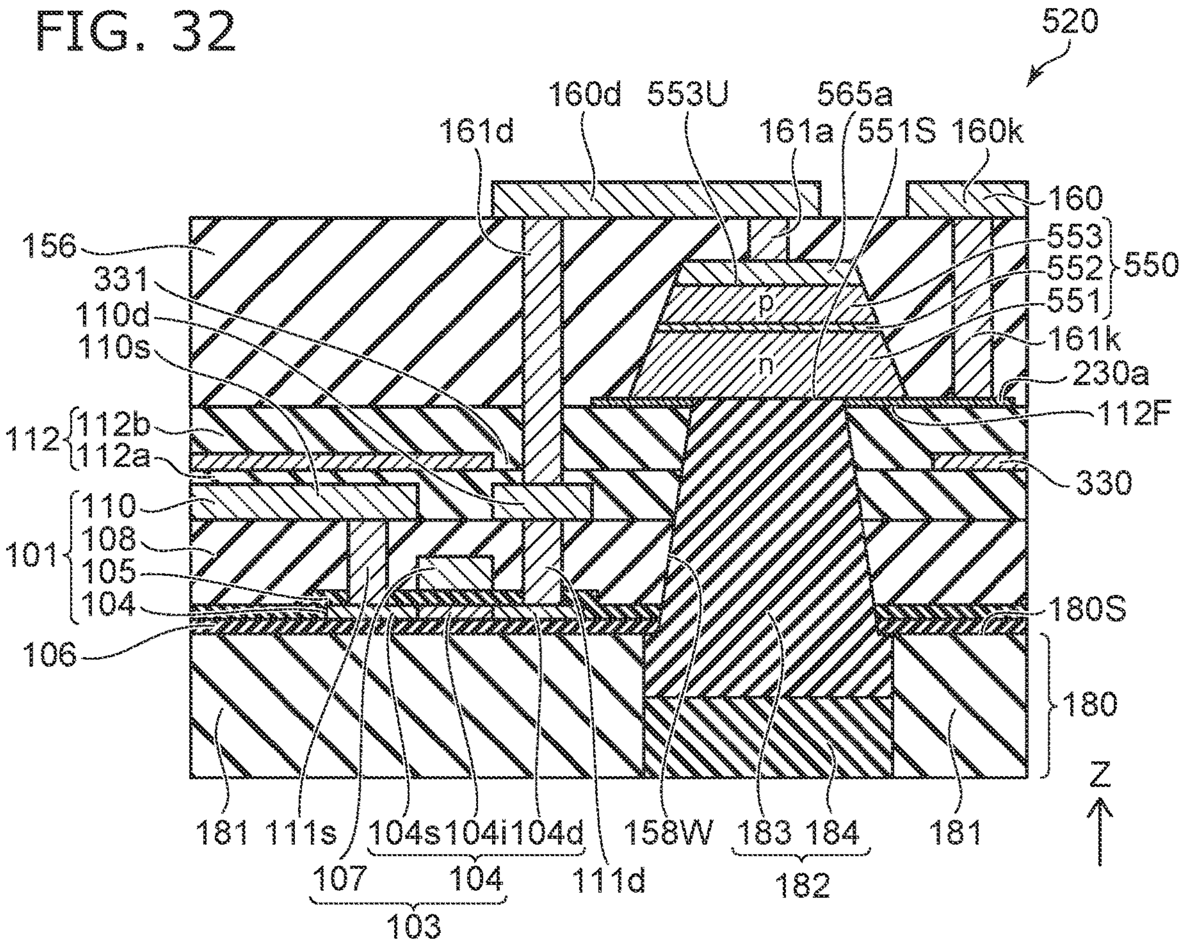
FIG. 32 is a schematic cross-sectional view illustrating a portion of an image display device according to a fifth embodiment.

FIG. 32 is a schematic cross-sectional view illustrating a portion of an image display device of the embodiment.

The configuration of the light-emitting element 550 of the embodiment is different from that of the other embodiments. The other components are the same as those of the other embodiments described above. The same components are marked with the same reference numerals, and a detailed description is omitted as appropriate.

As shown in FIG. 32, the image display device includes a subpixel 520. The subpixel 520 includes the transistor 103, the first wiring layer 110, the first inter-layer insulating film 112, the light-emitting element 150, the second inter-layer insulating film 156, the via 161*d*, and the second wiring layer 160. The subpixel 520 further includes the color filter 180. The subpixel 520 further includes a light-reflective electrode 565*a*. The subpixel 520 further includes the light-shielding layer 330. The subpixel 520 further includes the connection plate 230*a*.

The light-emitting element 550 is located on the color conversion part 182. A light-emitting surface 551S of the light-emitting element 550 is provided over the connection plate 230*a* and the color conversion part 182. The light-emitting element 550 radiates light in the negative direction of the Z-axis via the color conversion part 182.

The light-emitting element 550 is a pyramid frustum-shaped or circular frustum-shaped element formed so that the area when projected onto the XY plane decreases in the positive direction of the Z-axis.

Figure 33:
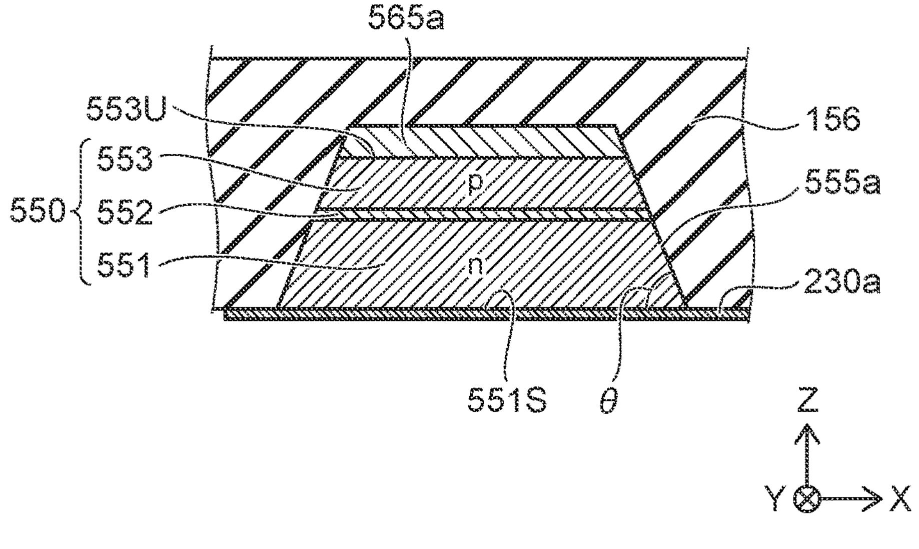
FIG. 33 is a schematic cross-sectional view illustrating a portion of the image display device according to the fifth embodiment.

FIG. 33 is an enlarged view of a portion of the light-emitting element 550 of FIG. 32 and shows the relationship between the light-emitting surface 551S and a side surface 555*a*.

As shown in FIG. 33, the light-emitting surface 551S is a plane that is substantially parallel to the XY plane. The color conversion layer 183 shown in FIG. 32 contacts the light-emitting surface 551S, and the light that is radiated by the light-emitting element 550 directly enters the color conversion layer 183.

The light-emitting element 550 includes the side surface 555*a*. The side surface 555*a* is a surface between a top surface 553U and the planarized surface 112F and is adjacent to the light-emitting surface 551S. An interior angle θ between the side surface 555*a* and the light-emitting surface 551S is less than 90°. The interior angle θ is favorably about 70°. The interior angle θ is more favorably less than the critical angle of the side surface 555*a* determined based on the refractive index of the light-emitting element 550 and the refractive index of the second inter-layer insulating film 156. The light-emitting element 550 is covered with the second inter-layer insulating film 156, and the side surface 555*a* contacts the second inter-layer insulating film 156.

For example, a critical angle θc of the interior angle θ between the side surface 555*a* and the light-emitting surface 551S of the light-emitting element 550 is determined as follows.

The critical angle θc of the light emitted from the light-emitting element 550 into the second inter-layer insulating film 156 is determined using the following Formula (1) for a refractive index n0 of the light-emitting element 550 and a refractive index n1 of the second inter-layer insulating film 156.

$$\theta c = 90° - \sin^{-1}(n1/n0) \quad (1)$$

For example, it is known that the refractive index of a general transparent organic insulating material such as an acrylic resin or the like is about 1.4 to 1.5. Therefore, when the light-emitting element 550 is formed of GaN and the second inter-layer insulating film 156 is formed of a general transparent organic insulating material, it follows that the refractive index n0 of the light-emitting element 550 equals 2.5, and the refractive index n1 of the second inter-layer insulating film 156 equals 1.4. Substituting these values in Formula (1) gives critical angle θc=56°.

This indicates that when the interior angle θ between the light-emitting surface 551S and the side surface 555*a* is set to θc=56°, the light radiated from a light-emitting layer 552 that is parallel to the light-emitting surface 551S is totally reflected at the side surface 555*a*. This also indicates that the light radiated from the light-emitting layer 552 that has a component in the positive direction of the Z-axis also is totally reflected at the side surface 555*a*.

On the other hand, the light radiated from the light-emitting layer 552 that has a component in the negative direction of the Z-axis is emitted from the side surface 555*a* at an emergence angle corresponding to the refractive index at the side surface 555*a*. The light that is incident on the second inter-layer insulating film 156 is emitted from the second inter-layer insulating film 156 at an angle determined by the refractive index of the second inter-layer insulating film 156.

The light that is totally reflected at the side surface 555*a* is re-reflected by the electrode 565*a*, and the re-reflected light that has a component in the negative direction of the Z-axis is emitted from the light-emitting surface 551S and the side surface 555*a*. The light that is parallel to the light-emitting surface 551S and the light that has a component in the positive direction of the Z-axis are totally reflected at the side surface 555*a*.

Thus, the light radiated from the light-emitting layer 552 that is parallel to the light-emitting surface 551S or has a component in the positive direction of the Z-axis is converted into light having a component in the negative direction of the Z-axis by the side surface 555*a* and the electrode 565*a*. Accordingly, the ratio of the light from the light-emitting element 550 that is emitted toward the light-emitting surface 551S is increased, and the substantial luminous efficiency of the light-emitting element 550 is improved.

By setting θ<θc, substantially all of the light having a component parallel to the light-emitting surface 551S can be totally reflected inside the light-emitting element 550. Because the critical angle θc is about 560 when the refractive index of the second inter-layer insulating film 156 is set to n=1.4, it is more favorable to set the interior angle θ to be 45°, 30°, etc. The critical angle θc decreases as the refractive index n of the material increases. However, even if the interior angle θ is set to about 70°, substantially all of the light having a component in the negative direction of the Z-axis can be converted into light having a component in the positive direction of the Z-axis; therefore, considering the manufacturing fluctuation, etc., for example, the interior angle θ may be set to be not more than 80°, etc.

A method for manufacturing the image display device of the embodiment will now be described.

The manufacturing processes of the light-emitting element 550 and the electrode 565*a* according to the embodiment are different from those of the other embodiments; otherwise, the manufacturing processes of the other embodiments described above are applicable. The different portions of the manufacturing processes will now be described.

According to the embodiment, the following processes are performed to form the shape of the light-emitting element 550 shown in FIG. 32.

After the metal layer 1160 is formed, the semiconductor layer 1150 shown in FIG. 26B is patterned by etching into the shape of the light-emitting element 550 shown in FIG. 32. The etching is continuously performed from the metal layer 1160 to the semiconductor layer 1150. To shape the electrode 565*a* and the light-emitting element 550, the etching rate is selected so that the side surface 555*a* shown in FIG. 33 has the interior angle θ with respect to the light-emitting surface 551S. For example, the etching is selected so that the etching rate is higher proximate to the top surface 553U. It is favorable to set the etching rate to linearly increase from the light-emitting surface 551S side toward the top surface 553U and the electrode 565*a* side.

Specifically, for example, a contrivance when exposing is performed so that the resist mask pattern in the dry etching gradually becomes thin toward the end portions. Accordingly, the resist gradually recedes from the thin portions in the dry etching, and the etching amount can be increased from the light-emitting surface 551S toward the top surface 553U side. Thereby, the side surface 555*a* of the light-emitting element 550 is formed to have a constant angle with respect to the light-emitting surface 551S. Therefore, in the light-emitting element 550, the areas of the layers from the top surface 553U when projected onto the XY plane increase in the order of a p-type semiconductor layer 553, the light-emitting layer 552, and an n-type semiconductor layer 551.

Subsequently, the subpixel 520 is formed similarly to the other embodiments.

Effects of the image display device of the embodiment will now be described.

The image display device of the embodiment has the following effects in addition to the effects of reducing the time of the transfer process for forming the light-emitting element 550 and reducing the number of processes similarly to the image display devices of the other embodiments described above.

In the image display device of the embodiment, the light-emitting element 550 is formed to include the side surface 555*a* having the interior angle θ with respect to the light-emitting surface 551S. The interior angle θ is less than 90° and is set to an appropriate value based on the critical angle θc determined by the refractive indexes of the materials of the light-emitting element 550 and the second inter-layer insulating film 156. By appropriately setting the interior angle θ, the light radiated from the light-emitting layer 552 that becomes the sideward and upward light of the light-emitting element 550 can be converted into light traveling toward the light-emitting surface 551S side, which can be emitted. Thus, the substantial luminous efficiency of the light-emitting element 550 is increased by setting the interior angle θ to be a sufficiently small value.

According to the embodiment, the light-emitting element 550 is a vertical element, and the via 161*k* is connected using the connection plate 230*a*. The connection is not limited thereto; similarly to the first embodiment, a connection part that is formed on the planarized surface 112F may be included in the light-emitting element, and the via 161*k* may be connected via the connection part.

Sixth Embodiment

Figure 34:
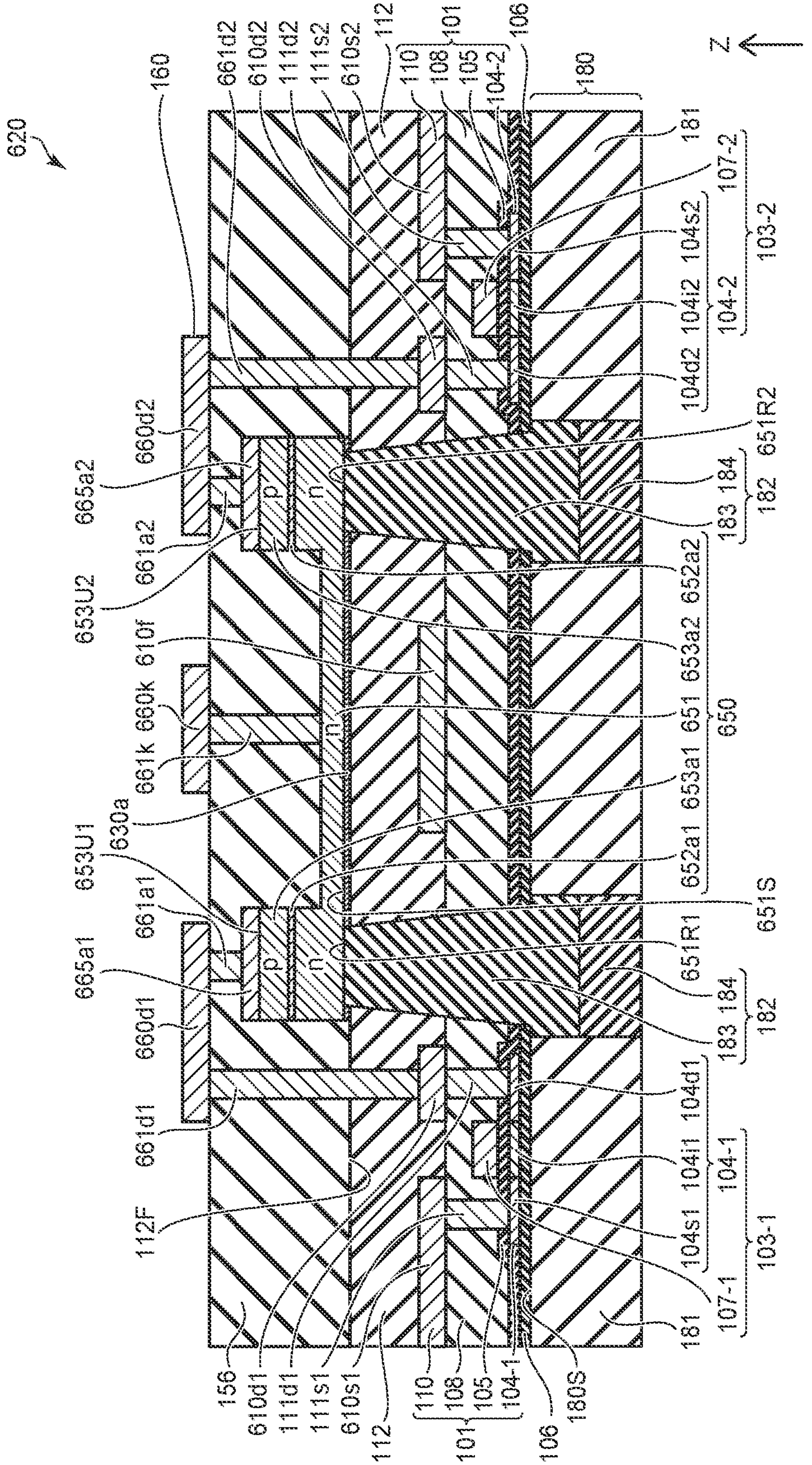
FIG. 34 is a schematic cross-sectional view illustrating a portion of an image display device of a sixth embodiment.

FIG. 34 is a schematic cross-sectional view illustrating a portion of an image display device of the embodiment.

The embodiment differs from the other embodiments in that the image display device includes a subpixel group 620 including multiple light-emitting regions for one light-emitting surface. The same components are marked with the same reference numerals, and a detailed description is omitted as appropriate.

As shown in FIG. 34, the image display device of the embodiment includes the subpixel group 620. The subpixel group 620 includes multiple transistors 103-1 and 103-2, the first wiring layer 110, the first inter-layer insulating film 112, the semiconductor layer 650, the second inter-layer insulating film 156, and vias 661*d*1 and 661*d*2. The subpixel group 620 further includes the color filter 180. The subpixel group 620 further includes light-reflective electrodes 665*a*1 and 665*a*2.

According to the embodiment, holes are injected from one side of the semiconductor layer 650 via the first wiring layer 110 and the vias 661*d*1 and 661*d*2 by switching the p-channel transistors 103-1 and 103-2 on. Electrons are injected from the other side of the semiconductor layer 650 via the second wiring layer 160 by switching the p-channel transistors 103-1 and 103-2 on. Light-emitting layers 652*a*1 and 652*a*2 of the semiconductor layer 650 that are separated from each other emit light when the holes and the electrons are injected and the holes and the electrons combine. For example, the circuit configuration shown in FIG. 5 is applied to the drive circuit for driving the light-emitting layers 652*a*1 and 652*a*2. The example of the second embodiment in which the n-type semiconductor layer and p-type semiconductor layer of the semiconductor layer are interchanged also can be used as a configuration that drives the semiconductor layer with an n-channel transistor. In such a case, the circuit configuration of FIG. 19 is applied to the drive circuit.

The configuration of the subpixel group 620 will now be described in detail.

The TFT underlying film 106 is located on the connection surface 180S of the color filter 180. The TFT underlying film 106 is planarized, and the TFT channels 104-1 and 104-2, etc., are formed on the TFT underlying film 106. In the example, similarly to the other embodiments described above, the TFT underlying film 106 is located on the light-shielding part 181 of the color filter 180. The color filter 180 is provided similarly to the other embodiments described above, and a detailed description is omitted.

The insulating layer 105 covers the TFT underlying film 106 and the TFT channels 104-1 and 104-2. A gate 107-1 is located on the TFT channel 104-1 with the insulating layer 105 interposed. A gate 107-2 is located on the TFT channel 104-2 with the insulating layer 105 interposed. The transistor 103-1 includes the TFT channel 104-1 and the gate 107-1. The transistor 103-2 includes the TFT channel 104-2 and the gate 107-2.

The TFT channel 104-1 includes regions 104*s*1 and 104*d*1 doped to be of the p-type, and the regions 104*s*1 and 104*d*1 are the source region and drain region of the transistor 103-1. A region 104*i*1 is doped to be of the n-type and forms the channel of the transistor 103-1. Similarly, the TFT channel 104-2 also includes regions 104*s*2 and 104*d*2 doped to be of the p-type, and the regions 104*s*2 and 104*d*2 are the source region and drain region of the transistor 103-2. A region 104*i*2 is doped to be of the n-type and forms the channel of the transistor 103-2.

The insulating film 108 covers the insulating layer 105 and the gates 107-1 and 107-2. According to the embodiment, the circuit 101 includes the TFT channels 104-1 and 104-2, the insulating layer 105, the insulating film 108, vias 111*s*1, 111*d*1, 111*s*2, and 111*d*2, and the first wiring layer 110.

The first wiring layer 110 is located on the insulating film 108. The first wiring layer 110 includes wiring parts 610*f*, 610*s*1, 610*s*2, 610*d*1, and 610*d*2.

The wiring part 610*f* is located between light-emitting regions 651R1 and 651R2. Although the wiring part 610*f* is not electrically connected to any circuit component illustrated in FIG. 34 in the example, the wiring part 610*f* can be connected to any potential or circuit component. By providing the wiring part 610*f* between the light-emitting regions 651R1 and 651R2, the light that is emitted from the light-emitting regions 651R1 and 651R2 is shielded. The wiring part 610*f* is not limited to having a light-shielding function for the transistors 103-1 and 103-2 and functions to prevent crossing of the light emitted by the light-emitting regions 651R1 and 651R2.

The wiring part 610*s*1 is located above the region 104*s*1. The via 111*s*1 is located between the wiring part 610*s*1 and the region 104*s*1 and electrically connects the wiring part 610*s*1 and the region 104*s*1. The wiring part 610*s*2 is located above the region 104*s*2. The via 111*s*2 is located between the wiring part 610*s*2 and the region 104*s*2 and electrically connects the wiring part 610*s*2 and the region 104*s*2. For example, the wiring parts 610*s*1 and 610*s*2 are connected to the power supply line 3 of the circuit shown in FIG. 5.

The wiring part 610*d*1 is located above the region 104*d*1. The via 111*d*1 is located between the wiring part 610*d*1 and the region 104*d*1 and electrically connects the wiring part 610*d*1 and the region 104*d*1. The wiring part 610*d*1 is connected to one end of the via 661*d*1. The wiring part 610*d*2 is located above the region 104*d*2. The via 111*d*2 is located between the wiring part 610*d*2 and the region 104*d*2 and electrically connects the wiring part 610*d*2 and the region 104*d*2. The wiring part 610*d*2 is connected to one end of the via 661*d*2.

The first inter-layer insulating film 112 is provided to cover the insulating film 108 and the first wiring layer 110. The first inter-layer insulating film 112 includes the planarized surface 112F.

The semiconductor layer 650 is located on the color conversion part 182 of the color filter 180. A light-emitting surface 651S of the semiconductor layer 650, provided over the color conversion layer 183 and a seed plate 630*a* located on the planarized surface 112F. The light-emitting surface 651S is a surface of an n-type semiconductor layer 651. The light-emitting surface 651S includes the multiple light-emitting regions 651R1 and 651R2, and the multiple light-emitting regions 651R1 and 651R2 are located respectively to contact the multiple color conversion layers 183.

The semiconductor layer 650 includes the n-type semiconductor layer 651, the light-emitting layers 652*a*1 and 652*a*2, and p-type semiconductor layers 653*a*1 and 653*a*2. The light-emitting layer 652*a*1 is located on the n-type semiconductor layer 651. The light-emitting layer 652*a*2 is separated from the light-emitting layer 652*a*1 and is located on the n-type semiconductor layer 651. The p-type semiconductor layer 653*a*1 is located on the light-emitting layer 652*a*1. The p-type semiconductor layer 653*a*2 is separated from the p-type semiconductor layer 653*a*1 and is located on the light-emitting layer 652*a*2.

The p-type semiconductor layer 653*a*1 includes a top surface 653U1 located at the side opposite to the surface at which the light-emitting layer 652*a*1 is located. The p-type semiconductor layer 653*a*2 includes a top surface 653U2 located at the side opposite to the surface at which the light-emitting layer 652*a*2 is located. The electrode 665*a*1 is provided over the top surface 653U1. The electrode 665*a*2 is provided over the top surface 653U2.

The light-emitting region 651R1 is a region that substantially matches the region of the light-emitting surface 651S at the side opposite to the top surface 653U1. The light-emitting region 651R2 is a region that substantially matches the region of the light-emitting surface 651S at the side opposite to the top surface 653U2.

Figure 35:
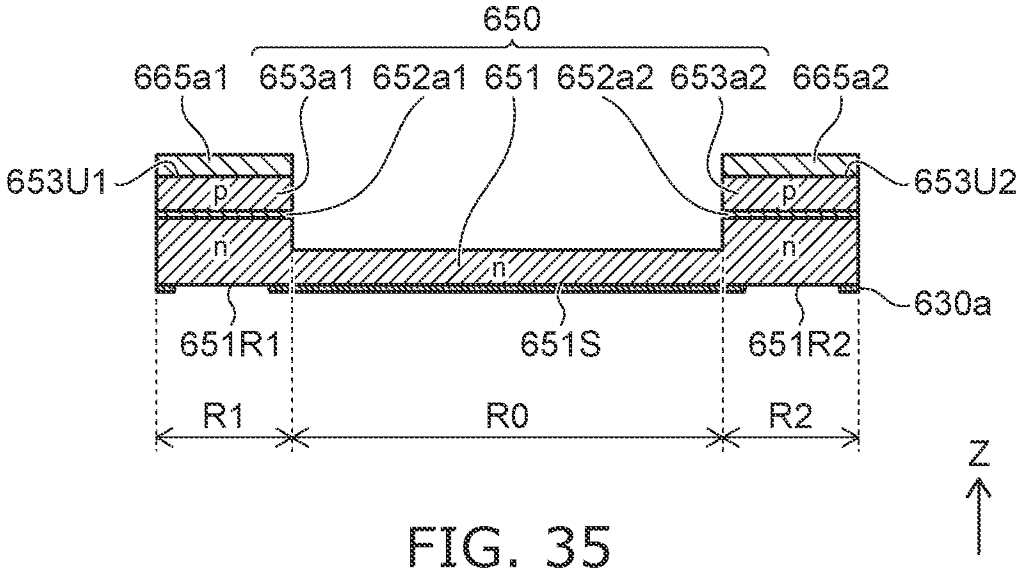
FIG. 35 is a schematic cross-sectional view illustrating a portion of the image display device of the sixth embodiment.

FIG. 35 is a schematic cross-sectional view illustrating a portion of an image display device of the embodiment.

FIG. 35 is a schematic view for describing the light-emitting regions 651R1 and 651R2.

As shown in FIG. 35, the light-emitting regions 651R1 and 651R2 are surfaces on the light-emitting surface 651S. In FIG. 35, the parts of the semiconductor layer 650 that include the light-emitting regions 651R1 and 651R2 are respectively called light-emitting parts R1 and R2. The light-emitting part R1 includes the p-type semiconductor layer 653*a*1, the light-emitting layer 652*a*1, and a portion of the n-type semiconductor layer 651. The light-emitting part R2 includes the p-type semiconductor layer 653*a*2, the light-emitting layer 652*a*2, and a portion of the n-type semiconductor layer 651.

According to the embodiment, the light-emitting region 651R1 is the surface at the side opposite to the top surface 653U1 in the light-emitting part R1. The light-emitting region 651R2 is the surface at the side opposite to the top surface 653U2 in the light-emitting part R2. The region of the light-emitting surface 651S other than the light-emitting regions 651R1 and 651R2 is covered with the seed plate 630*a*. According to the method for manufacturing the image display device, the seed plate 630*a* is formed by patterning the metal seed layer 1130*a* described with reference to FIG. 10A, etc., by etching. In the example, the outer perimeter of the seed plate 630*a* when projected onto the XY plane substantially matches the outer perimeter of the semiconductor layer when projected onto the XY plane. The seed plate 630*a* is formed of a conductive metal material and is light-reflective as well. Accordingly, even when light shifts from the light-emitting parts R1 and R2 and travels toward a connection part R0, such light is shielded by the seed plate 630*a* and is not easily radiated to the outside from the semiconductor layer 650. Also, because the seed plate 630*a* is light-reflective, the light that travels from the light-emitting parts R1 and R2 toward the connection part R0 is reflected, returns toward the light-emitting parts R1 and R2, and can be utilized as normal radiated light.

The semiconductor layer 650 includes the connection part R0. The connection part R0 is located between the light-emitting parts R1 and R2 and is a portion of the n-type semiconductor layer 651. One end of a via 661*k* shown in FIG. 34 is connected to the connection part R0 and provides a current path between the light-emitting parts R1 and R2.

In the light-emitting part R1, the electrons that are supplied via the connection part R0 are supplied to the light-emitting layer 652*a*1. In the light-emitting part R1, the holes that are supplied via the electrode 665*a*1 are supplied to the light-emitting layer 652*a*1. The electrons and the holes that are supplied to the light-emitting layer 652*al* combine and emit light. The light that is emitted by the light-emitting layer 652*al* passes through the portion of the n-type semiconductor layer 651 of the light-emitting part R1 and reaches the light-emitting surface 651S. Because the light travels straight substantially along the Z-axis direction through the light-emitting part R1, the portion of the light-emitting surface 651S that emits light is the light-emitting region 651R1. Accordingly, in the example, when projected onto the XY plane, the light-emitting region 651R1 substantially matches a region surrounded with the outer perimeter of the light-emitting layer 652*a*1 projected onto the light-emitting surface 651S.

The light-emitting part R2 also is similar to the light-emitting part R1. Specifically, the electrons that are supplied via the connection part R0 are supplied to the light-emitting layer 652*a*2 in the light-emitting part R2. The holes that are supplied via the electrode 665*a*2 are supplied to the light-emitting layer 652*a*2 in the light-emitting part R2. The electrons and the holes that are supplied to the light-emitting layer 652*a*2 combine and emit light. The light that is emitted by the light-emitting layer 652*a*2 passes through the portion of the n-type semiconductor layer 651 of the light-emitting part R2 and reaches the light-emitting surface 651S. Because the light travels straight substantially along the Z-axis direction through the light-emitting part R2, the portion of the light-emitting surface 651S that emits light is the light-emitting region 651R2. Accordingly, in the example, when projected onto the XY plane, the light-emitting region 651R2 substantially matches the region surrounded with the outer perimeter of the light-emitting layer 652*a*2 projected onto the light-emitting surface 651S.

Thus, in the semiconductor layer 650, the n-type semiconductor layer 651 can be shared, and the multiple light-emitting regions 651R1 and 651R2 can be formed on the light-emitting surface 651S.

According to the embodiment, the semiconductor layer 650 can be formed by using a portion of the n-type semiconductor layer 651 as the connection part R0 for the multiple light-emitting layers 652*a*1 and 652*a*2 and the multiple p-type semiconductor layers 653*a*1 and 653*a*2 of the semiconductor layer 650. Accordingly, the semiconductor layer 650 can be formed similarly to the method for forming the light-emitting elements 150 and 250 according to the first and second embodiments and the like described above.

The description continues now by returning to FIG. 34.

The second inter-layer insulating film 156 is located on the planarized surface 112F, the semiconductor layer 650, and the electrodes 665*a*1 and 665*a*2.

The second wiring layer 160 is located on the second inter-layer insulating film 156. The second wiring layer 160 includes wiring parts 660*d*1, 660*d*2, and 660*k*. The wiring part 660*d*1 is connected to the electrode 665*a*1 via a connection member 661_a_1. The wiring part 660_d_2 is connected to an electrode 660_a_2 via a connection member 661_a_2. For example, the wiring part 660_k_ is connected to the ground line 4 of the circuit of FIG. 5.

The via 661_dl_ extends through the second and first inter-layer insulating films 156 and 112 and reach the wiring part 610_d_1. The via 661_dl_ is located between the wiring part 660_d_1 and the wiring part 610_d_1 and electrically connects the wiring part 660_d_1 and the wiring part 610_d_1. The via 661_d_2 extends through the second and first inter-layer insulating films 156 and 112 and reach the wiring part 610_d_2. The via 661_d_2 is located between the wiring part 660_d_2 and the wiring part 610_d_2 and electrically connects the wiring part 660_d_2 and the wiring part 610_d_2.

The via 661_k_ extends through the second inter-layer insulating film 156 and reach the n-type semiconductor layer 651. The via 661_k_ is located between the wiring part 660_k_ and the n-type semiconductor layer 651 and electrically connects the wiring part 660_k_ and the n-type semiconductor layer 651.

For example, the transistors 103-1 and 103-2 are drive transistors of adjacent subpixels and are sequentially driven. When the holes supplied from the transistor 103-1 are injected into the light-emitting layer 652_a_1 and the electrons supplied from the wiring part 660_k_ are injected into the light-emitting layer 652_a_1, the light-emitting layer 652_a_1 emits light, and the light is radiated from the light-emitting region 651R1. When the holes supplied from the transistor 103-2 are injected into the light-emitting layer 652_a_2 and the electrons supplied from the wiring part 660_k_ are injected into the light-emitting layer 652_a_2, the light-emitting layer 652_a_2 emits light, and the light is radiated from the light-emitting region 651R2.

Such an image display device of the embodiment can be formed by appropriately applying the manufacturing processes according to the other embodiments described above.

Effects of the image display device of the embodiment will now be described.

Similarly to the image display devices of the other embodiments described above, the image display device of the embodiment has the effects of reducing the time of the transfer process for forming the semiconductor layer 650 and reducing the number of processes. Also, because the connection part R0 can be shared by the multiple light-emitting parts R1 and R2, the number of the vias 661_k_ provided in the connection part R0 can be reduced. The pitch of the light-emitting parts R1 and R2 included in the subpixel group 620 can be reduced by reducing the number of vias, and a small and high-definition image display device is possible.

According to the embodiment, it is necessary for the light emitted from the light-emitting regions 651R1 and 651R2 to pass through optical paths corresponding to the sum of the thicknesses of the first inter-layer insulating film 112, the insulating film 108, the insulating layer 105, and the TFT underlying film 106 until being radiated externally. Although the lengths of the optical paths are about 1 μm to about several μm, the wiring part 610_f_ is located between the optical paths; therefore, the optical paths can be shielded from each other, and the light that is emitted from the adjacent pixels is prevented from mixing. Therefore, the pixel pitch can be reduced, and a high-quality image display device can be realized. Although two light-emitting regions are described in the example, the number of light-emitting regions formed in the light-emitting surface is not limited to two, and can be any number of three or more.

Seventh Embodiment

The image display device described above can be used as an image display module having the appropriate number of pixels in, for example, a computer display, a television, a portable terminal such as a smartphone, car navigation, etc.

Figure 36:
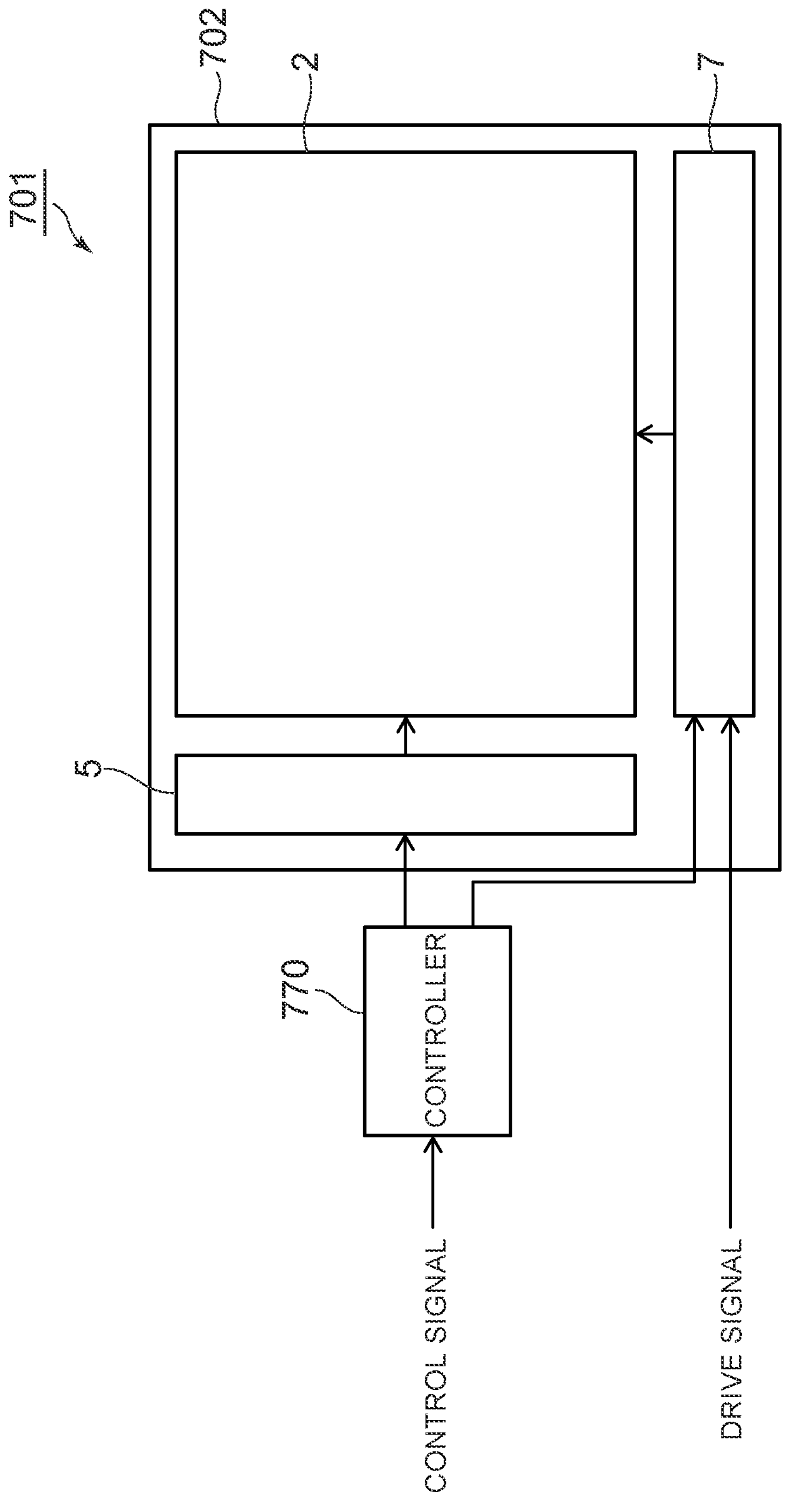
FIG. 36 is a block diagram illustrating an image display device according to a seventh embodiment.

FIG. 36 is a block diagram illustrating the image display device according to the embodiment.

FIG. 36 shows the major parts of the configuration of a computer display.

As shown in FIG. 36, the image display device 701 includes an image display module 702. The image display module 702 is, for example, an image display device that includes the configuration according to the first embodiment described above. The image display module 702 includes the display region 2 in which multiple subpixels including the subpixels 20 are arranged, the row selection circuit 5, and the signal voltage output circuit 7.

The image display device 701 further includes a controller 770. The controller 770 receives input of control signals to be separated and generated by not-illustrated interface circuitry, and controls the driving and the drive sequence of the subpixels in the row selection circuit 5 and the signal voltage output circuit 7.

Figure 37:
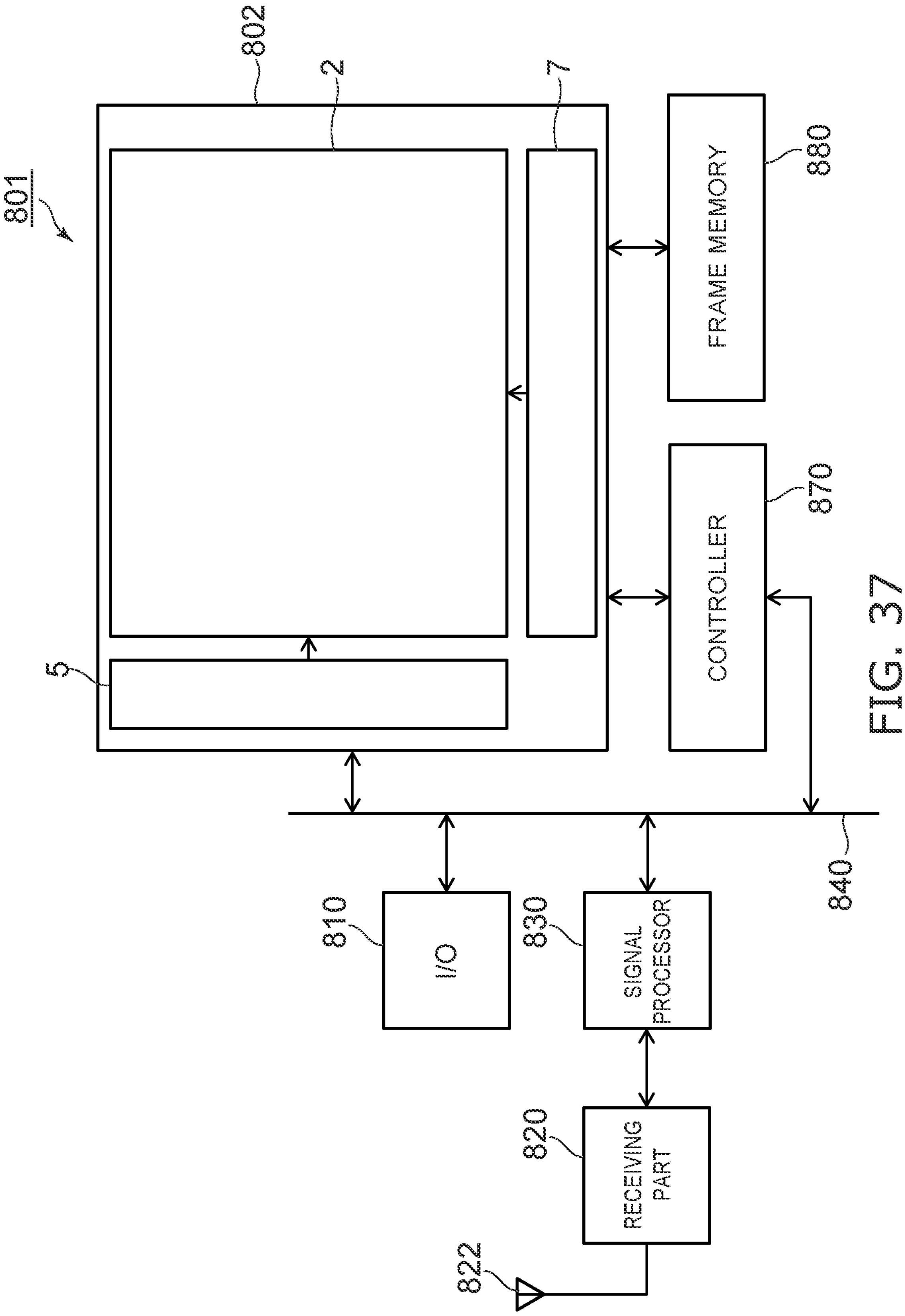
FIG. 37 is a block diagram illustrating an image display device according to a modification of the seventh embodiment.

Modification FIG. 37 is a block diagram illustrating an image display device according to a modification of the embodiment.

FIG. 37 shows the configuration of a high-definition thin television.

As shown in FIG. 37, the image display device 801 includes an image display module 802. The image display module 802 is, for example, the image display device 1 that includes the configuration according to the first embodiment described above. The image display device 801 includes a controller 870 and frame memory 880. The controller 870 controls the drive sequence of the subpixels of the display region 2 based on a control signal supplied by a bus 840. The frame memory 880 stores one frame of display data and is used for smooth processing such as video image reproduction, etc.

The image display device 801 includes an I/O circuit 810. The I/O circuit 810 is labeled as simply "I/O" in FIG. 37. The I/O circuit 810 provides interface circuitry for connecting with an external terminal, a device, etc. The I/O circuit 810 includes, for example, an audio interface, a USB interface that connects an external hard disk device, etc.

The image display device 801 includes a receiving part 820 and a signal processor 830. An antenna 822 is connected to the receiving part 820, and the necessary signal is separated and generated from the radio wave received by the antenna 822. The signal processor 830 includes a DSP (Digital Signal Processor), a CPU (Central Processing Unit), etc., and the signal that is separated and generated by the receiving part 820 is separated and generated into image data, voice data, etc., by the signal processor 830.

Other image display devices also can be made by using the receiving part 820 and the signal processor 830 as a high-frequency communication module for the transmission and reception of a mobile telephone, for WiFi, a GPS receiver, etc. For example, the image display device that includes an image display module having the appropriate screen size and resolution can be used as a personal digital assistant such as a smartphone, a car navigation system, etc.

The image display module according to the embodiment is not limited to the configuration of the image display device according to the first embodiment; modifications of the first embodiment and other embodiments may be used. The image display modules according to the embodiment and its modifications are configured to include many sub-pixels as shown in FIGS. 16 and 17.

According to the embodiments described above, a method for manufacturing an image display device and an image display device can be realized in which a transfer process of a light-emitting element is shortened, and the yield is increased.

Although several embodiments of the invention are described hereinabove, these embodiments have been presented by way of example only, and are not intended to limit the scope of the inventions. These novel embodiments may be embodied in a variety of other forms, and various omissions, substitutions, and changes may be made without departing from the spirit of the inventions. Such embodiments and their modifications are within the scope and spirit of the inventions, and are within the scope of the inventions described in the claims and their equivalents. Also, the embodiments described above can be implemented in combination with each other.

What is claimed is:

1. A method for manufacturing an image display device, the method comprising:

preparing a first substrate that comprises:

a circuit element formed on a substrate, a first wiring layer connected to the circuit element, and a first insulating film covering the circuit element and the first wiring layer;

forming a conductive layer on the first insulating film, the conductive layer comprising a first part, the first part being made of a single-crystal metal;

forming a semiconductor layer on the first part, the semiconductor layer comprising a light-emitting layer;

forming a light-emitting element by patterning the semiconductor layer, the light-emitting element including:

a light-emitting surface on the first part, and a top surface at a side opposite to the light-emitting surface;

forming a second insulating film covering the first insulating film, the conductive layer, and the light-emitting element;

forming a first via extending through the first and second insulating films;

forming a second wiring layer on the second insulating film; and removing at least a portion of the first part on the light-emitting surface, wherein:

the first via is located between the first wiring layer and the second wiring layer and electrically connects the first wiring layer and the second wiring layer.

2. The method according to claim 1, wherein:

the forming of the conductive layer comprises:

forming a metal layer on the first insulating film, and forming the first part by performing annealing treatment of the metal layer, and an outer perimeter of the light-emitting element is located within an outer perimeter of the first part when viewed in a plan view.

3. The method according to claim 2, wherein:

the forming of the conductive layer comprises, after the forming of the metal layer and before the annealing treatment of the metal layer, patterning the metal layer.

4. The method according to claim 1, further comprising:

before the forming of the semiconductor layer, forming a graphene-including layer on the first part.

5. The method according to claim 1, further comprising:

forming a conductive layer on the semiconductor layer; and forming an electrode by patterning the conductive layer, the electrode being electrically connected with the top surface.

6. The method according to claim 1, further comprising:

forming a second via extending through the second insulating film, wherein:

the light-emitting element comprises a first connection part located along the light-emitting surface, and the second via is located between the second wiring layer and the first connection part and electrically connects the second wiring layer and the first connection part.

7. The method according to claim 1, further comprising:

after the removing of the at least a portion of the first part on the light-emitting surface, roughening an exposed portion of the light-emitting surface.

8. The method according to claim 1, further comprising:

forming a second via extending through the first and second insulating films, wherein:

the removing of the at least a portion of the first part on the light-emitting surface comprises forming a second connection part by removing a portion of the first part, the second connection part is connected to a surface including the light-emitting surface, and the second via is located between the second wiring layer and the second connection part and electrically connects the second wiring layer and the second connection part.

9. The method according to claim 1, wherein:

the preparing of the first substrate comprises forming a light-shielding layer on the circuit element.

10. The method according to claim 1, wherein:

the semiconductor layer comprises a gallium nitride compound semiconductor.

11. The method according to claim 1, further comprising:

after the removing of the at least a portion of the first part, forming a wavelength conversion member on the light-emitting surface.

* * * * *